(12) United States Patent
Yanagisawa et al.

(10) Patent No.: US 12,159,937 B2
(45) Date of Patent: Dec. 3, 2024

(54) SEMICONDUCTOR DEVICE COMPRISING OXYGEN BLOCKING FILMS

(71) Applicant: Semiconductor Energy Laboratory Co., Ltd., Atsugi (JP)

(72) Inventors: Yuichi Yanagisawa, Atsugi (JP); Ryota Hodo, Atsugi (JP); Satoru Okamoto, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 476 days.

(21) Appl. No.: 17/428,825

(22) PCT Filed: Feb. 18, 2020

(86) PCT No.: PCT/IB2020/051316
§ 371 (c)(1),
(2) Date: Aug. 5, 2021

(87) PCT Pub. No.: WO2020/174315
PCT Pub. Date: Sep. 3, 2020

(65) Prior Publication Data
US 2022/0020883 A1    Jan. 20, 2022

(30) Foreign Application Priority Data

Feb. 28, 2019   (JP) ................... 2019-035103

(51) Int. Cl.
*H01L 29/786*   (2006.01)
*H01L 29/04*   (2006.01)
(Continued)

(52) U.S. Cl.
CPC ...... *H01L 29/78606* (2013.01); *H01L 29/045* (2013.01); *H01L 29/42384* (2013.01);
(Continued)

(58) Field of Classification Search
CPC ............. H01L 29/78606; H01L 29/045; H01L 29/42384; H01L 29/78648; H01L 29/24;
(Continued)

(56) References Cited

U.S. PATENT DOCUMENTS 9,627,418 B2   4/2017  Yamazaki et al.
9,741,794 B2   8/2017  Yamazaki
(Continued)

FOREIGN PATENT DOCUMENTS

JP   2015-053477 A   3/2015
JP   2015-156477 A   8/2015
(Continued)

OTHER PUBLICATIONS

International Search Report (Application No. PCT/IB2020/051316) Dated May 26, 2020.
(Continued)

*Primary Examiner* — Steven M Christopher
*Assistant Examiner* — Tyler J Wiegand
(74) *Attorney, Agent, or Firm* — Eric J. Robinson; Robinson Intellectual Property Law Office, P.C.

(57) ABSTRACT

A semiconductor device with favorable electrical characteristics is provided. The semiconductor device includes a first insulator, a first oxide over the first insulator, a second insulator provided between the first insulator and the first oxide, a second oxide in contact with the first insulator and in contact with a side surface of the first oxide, and a third insulator over the first insulator, the second oxide, and the first oxide. The third insulator includes a region in contact with a top surface of the first oxide. The second insulator and the third insulator include a material which is less likely to pass oxygen than the second oxide.

16 Claims, 33 Drawing Sheets

(51) Int. Cl.
*H01L 29/423* (2006.01)
*H01L 29/66* (2006.01)

(52) U.S. Cl.
CPC .... *H01L 29/66969* (2013.01); *H01L 29/7869* (2013.01); *H01L 29/78696* (2013.01)

(58) Field of Classification Search
CPC ....... H01L 29/4908; H01L 29/06–0603; H01L 29/0684–0688; H01L 2029/42388; H01L 21/02362; H01L 29/7869–78696
See application file for complete search history.

(56) References Cited

U.S. PATENT DOCUMENTS

| | | | |
|---|---|---|---|
| 9,911,861 B2 | 3/2018 | Okazaki et al. | |
| 9,929,279 B2 | 3/2018 | Yamazaki et al. | |
| 9,954,003 B2 * | 4/2018 | Matsuda | H01L 29/78648 |
| 9,954,112 B2 | 4/2018 | Asami et al. | |
| 10,002,886 B2 | 6/2018 | Yamazaki et al. | |
| 10,096,489 B2 | 10/2018 | Yamazaki et al. | |
| 10,411,003 B2 | 9/2019 | Okuno et al. | |
| 10,446,689 B1 * | 10/2019 | Huang | H01L 29/41733 |
| 10,522,690 B2 | 12/2019 | Okazaki et al. | |
| 10,680,116 B2 | 6/2020 | Yamazaki et al. | |
| 10,910,359 B2 | 2/2021 | Okuno. et al. | |
| 11,011,648 B2 | 5/2021 | Yamazaki et al. | |
| 11,245,039 B2 | 2/2022 | Asami et al. | |
| 12,074,224 B2 | 8/2024 | Asami et al. | |
| 2015/0034949 A1 | 2/2015 | Yamazaki | |
| 2015/0187824 A1 | 7/2015 | Yamazaki et al. | |
| 2015/0221774 A1 | 8/2015 | Yamazaki et al. | |
| 2015/0255310 A1 | 9/2015 | Yamazaki et al. | |
| 2017/0040457 A1 | 2/2017 | Okazaki et al. | |
| 2017/0170211 A1 * | 6/2017 | Yamazaki | H01L 29/7782 |
| 2017/0186779 A1 * | 6/2017 | Ito | H01L 27/1255 |
| 2018/0108647 A1 | 4/2018 | Okuno et al. | |
| 2018/0248043 A1 * | 8/2018 | Asami | H01L 27/1225 |
| 2022/0238719 A1 * | 7/2022 | Yamazaki | H01L 29/792 |

FOREIGN PATENT DOCUMENTS

| | | | | |
|---|---|---|---|---|
| JP | 2015-181151 A | 10/2015 | | |
| JP | 2015-181162 A | 10/2015 | | |
| JP | 2017-034258 A | 2/2017 | | |
| JP | 2018-067708 A | 4/2018 | | |
| KR | 2017-0096956 A | 8/2017 | | |
| KR | 2017-0106358 A | 9/2017 | | |
| TW | 201532243 | 8/2015 | | |
| TW | 201834198 | 9/2018 | | |
| WO | WO-2015/097596 | 7/2015 | | |
| WO | WO-2016/120741 | 8/2016 | | |
| WO | WO-2019/016642 | 1/2019 | | |
| WO | WO-2019016642 A1 * | 1/2019 | ......... H01L 21/8234 |
| WO | WO-2020/157554 | 8/2020 | | |

OTHER PUBLICATIONS

Written Opinion (Application No. PCT/IB2020/051316) Dated May 26, 2020.

Kunitake.H et al., "High thermal tolerance of 25-nm c-axis aligned crystalline In—Ga—Zn oxide FET", IEDM 18: Technical Digest of International Electron Devices Meeting, Dec. 1, 2018, pp. 312-315.

Yamazaki.S et al., "Properties of crystalline In—Ga—Zn-oxide semiconductor and its transistor characteristics", Jpn. J. Appl. Phys. (Japanese Journal of Applied Physics), Mar. 31, 2014, vol. 53, No. 4S, pp. 04ED18-1-04ED18-10.

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.

* cited by examiner

FIG. 1A
FIG. 1C
FIG. 1B
FIG. 1D
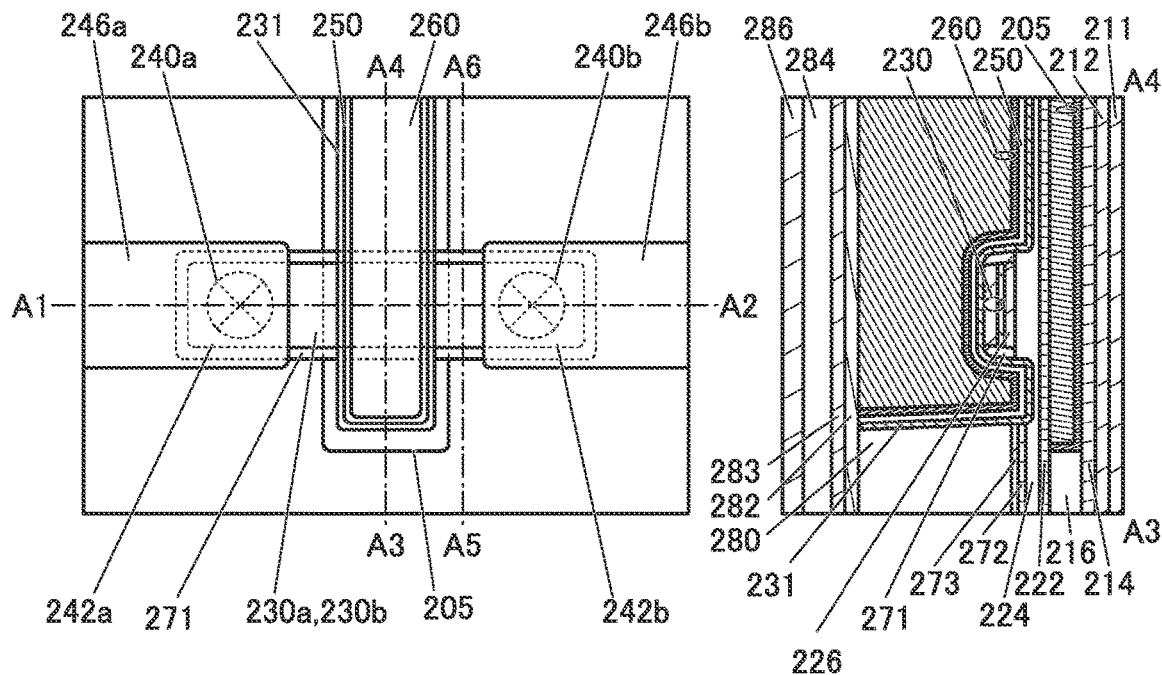
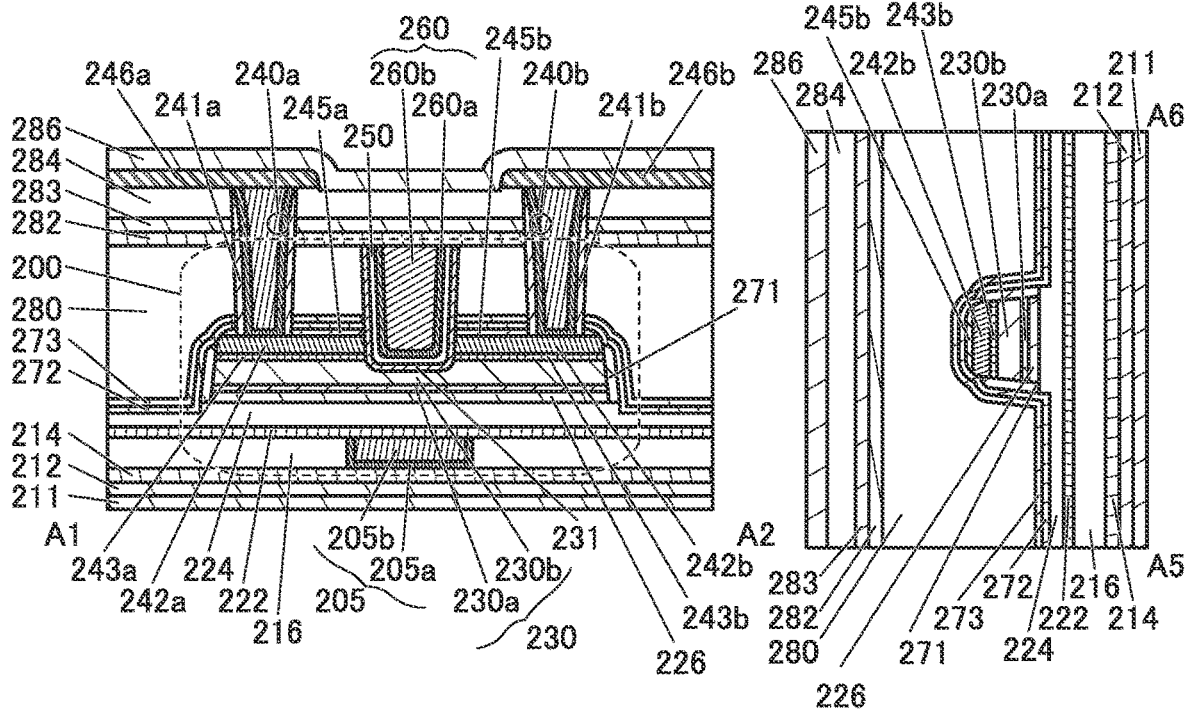

FIG. 3A
| Amorphous | Crystalline | Crystal |
|---|---|---|
| completely amorphous | •CAAC<br>•nc<br>•CAC | •single crystal<br>•poly crystal |
FIG. 3B
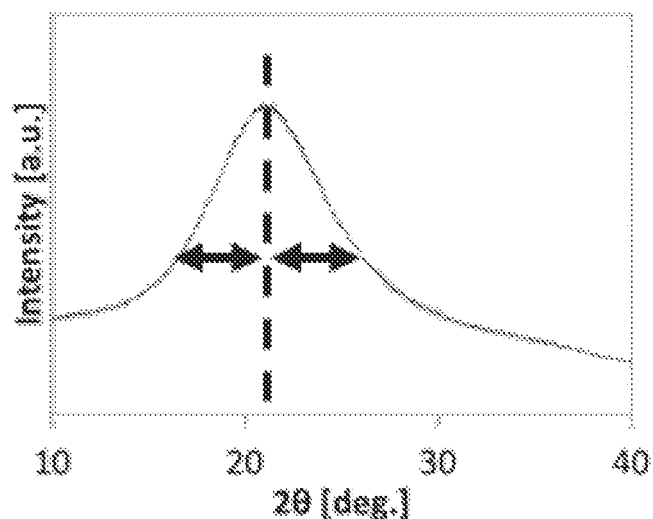
FIG. 3C
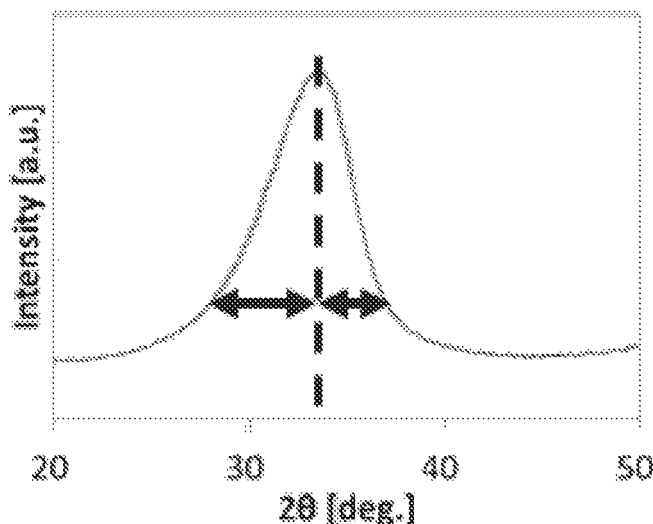

FIG. 5A
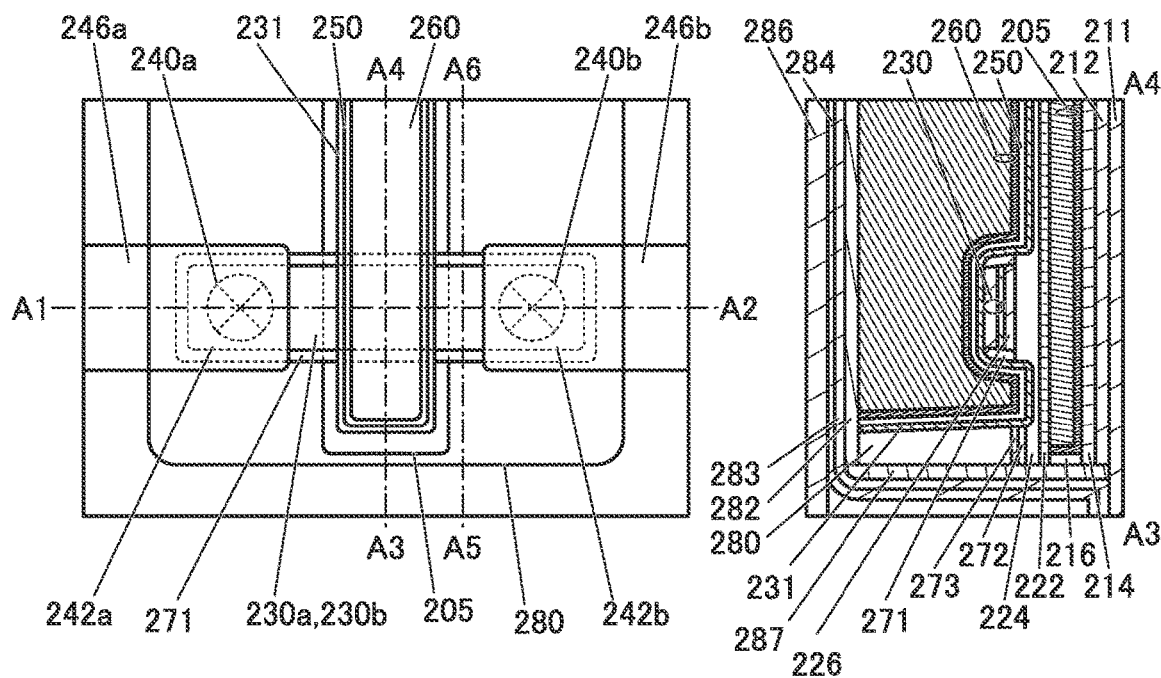
FIG. 5C
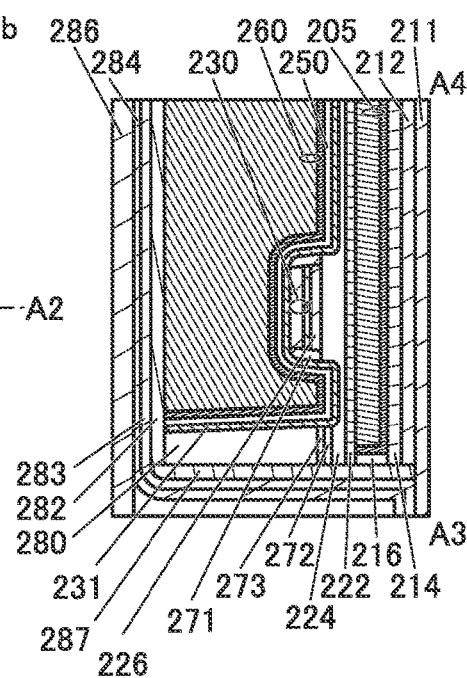
FIG. 5B
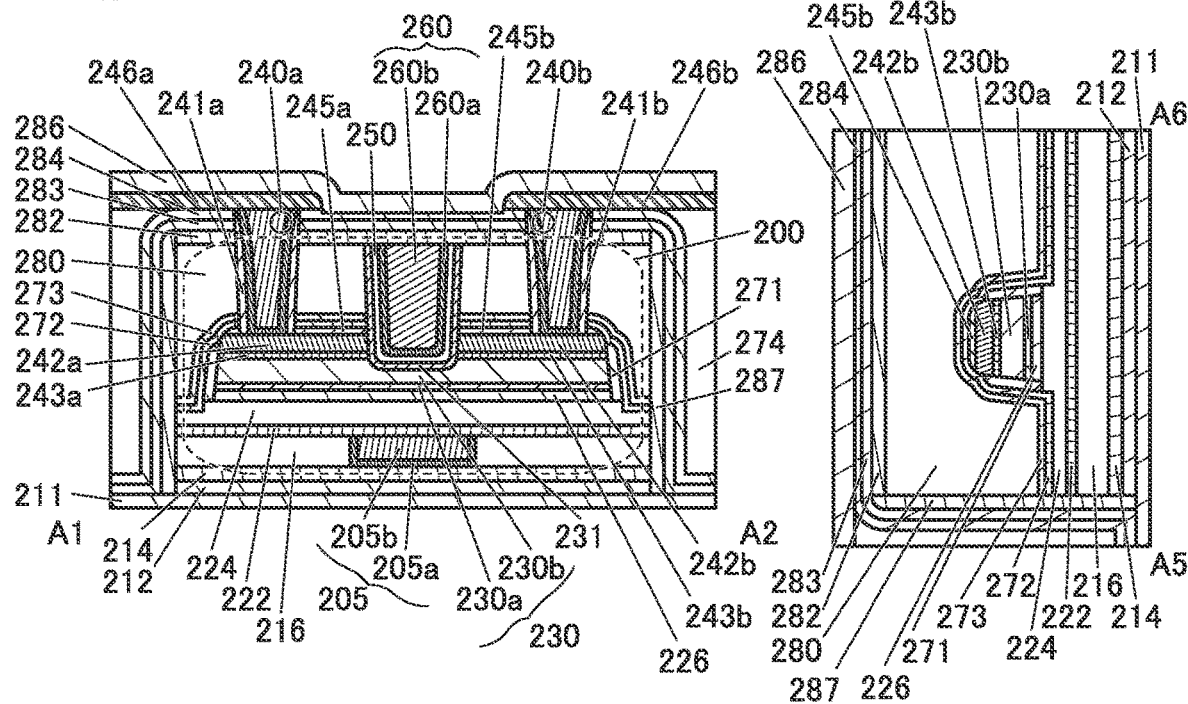
FIG. 5D

FIG. 16A
FIG. 16C
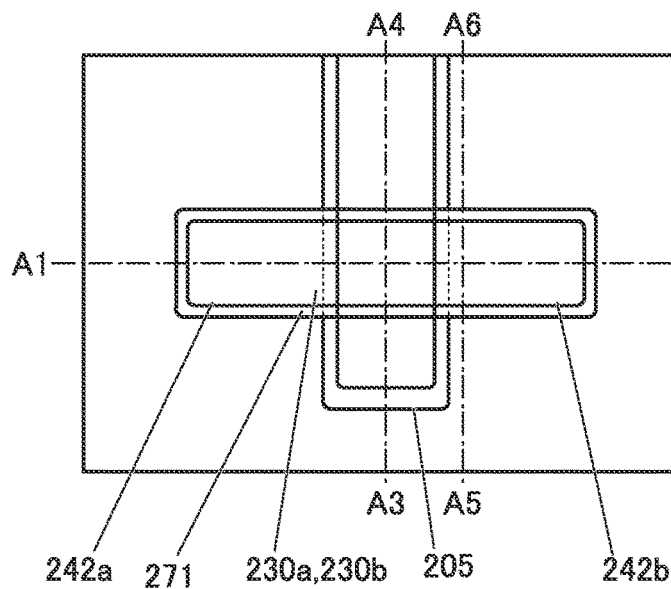
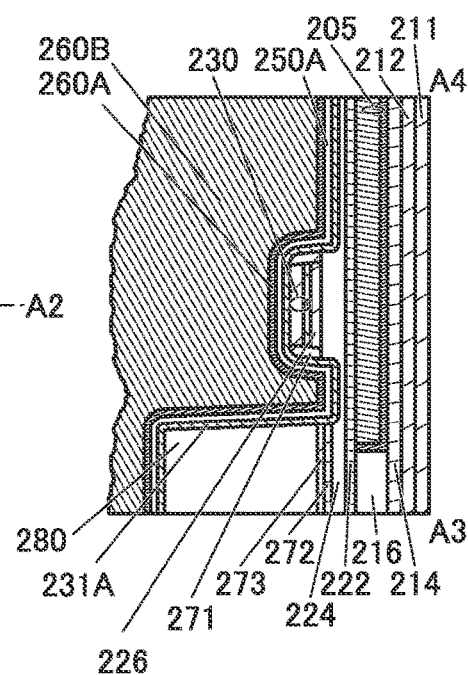
FIG. 16B
FIG. 16D
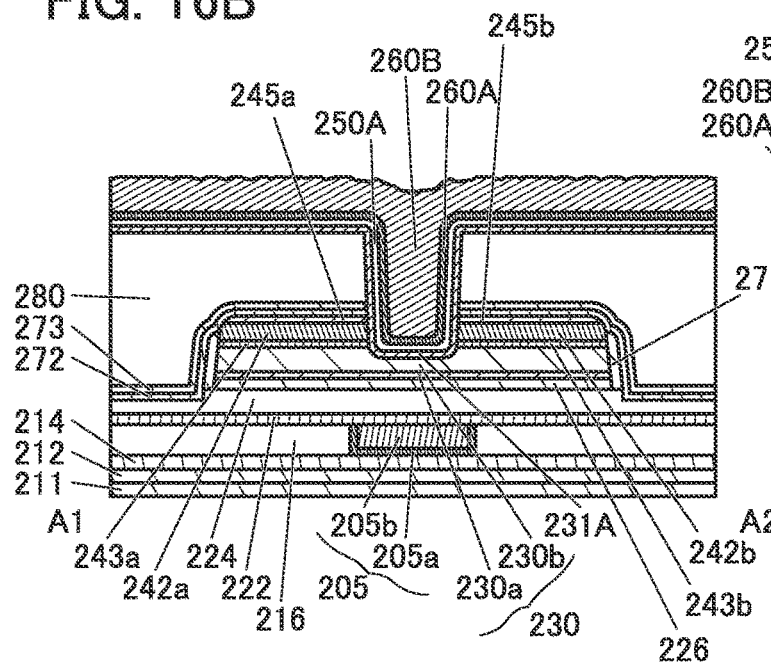
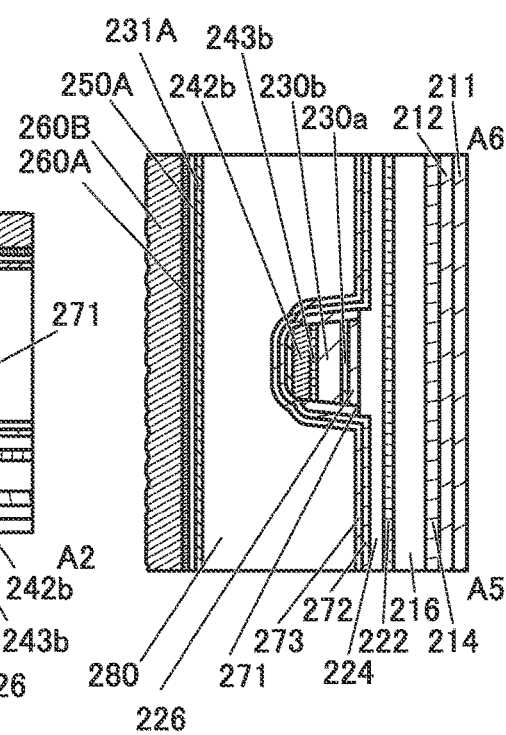

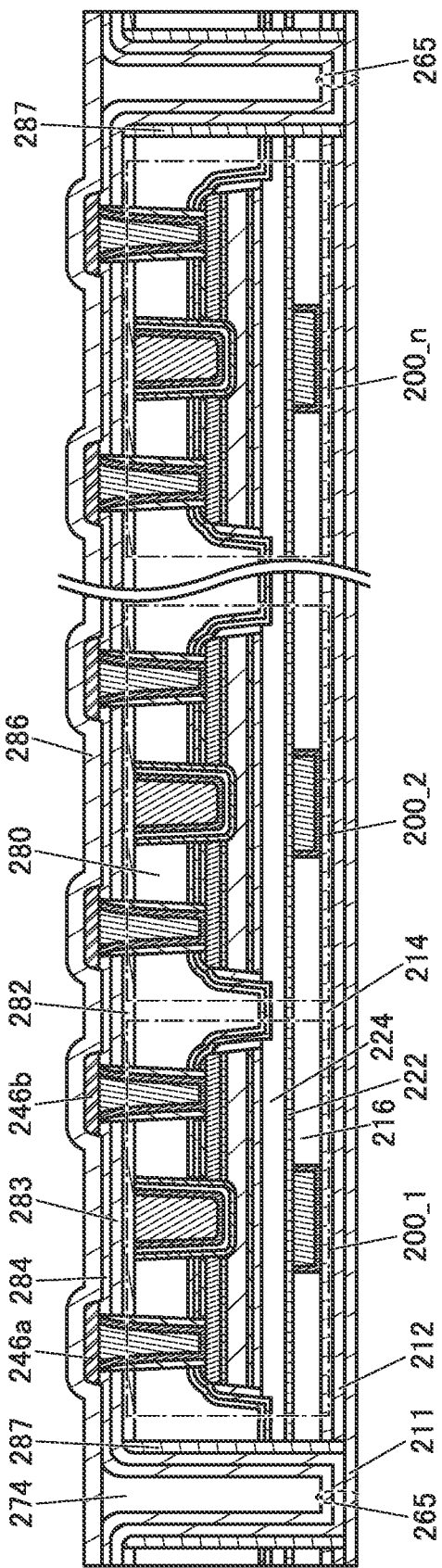

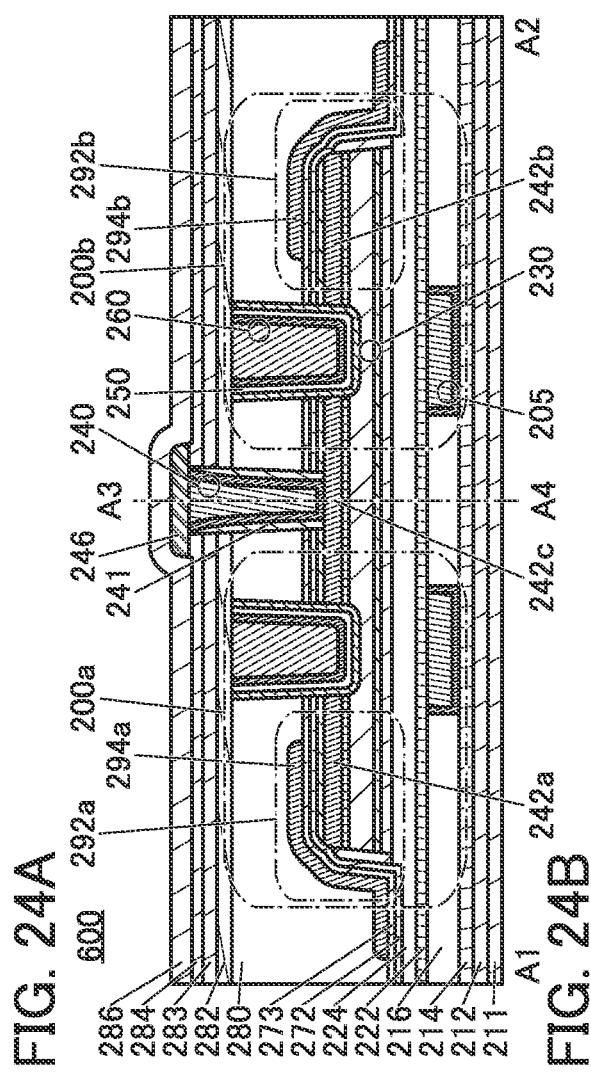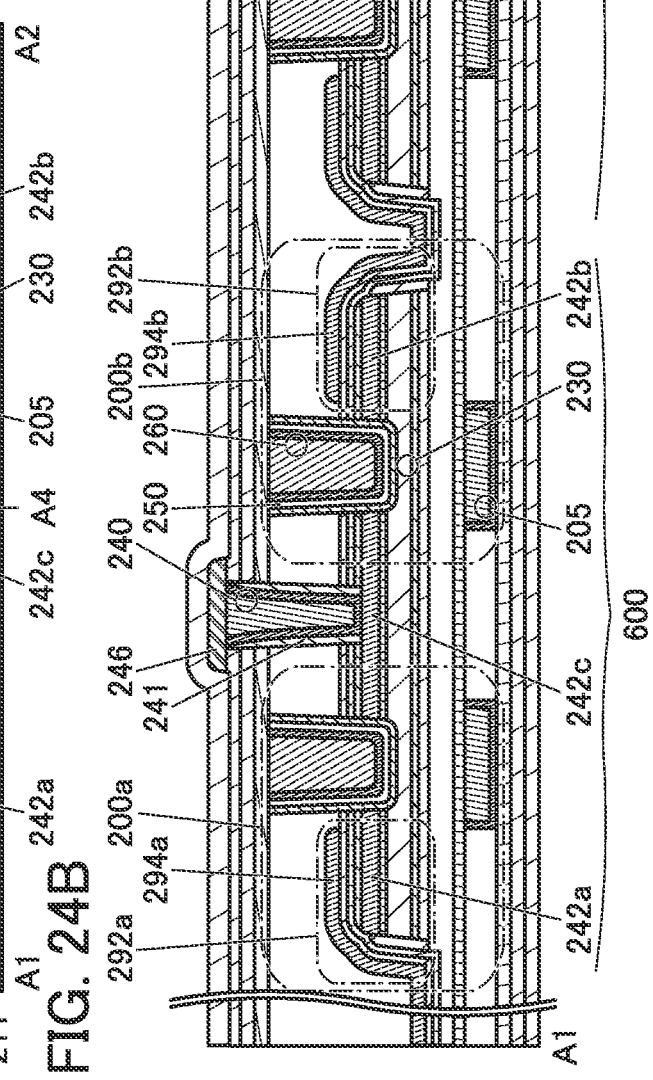

SEMICONDUCTOR DEVICE COMPRISING OXYGEN BLOCKING FILMS

TECHNICAL FIELD

One embodiment of the present invention relates to a transistor, a semiconductor device, and an electronic device. One embodiment of the present invention relates to a method for manufacturing a semiconductor device. Another embodiment of the present invention relates to a semiconductor wafer and a module.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be sometimes said that a display device (a liquid crystal display device, a light-emitting display device, and the like), a projection device, a lighting device, an electro-optical device, a power storage device, a memory device, a semiconductor circuit, an imaging device, an electronic device, and the like include a semiconductor device.

Note that one embodiment of the present invention is not limited to the above technical field. One embodiment of the invention disclosed in this specification and the like relates to an object, a method, or a manufacturing method. Another embodiment of the present invention relates to a process, a machine, manufacture, or a composition of matter.

BACKGROUND ART

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a semiconductor thin film applicable to the transistor; in addition, an oxide semiconductor has been attracting attention as another material.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 disclose a technique for manufacturing a transistor using an oxide semiconductor having a CAAC structure.

REFERENCE

Non-Patent Document

[Non-Patent Document 1] S. Yamazaki et al., "SID Symposium Digest of Technical Papers", 2012, volume 43, issue 1, pp. 183-186
[Non-Patent Document 2] S. Yamazaki et al., "Japanese Journal of Applied Physics", 2014, volume 53, Number 4S, pp. 04ED18-1-04ED18-10 Problems to be Solved by the Invention

SUMMARY OF THE INVENTION

Problems to be Solved by the Invention

An object of one embodiment of the present invention is to provide a semiconductor device having favorable electrical characteristics. Another object of one embodiment of the present invention is to provide a semiconductor device with a small variation in transistor characteristics. Another object of one embodiment of the present invention is to provide a semiconductor device with high reliability. Another object of one embodiment of the present invention is to provide a semiconductor device with a high on-state current. Another object of one embodiment of the present invention is to provide a semiconductor device that can be miniaturized or highly integrated. Another object of one embodiment of the present invention is to provide a semiconductor device with low power consumption.

Note that the description of these objects does not preclude the existence of other objects. One embodiment of the present invention does not have to achieve all these objects. Other objects are apparent from and can be derived from the description of the specification, the drawings, the claims, and the like.

Means for Solving the Problems

One embodiment of the present invention is a semiconductor device including a first insulator, a first oxide over the first insulator, a second insulator provided between the first insulator and the first oxide, a second oxide in contact with the first insulator and in contact with a side surface of the first oxide, and a third insulator over the first insulator, the second oxide, and the first oxide. The third insulator includes a region in contact with a top surface of the first oxide. The second insulator and the third insulator each include a material which is less likely to pass oxygen than the second oxide.

Another embodiment of the present invention is a semiconductor device including a first insulator, a first oxide over the first insulator, a second insulator provided between the first insulator and the first oxide, a second oxide in contact with the first insulator and in contact with a side surface of the first oxide, a first conductor and a second conductor provided over the first oxide and apart from each other, a third insulator over the first insulator, the second oxide, and the first oxide, and a gate electrode over the third insulator. The gate electrode includes a region overlapping with the first oxide. The third insulator includes a region in contact with a top surface of the first oxide, a side surface of the first conductor, and a side surface of the second conductor. The second insulator and the third insulator each include a material which is less likely to pass oxygen than the second oxide.

In the semiconductor device, it is preferable that the semiconductor device include a fourth insulator, and the fourth insulator be provided between the third insulator and the gate electrode.

In the semiconductor device, it is preferable that the first oxide include indium, an element M (M is aluminum, gallium, yttrium, or tin), and zinc.

In the semiconductor device, it is preferable that the first oxide include a region functioning as a channel formation region.

In the semiconductor device, it is preferable that the first oxide and the second oxide include the same material.

In the semiconductor device, it is preferable that the second oxide have crystallinity and the c-axis of a crystal of the second oxide be in a direction substantially perpendicular to the side surface of the first oxide.

In the semiconductor device, it is preferable that the second oxide be in contact with a side surface of the second insulator and the third insulator.

In the semiconductor device, it is preferable that the second insulator and the third insulator each function as an oxygen blocking film.

In the semiconductor device, it is preferable that at least one of the second insulator and the third insulator include aluminum oxide.

Effect of the Invention

According to one embodiment of the present invention, a semiconductor device with favorable electrical characteristics can be provided. Furthermore, with one embodiment of the present invention, a semiconductor device with a small variation in transistor characteristics can be provided. According to another embodiment of the present invention, a semiconductor device with high reliability can be provided. According to another embodiment of the present invention, a semiconductor device with a high on-state current can be provided. According to another embodiment of the present invention, a semiconductor device that can be miniaturized or highly integrated can be provided. According to another embodiment of the present invention, a semiconductor device with low power consumption can be provided.

Note that the description of these effects does not preclude the existence of other effects. One embodiment of the present invention does not have to have all these effects. Note that effects other than these will be apparent from the description of the specification, the drawings, the claims, and the like and effects other than these can be derived from the description of the specification, the drawings, the claims, and the like.

BRIEF DESCRIPTION OF THE DRAWINGS

FIG. 1A is a top view of a semiconductor device of one embodiment of the present invention.

FIG. 1B to FIG. 1D are cross-sectional views of semiconductor devices of one embodiment of the present invention.

FIG. 3A is a chart explaining classification of IGZO crystal structures, FIG. 3B is a graph explaining an XRD spectrum of quartz glass, and FIG. 3C is a graph explaining an XRD spectrum of Crystalline IGZO.

FIG. 5A is a top view of a semiconductor device of one embodiment of the present invention.

FIG. 5B to FIG. 5D are cross-sectional views of a semiconductor device of one embodiment of the present invention.

FIG. 16A is a top view illustrating a method for manufacturing a semiconductor device of one embodiment of the present invention.

FIG. 16B to FIG. 16D are cross-sectional views illustrating a method for manufacturing a semiconductor device of one embodiment of the present invention.

FIG. 20A and FIG. 20B are cross-sectional views of semiconductor devices of one embodiment of the present invention.

FIG. 24A and FIG. 24B are cross-sectional views of semiconductor devices of one embodiment of the present invention.

MODE FOR CARRYING OUT THE INVENTION

Figure 2:
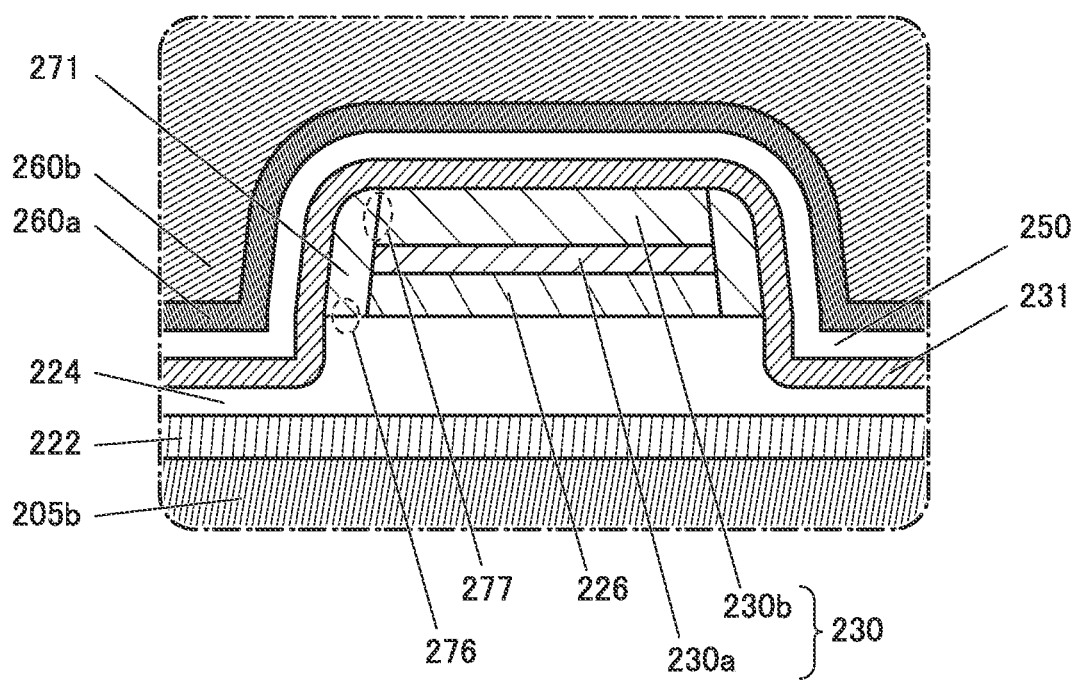
FIG. 2 is a cross-sectional view of a semiconductor device of one embodiment of the present invention.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In the drawings, the size, the layer thickness, or the region is exaggerated for clarity in some cases. Therefore, they are not limited to the illustrated scale. Note that the drawings schematically illustrate ideal examples, and embodiments of the present invention are not limited to shapes, values, and the like shown in the drawings. For example, in the actual manufacturing process, a layer, a resist mask, or the like might be unintentionally reduced in size by treatment such as etching, which might not be reflected in the drawings for easy understanding of the invention. Furthermore, in the drawings, the same reference numerals are used in common for the same portions or portions having similar functions in different drawings, and repeated description thereof is omitted in some cases. Furthermore, the same hatch pattern is used for the portions having similar functions, and the portions are not especially denoted by reference numerals in some cases.

Furthermore, especially in a top view (also referred to as a "plan view"), a perspective view, or the like, the description of some components might be omitted for easy understanding of the invention. In addition, some hidden lines and the like might not be shown.

The ordinal numbers such as "first" and "second" in this specification and the like are used for convenience and do not denote the order of steps or the stacking order of layers. Therefore, for example, the term "first" can be replaced with the term "second", "third", or the like as appropriate. In addition, the ordinal numbers in this specification and the like do not sometimes correspond to the ordinal numbers that are used to specify one embodiment of the present invention.

In this specification and the like, terms for describing arrangement, such as "over" and "below", are used for convenience to describe the positional relation between components with reference to drawings. The positional relation between components is changed as appropriate in accordance with a direction in which the components are described. Thus, without limitation to terms described in this specification, the description can be changed appropriately depending on the situation.

When this specification and the like explicitly state that X and Y are connected, for example, the case where X and Y are electrically connected, the case where X and Y are functionally connected, and the case where X and Y are directly connected are regarded as being disclosed in this specification and the like. Accordingly, without being limited to a predetermined connection relation, for example, a connection relation shown in drawings or text, a connection relation other than one shown in drawings or text is regarded as being disclosed in the drawings or the text. Here, X and Y each denote an object (e.g., a device, an element, a circuit, a wiring, an electrode, a terminal, a conductive film, or a layer).

In this specification and the like, a transistor is an element having at least three terminals including a gate, a drain, and a source. In addition, the transistor includes a region where a channel is formed (hereinafter also referred to as a channel formation region) between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which a current mainly flows.

Furthermore, functions of a source and a drain might be switched when a transistor of opposite polarity is employed or a direction of current flow is changed in circuit operation, for example. Therefore, the terms "source" and "drain" can sometimes be interchanged with each other in this specification and the like.

Note that a channel length refers to, for example, a distance between a source (a source region or a source electrode) and a drain (a drain region or a drain electrode) in a region where a semiconductor (or a portion where current flows in a semiconductor when a transistor is in an on state) and a gate electrode overlap with each other or a channel formation region in a top view of the transistor. Note that in one transistor, channel lengths in all regions do not necessarily have the same value. In other words, the channel length of one transistor is not fixed to one value in some cases. Thus, in this specification, the channel length is any one of the values, the maximum value, the minimum value, and the average value in a channel formation region.

A channel width refers to, for example, a length of a channel formation region in a direction perpendicular to a channel length direction in a region where a semiconductor (or a portion where current flows in a semiconductor when a transistor is in an on state) and a gate electrode overlap with each other, or a channel formation region in a top view of the transistor. Note that in one transistor, channel widths in all regions do not necessarily have the same value. In other words, the channel width of one transistor is not fixed to one value in some cases. Thus, in this specification, the channel width is any one of the values, the maximum value, the minimum value, and the average value in a channel formation region.

Note that in this specification and the like, depending on the transistor structure, a channel width in a region where a channel is actually formed (hereinafter also referred to as an "effective channel width") is sometimes different from a channel width shown in a top view of a transistor (hereinafter also referred to as an "apparent channel width"). For example, in a transistor whose gate electrode covers a side surface of a semiconductor, the effective channel width is larger than the apparent channel width, and its influence cannot be ignored in some cases. For example, in a miniaturized transistor whose gate electrode covers a side surface of a semiconductor, the proportion of a channel formation region formed in the side surface of the semiconductor is increased in some cases. In that case, the effective channel width is larger than the apparent channel width.

In such a case, the effective channel width is sometimes difficult to estimate by actual measurement. For example, estimation of an effective channel width from a design value requires assumption that the shape of a semiconductor is known. Accordingly, in the case where the shape of a semiconductor is not known accurately, it is difficult to measure the effective channel width accurately.

In this specification, the simple term "channel width" refers to an apparent channel width in some cases. Alternatively, in this specification, the simple term "channel width" refers to an effective channel width in some cases. Note that values of a channel length, a channel width, an effective channel width, an apparent channel width, and the like can be determined, for example, by analyzing a cross-sectional TEM image and the like.

Note that impurities in a semiconductor refer to, for example, elements other than the main components of a semiconductor. For example, an element with a concentration lower than 0.1 atomic % can be regarded as an impurity. When an impurity is contained, for example, the density of defect states in a semiconductor increases and the crystallinity decreases in some cases. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components of the oxide semiconductor; hydrogen, lithium, sodium, silicon, boron, phosphorus, carbon, and nitrogen are given as examples. Note that water also serves as an impurity in some cases. In addition, in the case of an oxide semiconductor, oxygen vacancies (also referred to as $V_O$) are formed by entry of impurities in some cases, for example.

Note that in this specification and the like, silicon oxynitride is a material that contains more oxygen than nitrogen in its composition. Moreover, silicon nitride oxide is a material that contains more nitrogen than oxygen in its composition.

In this specification and the like, the term "insulator" can be replaced with an insulating film or an insulating layer. Furthermore, the term "conductor" can be replaced with a conductive film or a conductive layer. Moreover, the term "semiconductor" can be replaced with a semiconductor film or a semiconductor layer.

In this specification and the like, "parallel" indicates a state where two straight lines are placed at an angle greater than or equal to −10° and less than or equal to 10°. Accordingly, the case where the angle is greater than or equal to −5° and less than or equal to 5° is also included. Furthermore, "substantially parallel" indicates a state where two straight lines are placed at an angle greater than or equal to −30° and less than or equal to 30°. Moreover, "perpendicular" indicates a state where two straight lines are placed at an angle greater than or equal to 80° and less than or equal to 100°. Accordingly, the case where the angle is greater than or equal to 85° and less than or equal to 95° is also included. Moreover, "substantially perpendicular" indicates a state where two straight lines are placed at an angle greater than or equal to 60° and less than or equal to 120°.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in a semiconductor layer of a transistor, the metal oxide is referred to as an oxide semiconductor in some cases. That is, an OS transistor can also be called a transistor including a metal oxide or an oxide semiconductor.

In this specification and the like, "normally off" means that a drain current per micrometer of channel width flowing through a transistor when no potential is applied to a gate or the gate is supplied with a ground potential is $1 \times 10^{-20}$ A or lower at room temperature, $1 \times 10^{-18}$ A or lower at 85° C., or $1 \times 10^{-16}$ A or lower at 125° C.

Embodiment 1

An example of a semiconductor device including a transistor 200 of one embodiment of the present invention and a manufacturing method thereof are described in this embodiment.

<Structure Example of Semiconductor Device>

FIG. 1A to FIG. 1D are a top view and cross-sectional views of a semiconductor device including the transistor 200. FIG. 1A is a top view of the semiconductor device. FIG. 1B to FIG. 1D are cross-sectional views of the semiconductor device. Here, FIG. 1B is a cross-sectional view of a portion indicated by a dashed-dotted line A1-A2 in FIG. 1A, and is a cross-sectional view in the channel length direction of the transistor 200. FIG. 1C is a cross-sectional view of a portion indicated by a dashed-dotted line A3-A4 in FIG. 1A, and is a cross-sectional view in the channel width direction of the transistor 200. FIG. 1D is a cross-sectional view of a portion indicated by a dashed-dotted line A5-A6 in FIG. 1A.

Note that for clarity of the drawing, some components are not illustrated in the top view of FIG. 1A.

The semiconductor device of one embodiment of the present invention includes an insulator 211 over a substrate (not illustrated), an insulator 212 over the insulator 211, an insulator 214 over the insulator 212, the transistor 200 over the insulator 214, an insulator 280 over the transistor 200, an insulator 282 over the transistor 200 and the insulator 280, an insulator 283 over the insulator 282, and an insulator 284 over the insulator 283. Note that the insulator 280 is provided to cover at least part of the transistor 200. The insulator 211, the insulator 212, the insulator 214, the insulator 280, the insulator 282, the insulator 283, and the insulator 284 function as interlayer films. A conductor 240 (a conductor 240a and a conductor 240b) that is electrically connected to the transistor 200 and functions as a plug is also included. Note that an insulator 241 (an insulator 241a and an insulator 241b) is provided in contact with side surfaces of the conductor 240 functioning as a plug. A conductor 246 (a conductor 246a and a conductor 246b) that is electrically connected to the conductor 240 and functions as a wiring is provided over the insulator 284 and the conductor 240. An insulator 286 is provided over the conductor 246 and the insulator 284.

Although detailed description will be made later, in the transistor 200, an insulator 272, an insulator 273, and an insulator 245 (an insulator 245a and an insulator 245b) are included; the insulator 241a is provided in contact with the inner wall of an opening in the insulator 245a, the insulator 272, the insulator 273, the insulator 280, the insulator 282, the insulator 283, and the insulator 284; a first conductor of the conductor 240a is provided in contact with a side surface of the insulator 241a; and a second conductor of the conductor 240a is provided on the inner side. The insulator 241b is provided in contact with the inner wall of an opening in the insulator 245b, the insulator 272, the insulator 273, the insulator 280, the insulator 282, the insulator 283, and the insulator 284; a first conductor of the conductor 240b is provided in contact with a side surface of the insulator 241b; and a second conductor of the conductor 240b is provided on the inner side. Here, the level of a top surface of the conductor 240 and the level of a top surface of the insulator 284 in a region overlapping with the conductor 246 can be substantially the same. Note that although the transistor 200 has a structure in which the first conductor of the conductor 240 and the second conductor of the conductor 240 are stacked, the present invention is not limited thereto. For example, the conductor 240 may be provided as a single layer or to have a stacked-layer structure of three or more layers. In the case where a structure body has a stacked-layer structure, layers may be distinguished by ordinal numbers corresponding to the formation order.

[Transistor 200]

As illustrated in FIG. 1A to FIG. 1D, the transistor 200 includes an insulator 216 over the insulator 214, a conductor 205 (a conductor 205a and a conductor 205b) positioned to be embedded in the insulator 216, an insulator 222 over the insulator 216 and the conductor 205, an insulator 224 over the insulator 222, an insulator 226 over the insulator 224, an oxide 230a over the insulator 226, an oxide 230b over the oxide 230a, an oxide 243 (an oxide 243a and an oxide 243b) and an insulator 231 over the oxide 230b, a conductor 242 (a conductor 242a and a conductor 242b) over the oxide 243, an insulator 245 (an insulator 245a and an insulator 245b) over the conductor 242, an insulator 250 over the insulator 231, a conductor 260 (a conductor 260a and a conductor 260b) positioned over the insulator 250 and overlapping with part of the oxide 230b, an oxide 271 in contact with part of a top surface of the insulator 224 and in contact with a side surface of the oxide 230b, an insulator 272 in contact with part of the top surface of the insulator 224, part of the oxide 271, part of the conductor 242a, and part of the conductor 242b, and an insulator 273 over the insulator 272. In addition, the insulator 231 is in contact with each of a side surface of the conductor 242a and a side surface of the conductor 242b. The oxide 271 may be in contact with a side surface of the insulator 226, a side surface of the oxide 230a, and a side surface of the conductor 242. Here, as illustrated in FIG. 1B and FIG. 1C, a top surface of the conductor 260 is positioned to be substantially aligned with a top surface of the insulator 250 and a top surface of the insulator 231. The insulator 282 is in contact with the top surfaces of the conductor 260, the insulator 250, the insulator 231, and the insulator 280.

An opening reaching the oxide 230b is provided in the insulator 280, the insulator 273, the insulator 272, the insulator 245, the conductor 242, and the oxide 243. The insulator 231, the insulator 250, and the conductor 260 are positioned in the opening. The conductor 260, the insulator 250, and the insulator 231 are provided between the conductor 242a and the conductor 242b in the channel length direction of the transistor 200. The insulator 250 includes a region overlapping with a side surface of the conductor 260 and a region overlapping with a bottom surface of the conductor 260. The insulator 231 includes a region in contact with the oxide 230b, a region overlapping with the side surface of the conductor 260 with the insulator 250 therebetween, and a region overlapping with the bottom surface of the conductor 260 with the insulator 250 therebetween, in a region overlapping with the oxide 230b.

The oxide 230 preferably includes the oxide 230a positioned over the insulator 226 and the oxide 230b positioned over the oxide 230a. Including the oxide 230a below the oxide 230b makes it possible to inhibit diffusion of impurities into the oxide 230b from the components formed below the oxide 230a. The transistor 200 preferably includes the insulator 231 over the oxide 230b. When the insulator 231 is included over the oxide 230b, it is possible to inhibit diffusion of impurities into the oxide 230b from the components formed above the insulator 231. When the insulator 226 is provided between the insulator 224 and the oxide 230, oxygen contained in the insulator 224 can be inhibited from being excessively supplied to a region of the oxide 230 overlapping with the conductor 242. In contrast, by providing the oxide 271 in contact with the insulator 224 and in contact with the side surface of the oxide 230b, oxygen contained in the insulator 224 can be supplied to a region functioning as a channel formation region of the oxide 230b. When the insulator 231 is provided to cover the insulator 224, the oxide 271, and the oxide 230b, oxygen contained in the insulator 224 can be efficiently supplied to the oxide 230b.

Although a structure in which the oxide 230a and the oxide 230b are stacked as the oxide 230 in the transistor 200 is described, the present invention is not limited thereto. For example, the oxide 230 may have a single-layer structure of the oxide 230b or a stacked-layer structure of three or more layers, or the oxide 230a and the oxide 230b may each have a stacked-layer structure.

Here, the conductor 260 functions as a first gate (also referred to as a top gate) electrode, and the conductor 205 functions as a second gate (also referred to as a back gate) electrode. The insulator 250 functions as a first gate insulator, and the insulator 224 functions as a second gate insulator. The conductor 242a has a function as one of the source and the drain, and the conductor 242b has a function of the other of the source and the drain. Furthermore, the oxide 230 functions as a channel formation region.

In the transistor 200, a metal oxide functioning as a semiconductor (hereinafter, also referred to as an oxide semiconductor) is preferably used as the oxide 230 (the oxide 230a and the oxide 230b) including a channel formation region.

The metal oxide functioning as a semiconductor has a band gap of preferably 2 eV or higher, further preferably 2.5 eV or higher. With the use of a metal oxide having such a wide bandgap, the off-state current of the transistor can be reduced.

The transistor in which a metal oxide is used in its channel formation region has an extremely low leakage current in a non-conduction state; thus, a semiconductor device with low power consumption can be provided. The metal oxide can be deposited by a sputtering method or the like, and thus can be used for a transistor included in a highly integrated semiconductor device.

In the case where an oxide semiconductor is used in the channel formation region of a transistor, an i-type (intrinsic) or substantially i-type oxide semiconductor with a low carrier concentration is preferably used. When the oxide semiconductor with a low carrier concentration is used in the channel formation region of a transistor, the off-state current of the transistor can be kept low or the reliability of the transistor can be improved.

As described later, in the case where an element included in the conductive layer 242B which is provided over the oxide 230b with an oxide layer 243B therebetween as illustrated in FIG. 7A to FIG. 7D has a function of absorbing oxygen in the oxide 230b, sometimes, oxygen vacancies are generated between the oxide 230b and the conductive layer 242B or in the vicinity of a surface of the oxide 230b, whereby a low-resistance region is partially formed. Here, the element is an impurity in the oxide semiconductor in some cases. In this case, in the low-resistance region, an impurity or an impurity that has entered an oxygen vacancy (hydrogen, nitrogen, a metal element, or the like) serves as a donor, so that the carrier density increases in some cases.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. When the channel formation region in the oxide semiconductor includes oxygen vacancies, the transistor tends to have normally-on characteristics (the channel is generated even when no voltage is applied to the gate electrode and current flows through the transistor).

Figure 15A:
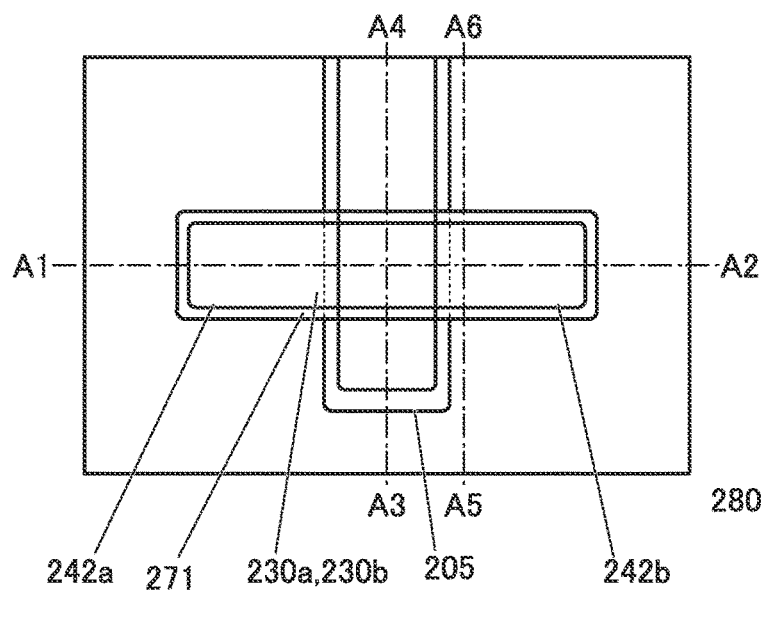
FIG. 15A is a top view illustrating a method for manufacturing a semiconductor device of one embodiment of the present invention.
Figure 15C:
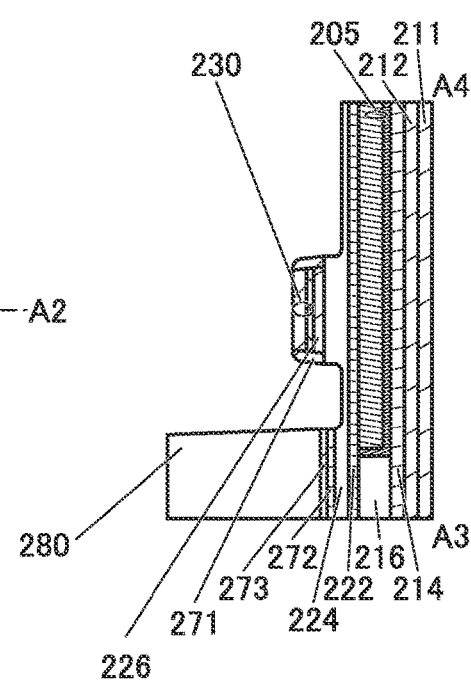
FIG. 15B to FIG. 15D are cross-sectional views illustrating a method for manufacturing a semiconductor device of one embodiment of the present invention.
Figure 15B:
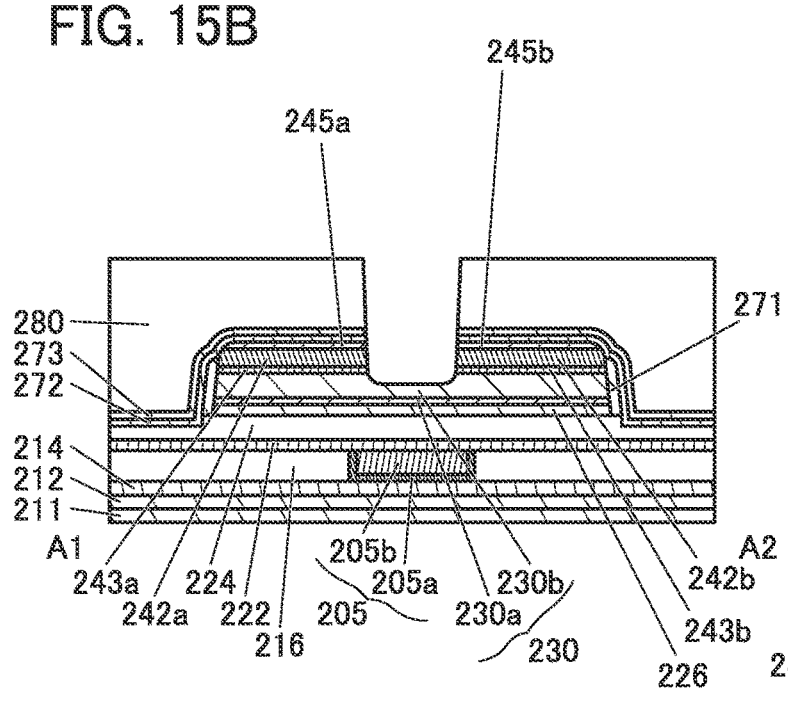
Figure 15D:
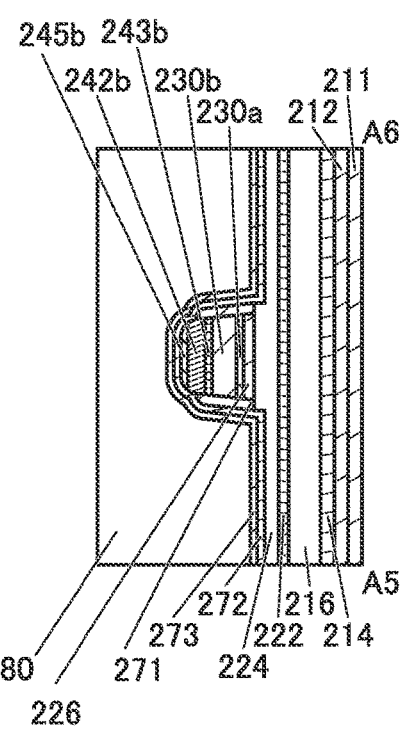
Figure 17A:
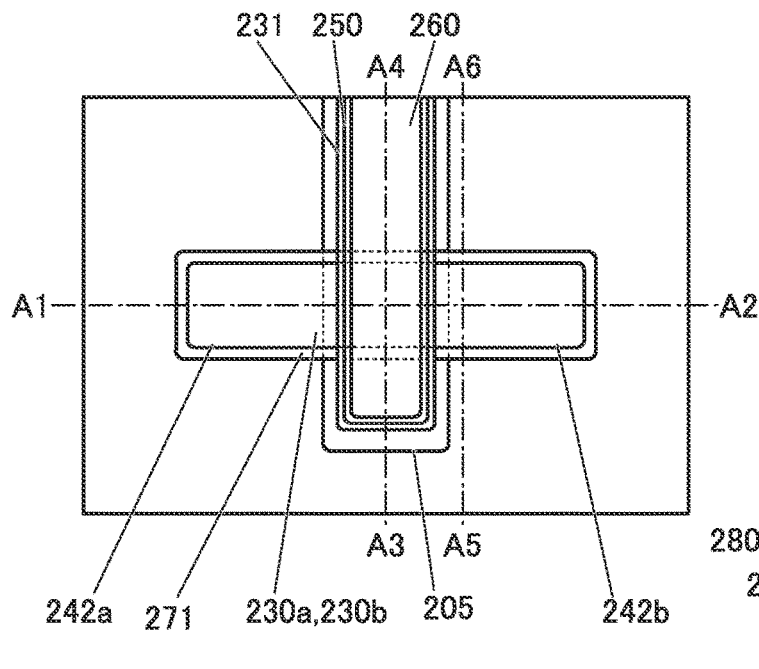
FIG. 17A is a top view illustrating a method for manufacturing a semiconductor device of one embodiment of the present invention.
Figure 17C:
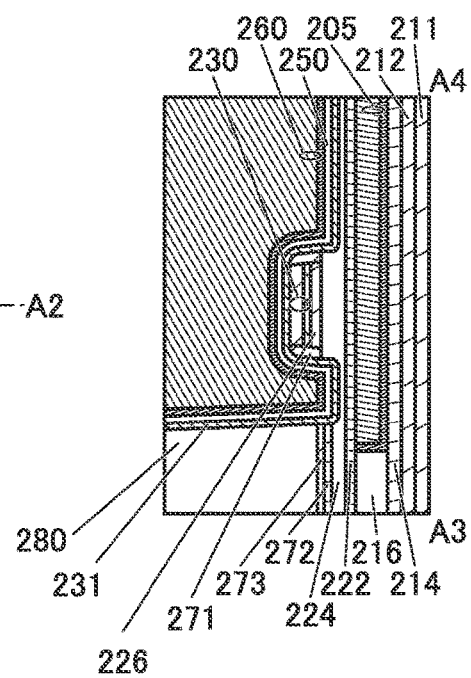
FIG. 17B to FIG. 17D are cross-sectional views illustrating a method for manufacturing a semiconductor device of one embodiment of the present invention.
Figure 17B:
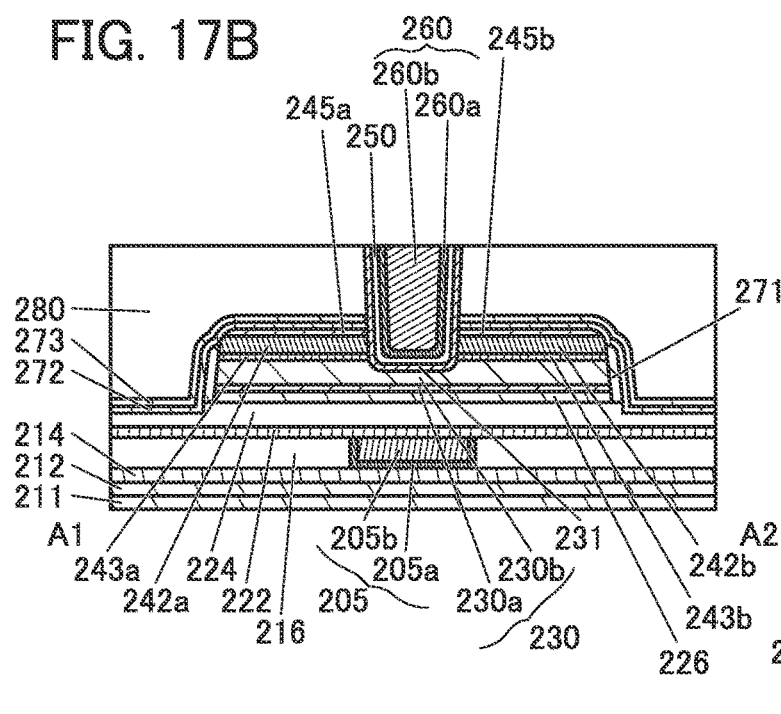
Figure 17D:
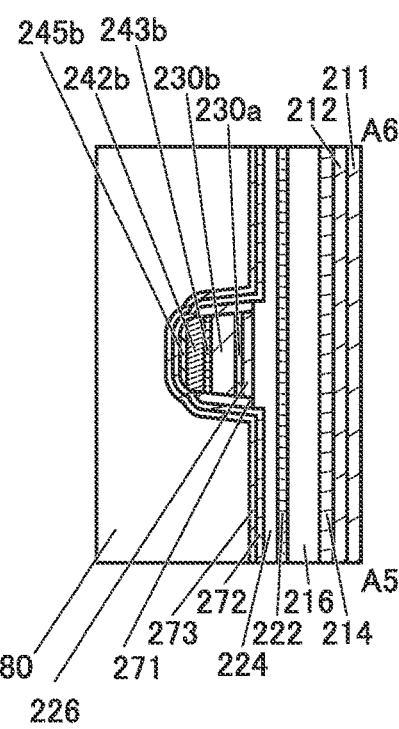

For example, as illustrated in FIG. 1B, FIG. 15B, and the like, when a groove portion is provided in the oxide 230b in the cross-sectional view in the channel length direction of the transistor, the impurity can be removed, the low-resistance region in the vicinity of the surface of the oxide 230b to be the channel formation region can be reduced, and the generation of a parasitic channel can be suppressed.

In the cross-sectional view in the channel length direction of the transistor, the depth of the groove portion provided in the oxide 230b is also the difference between the top surface of the oxide 230b in a region overlapping with the conductor 242a or the conductor 242b and the top surface of the oxide 230b in a region overlapping with the conductor 260. The depth of the groove portion is typically greater than 0 nm and less than or equal to 10 nm, preferably greater than or equal to 1 nm and less than or equal to 7 nm, more preferably greater than or equal to 2 nm and less than or equal to 5 nm.

By providing the groove portion in the oxide 230b, the impurity is removed and a highly reliable semiconductor device with a small variation in transistor characteristics can be provided.

As the oxide 230, for example, a metal oxide such as an In-M-Zn oxide including indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, aluminum, gallium, yttrium, or tin is preferably used as the element M. An In—Ga oxide, an In—Zn oxide, or an indium oxide may be used as the oxide 230.

The oxide 230 preferably has a stacked-layer structure of a plurality of oxide layers with different chemical compositions. Specifically, the atomic ratio of the element M to the metal element as the main component in the metal oxide used as the oxide 230a is preferably greater than the atomic ratio of the element M to the metal element as the main component in the metal oxide used as the oxide 230b. Moreover, the atomic ratio of the element M to In in the metal oxide used as the oxide 230a is preferably greater than the atomic ratio of the element M to In in the metal oxide used as the oxide 230b. Furthermore, the atomic ratio of In to the element M in the metal oxide used as the oxide 230b is preferably greater than the atomic ratio of In to the element M in the metal oxide used as the oxide 230a.

In order to make the oxide 230b serve as a main carrier path, the atomic ratio of indium to a metal element that is a main component in the oxide 230b is preferably higher than the atomic ratio of indium to a metal element that is a main component in the 230a. When a metal oxide having a high content of indium is used for a channel formation region, the on-state current of the transistor can be increased. Thus, when the atomic ratio of indium to a metal element that is a main component in the oxide 230b is higher than the atomic ratio of indium to a metal element that is a main component in the oxide 230a, the oxide 230b can serve as a main carrier path.

The conduction band minimum of the oxide 230b is preferably further away from the vacuum level than the conduction band minimum of the oxide 230a is. In other words, the electron affinity of the oxide 230b is preferably higher than the electron affinity of the oxide 230a. At this time, the oxide 230b serves as a main carrier path.

The oxide 230b preferably has crystallinity. For example, a CAAC-OS (c-axis aligned crystalline oxide semiconductor) described later is preferably used. An oxide having crystallinity, such as a CAAC-OS, has a dense structure with small amounts of impurities and defects (e.g., oxygen vacancies) and high crystallinity. This can inhibit oxygen extraction from the oxide 230b by the source electrode or the drain electrode. This can inhibit oxygen extraction from the oxide 230b even when heat treatment is performed; hence, the transistor 200 is stable against heat treatment in the manufacturing process.

Here, the conduction band minimum gradually changes at a junction portion of the oxide 230a and the oxide 230b. In other words, the conduction band minimum at the junction portion of the oxide 230a and the oxide 230b continuously changes or is continuously connected. To gradually change the conduction band minimum, the density of defect states in a mixed layer formed at the interface between the oxide 230a and the oxide 230b is decreased.

Specifically, when the oxide 230a and the oxide 230b include the same element as a main component in addition to oxygen, a mixed layer with a low density of defect states can be formed. For example, in the case where the oxide 230b is an In-M-Zn oxide, an In-M-Zn oxide, a M-Zn oxide, an oxide of the element M, an In—Zn oxide, or indium oxide may be used as the oxide 230a.

Specifically, as the oxide 230a, a metal oxide with a composition In:M:Zn=1:3:4 [atomic ratio] or a neighborhood thereof, or In:M:Zn=1:1:0.5 [atomic ratio] or a neighborhood thereof is used. As the oxide 230b, a metal oxide with a composition In:M:Zn=1:1:1 [atomic ratio] or a neighborhood thereof, a composition In:M:Zn=4:2:3[atomic ratio] or a neighborhood thereof, a composition In:M:Zn=5:1:3 [atomic ratio] or a neighborhood thereof, a composition In:M:Zn=10:1:3 [atomic ratio] or a neighborhood thereof, a composition In:Zn=1:1 [atomic ratio] or a neighborhood thereof, or a composition In:Zn=2:1 [atomic ratio] or a neighborhood thereof, or an indium oxide can be used. Note that a composition in the neighborhood includes the range of ±30% of an intended atomic ratio. Gallium is preferably used as the element M.

When the metal oxide is deposited by a sputtering method, the above atomic ratio is not limited to the atomic ratio of the deposited metal oxide and may be the atomic ratio of a sputtering target used for depositing the metal oxide.

When the oxide 230a and the oxide 230b have the above structure, the density of defect states at the interface between the oxide 230a and the oxide 230b can be made low. Thus, the influence of interface scattering on carrier conduction is small, and the transistor 200 can have a high on-state current and excellent frequency characteristics.

The insulator 211, the insulator 212, the insulator 214, the insulator 272, the insulator 273, the insulator 282, the insulator 283, the insulator 284, and the insulator 286 preferably have a function of inhibiting the diffusion of impurities such as water and hydrogen into the transistor 200 and especially into the oxide 230 from the substrate side or from a portion above the transistor 200. Thus, for each of the insulator 211, the insulator 212, the insulator 214, the insulator 272, the insulator 273, the insulator 282, the insulator 283, the insulator 284, and the insulator 286, an insulating material having a function of inhibiting diffusion of impurities such as hydrogen atoms, hydrogen molecules, water molecules, nitrogen atoms, nitrogen molecules, nitrogen oxide molecules (e.g., $N_2O$, NO, or $NO_2$), or copper atoms (through which the impurities are less likely to pass) is preferably used. Alternatively, it is preferable to use an insulating material having a function of inhibiting diffusion of oxygen (e.g., at least one of an oxygen atom, an oxygen molecule, and the like) (through which the above oxygen is less likely to pass). Such an insulating film having a function of inhibiting the diffusion of the impurities and oxygen is sometimes referred to as a barrier insulating film.

For example, it is preferable that the insulator 211, the insulator 212, the insulator 283, and the insulator 284 be formed using silicon nitride or the like, and the insulator 214, the insulator 272, the insulator 273, and the insulator 282 be formed using aluminum oxide or the like. Accordingly, impurities such as water and hydrogen can be inhibited from being diffused to the transistor 200 side from the substrate side through the insulator 211, the insulator 212, and the insulator 214. Alternatively, oxygen contained in the insulator 224 or the like can be inhibited from being diffused to the substrate side through the insulator 211, the insulator 212, and the insulator 214. Impurities such as water or hydrogen can be inhibited from being diffused into the transistor 200 side through the insulator 272 and the insulator 273 from the insulator 280, the conductor 246, and the like, which are provided above the insulator 273. In this manner, the transistor 200 is preferably surrounded by the insulator 211, the insulator 212, the insulator 214, the insulator 272, the insulator 273, the insulator 282, the insulator 283, and the insulator 284 having a function of inhibiting diffusion of oxygen and impurities such as water and hydrogen.

Here, when the insulator 212 and the insulator 283 can sufficiently inhibit the diffusion of impurities such as water and hydrogen, the insulator 211 or the insulator 284 is not necessarily provided. Alternatively, silicon oxide, silicon oxynitride, or the like may be used for the insulator 211 or the insulator 284.

The resistivities of the insulator 211, the insulator 284, and the insulator 286 are preferably low in some cases. For example, by setting the resistivities of the insulator 211, the insulator 284, and the insulator 286 to approximately $1 \times 10^{13}$ Ωcm, the insulator 211, the insulator 284, and the insulator 286 can sometimes reduce charge up of the conductor 205, the conductor 242, or the conductor 260 in treatment using plasma or the like in the manufacturing process of a semiconductor device. The resistivities of the insulator 211, the insulator 284, and the insulator 286 are preferably higher than or equal to $1 \times 10^{10}$ Ωcm and lower than or equal to $1 \times 10^{15}$ Ωcm.

Note that the insulator 211 or the insulator 212 is not necessarily provided, and the insulator 283 or the insulator 284 is not necessarily provided. The insulator 211 and the insulator 283 are not necessarily provided in the case where the insulator 212 and the insulator 284 are deposited by a CVD method using a compound gas containing no hydrogen atom or having a low hydrogen atom content, for example.

The insulator 216 and the insulator 280 preferably have a lower permittivity than the insulator 214. When a material with a low permittivity is used for the interlayer film, the parasitic capacitance generated between wirings can be reduced. As the insulator 216 and the insulator 280, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate, for example.

An enlarged cross-sectional view of the oxide 230 and the vicinity thereof illustrated in FIG. 1C is illustrated in FIG. 2.

An insulator 226 functioning as an oxygen blocking film is provided between the insulator 224 and the oxide 230a. The oxide 271 is provided in contact with the insulator 224, the side surface of the insulator 226, the side surface of the oxide 230a, and the side surface of the oxide 230b. The insulator 231 functioning as an oxygen blocking film is provided to cover the insulator 224, the insulator 226, the oxide 230a, the oxide 230b, and the oxide 271.

Here, for the oxygen blocking film the above barrier insulating film can be used; specifically, it is preferable to use an insulating material having a function of inhibiting diffusion of oxygen (e.g., at least one of oxygen atoms, oxygen molecules, and the like) (an insulating material through which the above oxygen is less likely to pass). For example, aluminum oxide can be used for the insulator 226 and the insulator 231 each having a functioning as an oxygen blocking film. Alternatively, hafnium oxide, an oxide containing aluminum and hafnium (hafnium aluminate), or the like can be used for the insulator 226 and the insulator 231 each having a function of an oxygen blocking film. As the insulator 226 and the insulator 231 each having a function of an oxygen blocking film, a metal oxide such as magnesium oxide, gallium oxide, germanium oxide, yttrium oxide, zirconium oxide, lanthanum oxide, neodymium oxide, or tantalum oxide; or a metal nitride such as aluminum nitride, silicon nitride oxide, or silicon nitride can be used. The oxygen blocking film may have a stacked-layer structure. For example, in the case where at least one of the insulator 226 and the insulator 231 has a stacked-layer structure, the above material can be used for the lower layer of the stacked-layer structure and silicon oxide or silicon oxynitride can be used for the upper layer of the stacked-layer structure.

An In-M-Zn oxide can be used as the oxide 271. In a metal oxide used for the oxide 271, it is preferable that the atomic ratio of In to a metal element that is a main component be higher than the atomic ratio of the element M to the metal element that is the main component. A material that can be used for the oxide 230b is preferably used. In particular, the oxide 271 and the oxide 230b are preferably formed using the same material.

As the oxide 271, a metal oxide with a composition In:M:Zn=4:2:3 [atomic ratio] or a neighborhood thereof, a composition In:M:Zn=5:1:3 [atomic ratio] or a neighborhood thereof, a composition In:M:Zn=10:1:3 [atomic ratio] or a neighborhood thereof, a composition In:Zn=1:1 [atomic ratio] or a neighborhood thereof, or a composition In:Zn=2:1 [atomic ratio] or a neighborhood thereof, an indium oxide, or the like is preferably used, specifically.

The oxide 271 may have a stacked-layer structure. For example, a stacked-layer structure in which a material that can be used for the oxide 230b is used for a first layer of the oxide 271 and a material that can be used for the oxide 230a is used for a second layer of the oxide 271 may be employed. Here, the first layer is preferably provided in contact with the oxide 230b.

It is preferable to use a CAAC-OS as the oxide 271, and it is preferable that the c-axis of a crystal included in the oxide 271 be in a direction substantially perpendicular to the formation surface of the oxide 271, i.e., at least the side surface of the insulator 226, the side surface of the oxide 230a, and the side surface of the oxide 230b. The CAAC-OS has a property of making oxygen move easily in the direction perpendicular to the c-axis. Thus, oxygen contained in the insulator 224 can be efficiently supplied to the oxide 230b through the oxide 271.

When an indium oxide or an In-M-Zn oxide in which the content of the element M and zinc is smaller than the content of indium is used as the oxide 271, the crystallinity of the oxide 271 may be low. An indium oxide film and an In-M-Zn oxide film in which the content of the element M and zinc is smaller than the content of indium may be a polycrystalline film when the crystallinity is increased. A polycrystalline film includes a grain boundary; the grain boundary becomes a defect state and sometimes serves as a carrier trap or a carrier generation source. Accordingly, a transistor using a polycrystalline In-M-Zn oxide has a large variation in the electrical characteristics and the reliability is low in some cases.

As illustrated in FIG. 2, the insulator 224 is in contact with the oxide 271 in a region 276 and is covered with the insulator 226 and the insulator 231 functioning as oxygen blocking films in areas other than the region 276. Accordingly, oxygen contained in the insulator 224 diffuses into the oxide 271 through the region 276. The oxide 271 is in contact with the oxide 230b in a region 277, and oxygen diffused into the oxide 271 diffuses into the oxide 230b through the region 277.

Here, the oxygen blocking films can be a material which is relatively unlikely to pass oxygen as compared to the oxide 271. That is, the above-mentioned metal oxide such as the In-M-Zn oxide may be used for at least one of the insulator 226 and the insulator 231. In that case, the atomic ratio of the element M to the metal element that is the main component in the metal oxide used for the insulator 226 or the insulator 231 is preferably greater than the atomic ratio of the element M to the metal element that is the main component in the metal oxide used for the oxide 271. Moreover, the atomic ratio of the element M to In in the metal oxide used for the insulator 226 and the insulator 231 is preferably greater than the atomic ratio of the element M to In in the metal oxide used for the oxide 271.

Specifically, as at least one of the insulator 226 and the insulator 231, a metal oxide with a composition In:M:Zn=1:3:4 [atomic ratio] or a neighborhood thereof, or a composition In:M:Zn=1:1:0.5 [atomic ratio] or a neighborhood thereof can be used. The oxygen blocking film may have a stacked-layer structure even in the case where a metal oxide is used for the oxygen blocking film, as in the above. For example, in the case where at least one of the insulator 226 and the insulator 231 has a stacked-layer structure, the above metal oxide material can be used for the lower layer of the stacked-layer structure and silicon oxide or silicon oxynitride can be used for the upper layer of the stacked-layer structure.

Although the oxygen blocking film might have conductivity when such a metal oxide is used for the oxygen blocking film, such an oxygen blocking film is referred to as the insulator 226 or the insulator 231 in this specification.

By providing the oxide 271 as a diffusion path of oxygen, and providing the insulator 226 and the insulator 231 each as an oxygen blocking film that inhibits the diffusion of oxygen in this manner, oxygen contained in the insulator 224 can be efficiently supplied to the oxide 230b. When oxygen is supplied to the oxide 230b, oxygen vacancies are reduced and the reliability of the transistor 200 can be improved.

Here, a case where the transistor 200 is arranged in a matrix, that is, a plurality of the transistors 200 are arranged in the A1-A2 direction and the A3-A4 direction, is considered. The plurality of the transistors 200 arranged in the A1-A2 direction or the plurality of the transistors 200 arranged in the A3-A4 direction share the conductor 260 functioning as a first gate electrode in some cases.

An oxygen barrier film in contact with the oxide 230 is provided in the periphery of the conductor 260 with the insulator 250 functioning as the first gate insulating film therebetween. In the case where the oxygen barrier film has high conductivity, the adjacent transistors 200 are electrically connected through the oxide 230 and the oxygen barrier film; therefore, a semiconductor device including the transistors 200 cannot operate normally. In the case where a material having semiconductor characteristics is used for the oxygen barrier film, the oxygen barrier film has conductivity in accordance with a potential of the first gate electrode, whereby the adjacent transistors 200 are electrically connected through the oxide 230 and the oxygen barrier film; therefore, the semiconductor device including the transistors 200 cannot operate normally.

A method by which part of the oxygen barrier film is removed can be employed to inhibit the electrical connection between the adjacent transistors 200 as described above; however, an increase in the number of processes such as a lithography process or an etching process might be required. Thus, an insulating material is preferably used for the oxygen barrier film. When an insulating material is used for the oxygen barrier film, a semiconductor device with favorable characteristics can be manufactured without adding the process such as the lithography process or the etching process.

As illustrated in FIG. 1C and FIG. 2, a curved surface may be included between the side surface of the oxide 271 and the top surface of the oxide 230b in a cross-sectional view in the channel width direction of the transistor 200. That is, an end portion of the side surface and an end portion of the top surface may be curved (such a shape is hereinafter also referred to as a rounded shape).

The radius of curvature of the curved surface is preferably greater than 0 nm and less than the thickness of the oxide 230b in a region overlapping with the conductor 242, or less than half of the length of a region of the top surface of the oxide 230b that does not have the curved surface. Specifically, the radius of curvature of the curved surface is greater than 0 nm and less than or equal to 20 nm, preferably greater than or equal to 1 nm and less than or equal to 15 nm, and further preferably greater than or equal to 2 nm and less than or equal to 10 nm. With such a shape, the coverage of the groove portion with the insulator 231, the insulator 250, and the conductor 260, which are formed in a later step can be improved. Furthermore, reduction in the length of the region of the top surface of the oxide 230b that does not have the curved surface can be prevented, and decrease in the on-state current and mobility of the transistor 200 can be inhibited. Thus, a semiconductor device with favorable electrical characteristics can be provided.

The conductor 205 sometimes functions as a second gate electrode. In that case, by changing a potential applied to the conductor 205 not in conjunction with but independently of a potential applied to the conductor 260, the threshold voltage (Vth) of the transistor 200 can be controlled. In particular, by applying a negative potential to the conductor 205, Vth of the transistor 200 can be further increased, and the off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is positioned to overlap with the oxide 230 and the conductor 260. Furthermore, the conductor 205 is preferably embedded in the insulator 216.

As illustrated in FIG. 1A, the conductor 205 is preferably provided to be larger than a region of the oxide 230 that does not overlap with the conductor 242a and the conductor 242b. As illustrated in FIG. 1C, it is particularly preferable that the conductor 205 extend to a region outside an end portion of the oxide 230 that intersects with the channel width direction. That is, the conductor 205 and the conductor 260 preferably overlap with each other with the insulators therebetween outside a side surface of the oxide 230 in the channel width direction. With this structure, the channel formation region of the oxide 230 can be electrically surrounded by the electric field of the conductor 260 functioning as a first gate electrode and the electric field of the conductor 205 functioning as the second gate electrode. In this specification, a transistor structure in which a channel formation region is electrically surrounded by electric fields of a first gate and a second gate is referred to as a surrounded channel (S-channel) structure.

In this specification and the like, the S-channel transistor refers to a transistor structure in which a channel formation region is electrically surrounded by electric fields of a pair of gate electrodes. Furthermore, in this specification and the like, the S-channel structure has a feature in that the side surface and the vicinity of the oxide 230 in contact with the conductor 242a and the conductor 242b that function as a source electrode and a drain electrode are of I-type like the channel formation region. The side surface and the vicinity of the oxide 230 in contact with the conductor 242a and the conductor 242b are in contact with the insulator 280 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

Furthermore, as illustrated in FIG. 1C, the conductor 205 is extended to function as a wiring as well. However, without limitation to this structure, a structure where a conductor functioning as a wiring is provided below the conductor 205 may be employed. In addition, the conductor 205 does not necessarily have to be provided in each transistor. For example, the conductor 205 may be shared by a plurality of transistors.

Although the transistor 200 having a structure in which the conductor 205a and the conductor 205b are stacked as the conductor 205 is illustrated, the present invention is not limited thereto. For example, the conductor 205 may have a single-layer structure or a stacked-layer structure of three or more layers. In the case where a structure body has a stacked-layer structure, layers may be distinguished by ordinal numbers corresponding to the formation order.

Here, for the conductor 205a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, NO, $NO_2$, or the like), and a copper atom. Alternatively, it is preferable to use a conductive material having a function of inhibiting diffusion of oxygen (e.g., at least one of an oxygen atom, an oxygen molecule, and the like).

When a conductive material having a function of inhibiting diffusion of oxygen is used for the conductor 205a, the conductivity of the conductor 205b can be inhibited from being lowered because of oxidation. As a conductive material having a function of inhibiting diffusion of oxygen, for example, tantalum, tantalum nitride, ruthenium, or ruthenium oxide is preferably used. Thus, the conductor 205a is a single layer or a stacked layer of the above conductive materials. For example, the conductor 205a may be a stack of tantalum, tantalum nitride, ruthenium, or ruthenium oxide and titanium or titanium nitride.

Moreover, the conductor 205b is preferably formed using a conductive material containing tungsten, copper, or aluminum as its main component. Note that the conductor 205b is illustrated as a single layer but may have a stacked-layer structure, for example, a stack of the conductive materials and titanium or titanium nitride.

The insulator 222 and the insulator 224 function as a gate insulator.

It is preferable that the insulator 222 have a function of inhibiting diffusion of hydrogen (e.g., at least one of a hydrogen atom, a hydrogen molecule, and the like). In addition, it is preferable that the insulator 222 have a function of inhibiting diffusion of oxygen (e.g., at least one of an oxygen atom, an oxygen molecule, and the like). For example, the insulator 222 preferably has a function of further inhibiting diffusion of one or both of hydrogen and oxygen as compared to the insulator 224.

As the insulator 222, an insulator containing an oxide of one or both of aluminum and hafnium, which is an insulating material, is preferably used. It is preferable that aluminum oxide, hafnium oxide, an oxide containing aluminum and hafnium (hafnium aluminate), or the like be used as the insulator. In the case where the insulator 222 is formed using such a material, the insulator 222 functions as a layer that inhibits release of oxygen from the oxide 230 to the substrate side and diffusion of impurities such as hydrogen from the periphery of the transistor 200 into the oxide 230. Thus, providing the insulator 222 can inhibit diffusion of impurities such as hydrogen inside the transistor 200 and inhibit generation of oxygen vacancies in the oxide 230. Moreover, the conductor 205 can be inhibited from reacting with oxygen contained in the insulator 224 and the oxide 230.

Alternatively, aluminum oxide, bismuth oxide, germanium oxide, niobium oxide, silicon oxide, titanium oxide, tungsten oxide, yttrium oxide, or zirconium oxide may be added to the above insulator, for example. Alternatively, these insulators may be subjected to nitriding treatment. A stack of silicon oxide, silicon oxynitride, or silicon nitride over these insulators may be used as the insulator 222.

For example, a single layer or stacked layers of an insulator containing what is called a high-k material such as aluminum oxide, hafnium oxide, tantalum oxide, zirconium oxide, lead zirconate titanate (PZT), strontium titanate ($SrTiO_3$), or $(Ba,Sr)TiO_3$ (BST) may be used for the insulator 222. With miniaturization and high integration of transistors, a problem such as leakage current may arise because of a thinner gate insulator. When a high-k material is used for the insulator functioning as a gate insulator, a gate potential during operation of the transistor can be reduced while the physical thickness of the gate insulator is maintained.

It is preferable that oxygen be released from the insulator 224 by heating. Silicon oxide, silicon oxynitride, or the like is used as appropriate for the insulator 224, for example. When an insulator containing oxygen is provided in contact with the oxide 230, oxygen vacancies in the oxide 230 can be reduced and the reliability of the transistor 200 can be improved.

For the insulator 224, specifically, an oxide material from which part of oxygen is released by heating, in other words, an insulating material including an excess-oxygen region is preferably used. An oxide that releases oxygen by heating is an oxide film in which the amount of released oxygen molecules is greater than or equal to $1.0\times10^{18}$ molecules/$cm^3$, preferably greater than or equal to $1.0\times10^{19}$ molecules/$cm^3$, further preferably greater than or equal to $2.0\times10^{19}$ molecules/$cm^3$ or greater than or equal to $3.0\times10^{20}$ molecules/$cm^3$ in TDS (Thermal Desorption Spectroscopy) analysis. Note that the temperature of the film surface in the TDS analysis is preferably within the range of 100° C. to 700° C., or 100° C. to 400° C.

One or more of heat treatment, microwave treatment, and RF treatment may be performed in a state in which the insulator including an excess-oxygen region and the oxide 230 are in contact with each other. By the treatment, water or hydrogen in the oxide 230 can be removed. For example, in the oxide 230, a reaction where the bond of a vacancy that is an oxygen vacancy including hydrogen ($V_OH$) is cut occurs. In other words, a reaction of "$V_OH \rightarrow V_O+H$" occurs and dehydrogenation can be performed. Part of hydrogen generated at this time is bonded to oxygen to be $H_2O$, and removed from the oxide 230 or an insulator in the vicinity of the oxide 230 in some cases. Part of hydrogen is diffused into or trapped by (also referred to as gettering) by the conductor 242 in some cases.

For the microwave treatment, for example, an apparatus including a power supply that generates high-density plasma or an apparatus including a power supply that applies RF to the substrate side is suitably used. For example, the use of a gas containing oxygen and high-density plasma enables high-density oxygen radicals to be generated, and RF application to the substrate side allows the oxygen radicals generated by the high-density plasma to be efficiently introduced into the oxide 230 or an insulator in the vicinity of the oxide 230. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ($O_2/(O_2+Ar)$) is lower than or equal to 50%, preferably higher than or equal to 10% and lower than or equal to 30%.

In a manufacturing process of the transistor 200, heat treatment is preferably performed with a surface of the oxide 230 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This can supply oxygen to the oxide 230 to reduce oxygen vacancies ($V_O$). The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is performed in a nitrogen gas or inert gas atmosphere.

Note that oxygen adding treatment performed on the oxide 230 can promote a reaction in which oxygen vacancies in the oxide 230 are repaired with supplied oxygen, i.e., a reaction of "$V_O+O \rightarrow null$". Furthermore, hydrogen remaining in the oxide 230 reacts with supplied oxygen, so that the hydrogen can be removed as $H_2O$ (dehydration). This can inhibit recombination of hydrogen remaining in the oxide 230 with oxygen vacancies and formation of $V_OH$.

Note that the insulator 222 and the insulator 224 may have a stacked-layer structure of two or more layers. In such cases, without limitation to a stacked-layer structure formed of the same material, a stacked-layer structure formed of different materials may be employed.

The conductor 242 (the conductor 242a and the conductor 242b) is provided over the oxide 230b. Each of the conductor 242a and the conductor 242b functions as a source electrode or a drain electrode of the transistor 200.

For the conductor 242 (the conductor 242a and the conductor 242b), for example, a nitride containing tantalum, a nitride containing titanium, a nitride containing molybdenum, a nitride containing tungsten, a nitride containing tantalum and aluminum, a nitride containing titanium and aluminum, or the like is preferably used. In one embodiment of the present invention, a nitride containing tantalum is particularly preferable. As another example, ruthenium oxide, ruthenium nitride, an oxide containing strontium and ruthenium, or an oxide containing lanthanum and nickel may be used. These materials are preferable because they are conductive materials that are not easily oxidized or materials that maintain the conductivity even when absorbing oxygen.

Note that, contact between the conductor 242 and the oxide 230b may make oxygen in the oxide 230b diffuse into the conductor 242, resulting in oxidation of the conductor 242. It is highly possible that oxidation of the conductor 242 lowers the conductivity of the conductor 242. Note that diffusion of oxygen in the oxide 230b into the conductor 242 can be rephrased as absorption of oxygen in the oxide 230b by the conductor 242.

When oxygen in the oxide 230b is diffused into the conductor 242a and the conductor 242b, a layer is sometimes formed between the conductor 242a and the oxide 230b, and between the conductor 242b and the oxide 230b. The layer contains more oxygen than the conductor 242a or the conductor 242b does, and thus the layer is assumed to have an insulating property. In this case, a three-layer structure of the conductor 242a or the conductor 242b, the layer, and the oxide 230b can be regarded as a three-layer structure of a metal, an insulator, and a semiconductor and can be regarded as an MIS (Metal-Insulator-Semiconductor) structure or a diode junction structure having an MIS structure as its main part.

In contrast, when oxygen in the oxide 230b is excessively absorbed by the conductor 242a or the conductor 242b, the resistance of the conductor 242a or the conductor 242b increases, whereby the electrical characteristics of the transistor are degraded and the on-state current might especially be reduced. In that case, as a layer having a function of inhibiting the passage of oxygen, the oxide 243 (the oxide 243a and the oxide 243b) may be provided between the oxide 230b and the conductor 242a or the conductor 242b.

A material that can be used for the oxide 230a is preferably used for the oxide 243. The concentration of the element M in the oxide 243 is preferably higher than that in the oxide 230b. Furthermore, gallium oxide may be used as the oxide 243. A metal oxide such as an In-M-Zn oxide may be used as the oxide 243. Specifically, the atomic ratio of the element M to In in the metal oxide used as the oxide 243 is preferably greater than the atomic ratio of the element M to In in the metal oxide used as the oxide 230b.

When the oxide 243 is provided, the oxidization of the conductor 242 can be inhibited or relieved. Thus, the reduction in conductivity of the conductor 242 can be inhibited, whereby a semiconductor device with favorable electrical characteristics can be achieved.

In contrast, when the oxide 243 has high resistance, the oxide 243 may be formed to be extremely thin. The thickness of the oxide 243 is preferably greater than or equal to 0.5 nm and less than or equal to 5 nm, further preferably greater than or equal to 1 nm and less than or equal to 3 nm, still further preferably greater than or equal to 1 nm and less than or equal to 2 nm. The oxide 243 preferably has crystallinity. In the case where the oxide 243 has crystallinity, release of oxygen from the oxide 230 can be favorably inhibited. When the oxide 243 has a hexagonal crystal structure, for example, release of oxygen from the oxide 230 can sometimes be inhibited.

Note that the oxide 243 is not necessarily provided.

Note that hydrogen contained in the oxide 230b, the oxide 243, or the like is diffused into the conductor 242a or the conductor 242b in some cases. In particular, when a nitride containing tantalum is used for the conductor 242a and the conductor 242b, hydrogen contained in the oxide 230b, the oxide 243, or the like is likely to be diffused into the conductor 242a or the conductor 242b, and the diffused hydrogen is bonded to nitrogen contained in the conductor 242a or the conductor 242b in some cases. That is, hydrogen contained in the oxide 230b, the oxide 243, or the like is absorbed by the conductor 242a or the conductor 242b in some cases.

The insulator 245 (the insulator 245a and the insulator 245b) is provided over the conductor 242. The insulator 245 preferably functions as a barrier layer. The insulator 245 preferably functions as a hard mask over the conductor 242 in the manufacturing process of the transistor 200. With such a structure, oxidation of the top surface of the conductor 242 is inhibited, whereby an increase in the contact resistance between the top surface of the conductor 242 and the conductor 240 formed in a later process can be inhibited. Consequently, the transistor 200 can have favorable electrical characteristics and reliability. It is preferable to use an insulating material having a function of inhibiting diffusion of oxygen (e.g., at least one of oxygen atoms, oxygen molecules, and the like) (an insulating material through which the above oxygen is less likely to pass) such as aluminum oxide for the insulator 245.

A curved surface is included between a top surface of the insulator 245 and a side surface of the insulator 245 and between the top surface of the insulator 245 and a side surface of the conductor 242 in some cases. That is, an end portion of the side surface and an end portion of the top surface might be curved. The radius of curvature of the curved surface at end portions of the insulator 245 and the conductor 242 is greater than or equal to 3 nm and less than or equal to 10 nm, preferably greater than or equal to 5 nm and less than or equal to 6 nm, for example. When the end portions are not angular, coverage with films in later deposition steps is improved.

The insulator 272 is provided in contact with a side surface of the conductor 242, and the insulator 273 is provided over the insulator 272. The insulator 272 and the insulator 273 preferably function as a barrier layer. With this structure, absorption of excess oxygen contained in the insulator 280 by the conductor 242 can be inhibited. Furthermore, by inhibiting oxidation of the conductor 242, an increase in the contact resistance between the transistor 200 and a wiring can be inhibited. Consequently, the transistor 200 can have favorable electrical characteristics and reliability.

Thus, the insulator 272 and the insulator 273 preferably have a function of inhibiting diffusion of oxygen. For example, the insulator 272 and the insulator 273 preferably have a function of further inhibiting diffusion of oxygen as compared to the insulator 280. An insulator containing an oxide of one or both of aluminum and hafnium is preferably deposited as the insulator 272 and the insulator 273, for example. An insulator containing aluminum oxide is used as the insulator 272 and the insulator 273, for example.

It is preferable that oxygen be supplied to the insulator 224 at the time of forming the insulator 272. In the case where the insulator 272 is formed by a sputtering method, oxygen or a gas containing oxygen is preferably used as the deposition gas. In the case where the insulator 272 is formed by an ALD method, oxygen or a material containing oxygen such as ozone and water is preferably used as an oxidizer. Since the insulator 224 is sealed by the insulator 272 and the insulator 273, oxygen supplied to the insulator 224 is inhibited from being diffused to the outside, and the oxygen can be supplied efficiently to the oxide 230 through the oxide 271. Hydrogen in the insulator 224 may be absorbed by the insulator 272 or the insulator 273, which is preferable.

The insulator 231 functioning as an oxygen blocking film is provided over the oxide 230b and is provided in contact with the side surfaces of the oxide 243, the conductor 242, the insulator 245, the insulator 272, the insulator 273, and the insulator 280 as illustrated in FIG. 1B. The insulator 231 is in contact with the insulator 224 and is provided to cover the oxide 271 and the oxide 230 as illustrated in FIG. 1C.

The insulator 250 is provided over the insulator 231. The insulator 250 functions as a gate insulator. The insulator 250 is preferably positioned in contact with the top surface of the insulator 231. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like can be used. In particular, silicon oxide and silicon oxynitride, which have thermal stability, are preferable.

Furthermore, as in the insulator 224, the concentration of impurities such as water and hydrogen in the insulator 250 is preferably reduced. The thickness of the insulator 250 is preferably greater than or equal to 1 nm and less than or equal to 20 nm.

Although the insulator 250 is illustrated as a single layer in FIG. 1B and FIG. 1C, a stacked-layer structure of two or more layers may be employed. In the case where the insulator 250 has a stacked-layer structure of two layers, an upper layer of the insulator 250 is preferably formed using an insulator having a high function of inhibiting diffusion of oxygen compared to a lower layer of the insulator 250. With such a structure, oxygen contained in a lower layer of the insulator 250 can be inhibited from being diffused into the conductor 260. That is, oxidation of the conductor 260 due to oxygen contained in a lower layer of the insulator 250 can be inhibited. For example, the lower layer of the insulator 250 can be formed using the above-described material that can be used for the insulator 250, and the upper layer of the insulator 250 can be formed using a material similar to that for the insulator 222.

In the case where silicon oxide, silicon oxynitride, or the like is used for the lower layer of the insulator 250, the upper layer of the insulator 250 may be formed using an insulating material that is a high-k material having a high relative permittivity. The gate insulator having a stacked-layer structure of the lower layer of the insulator 250 and the upper layer of the insulator 250 can be thermally stable and can have a high relative permittivity. Thus, a gate potential that is applied during operation of the transistor can be reduced while the physical thickness of the gate insulator is maintained. Furthermore, the equivalent oxide thickness (EOT) of the insulator functioning as the gate insulator can be reduced.

Specifically, as the upper layer of the insulator 250, a metal oxide containing one kind or two or more kinds selected from hafnium, aluminum, gallium, yttrium, zirconium, tungsten, titanium, tantalum, nickel, germanium, magnesium, or a metal oxide that can be used as the oxide 230 can be used. In particular, an insulator containing an oxide of one or both of aluminum and hafnium is preferably used.

Here, when the insulator 231 functions as the gate insulator, the insulator 250 is not necessarily provided. In this case, the insulator 231 can function as both the oxygen blocking film and the gate insulator; this is preferable since the manufacturing process can be simplified.

Furthermore, a metal oxide may be provided between the insulator 250 and the conductor 260. The metal oxide preferably inhibits diffusion of oxygen from the insulator 250 into the conductor 260. Providing the metal oxide that inhibits diffusion of oxygen inhibits diffusion of oxygen from the insulator 250 into the conductor 260. That is, oxidation of the conductor 260 due to oxygen in the insulator 250 can be inhibited.

Note that, the metal oxide preferably has a function of part of the first gate electrode. For example, a metal oxide that can be used as the oxide 230 can be used as the metal oxide. In that case, when the conductor 260a is deposited by a sputtering method, the metal oxide can have a reduced electric resistance value to be a conductor. This can be referred to as an OC (Oxide Conductor) electrode.

With the metal oxide, the on-state current of the transistor 200 can be increased without a reduction in the influence of the electric field from the conductor 260. Since a distance between the conductor 260 and the oxide 230 is kept by the physical thicknesses of the insulator 250 and the metal oxide, leakage current between the conductor 260 and the oxide 230 can be inhibited. Moreover, when the stacked-layer structure of the insulator 250 and the metal oxide is provided, the physical distance between the conductor 260 and the oxide 230 and the intensity of electric field applied to the oxide 230 from the conductor 260 can be easily adjusted as appropriate.

The conductor 260 functions as a first gate electrode of the transistor 200. The conductor 260 preferably includes the conductor 260a and the conductor 260b positioned over the conductor 260a. For example, the conductor 260a is preferably positioned to cover a bottom surface and a side surface of the conductor 260b. Moreover, as illustrated in FIG. 1B and FIG. 1C, a top surface of the conductor 260 is substantially aligned with a top surface of the insulator 250 and the top surface of the insulator 231. Although the conductor 260 has a two-layer structure of the conductor 260a and the conductor 260b in FIG. 1B and FIG. 1C, the conductor 260 may have a single-layer structure or a stacked-layer structure of three or more layers.

For the conductor 260a, a conductive material having a function of inhibiting diffusion of impurities such as a hydrogen atom, a hydrogen molecule, a water molecule, a nitrogen atom, a nitrogen molecule, a nitrogen oxide molecule, and a copper atom is preferably used. Alternatively, it is preferable to use a conductive material having a function of inhibiting diffusion of oxygen (e.g., at least one of an oxygen atom, an oxygen molecule, and the like).

In addition, when the conductor 260a has a function of inhibiting diffusion of oxygen, the conductivity of the conductor 260b can be inhibited from being lowered because of oxidation due to oxygen contained in the insulator 250. As a conductive material having a function of inhibiting diffusion of oxygen, for example, tantalum, tantalum nitride, ruthenium, or ruthenium oxide is preferably used.

The conductor 260 also functions as a wiring and thus is preferably formed using a conductor having high conductivity. For example, a conductive material containing tungsten, copper, or aluminum as its main component can be used for the conductor 260b. The conductor 260b may have a stacked-layer structure; for example, a stacked-layer structure of titanium or titanium nitride and the above conductive material may be employed.

In the transistor 200, the conductor 260 is formed in a self-aligned manner to fill the opening formed in the insulator 280 and the like. The formation of the conductor 260 in this manner allows the conductor 260 to be positioned certainly in a region between the conductor 242a and the conductor 242b without alignment.

As illustrated in FIG. 1C, in the channel width direction of the transistor 200, with reference to the bottom surface of the insulator 222, the level of the bottom surface of the conductor 260 in a region where the conductor 260 and the oxide 230b do not overlap with each other is preferably lower than the level of the bottom surface of the oxide 230b. When the conductor 260 functioning as the gate electrode covers a side surface and a top surface of the channel formation region of the oxide 230b with the insulator 250 and the like therebetween, the electric field of the conductor 260 is likely to act on the entire channel formation region of the oxide 230b. Thus, the on-state current of the transistor 200 can be increased and the frequency characteristics of the transistor 200 can be improved. When a bottom surface of the insulator 222 is a reference, the difference between the level of the bottom surface of the conductor 260 in a region where the oxide 230a and the oxide 230b and the conductor 260 do not overlap with each other and the level of the bottom surface of the oxide 230b is greater than or equal to 0 nm and less than or equal to 100 nm, preferably greater than or equal to 3 nm and less than or equal to 50 nm, further preferably greater than or equal to 5 nm and less than or equal to 20 nm.

The insulator 280 is provided over the insulator 273. In addition, a top surface of the insulator 280 may be planarized.

The insulator 280 functioning as an interlayer film preferably has a low permittivity. When a material with a low permittivity is used for the interlayer film, the parasitic capacitance generated between wirings can be reduced. The insulator 280 is preferably provided using a material similar to that for the insulator 216, for example. In particular, silicon oxide and silicon oxynitride, which have thermal stability, are preferable. Materials such as silicon oxide, silicon oxynitride, and porous silicon oxide are particularly preferable because a region containing oxygen released by heating can be easily formed.

The concentration of impurities such as water and hydrogen in the insulator 280 is preferably reduced. Moreover, the insulator 280 preferably has a low hydrogen concentration and includes an excess-oxygen region or excess oxygen, and may be provided using a material similar to that for the insulator 216, for example. The insulator 280 may have a stacked-layer structure of the above materials; for example, a stacked-layer structure of silicon oxide deposited by a sputtering method and silicon oxynitride deposited by a chemical vapor deposition (CVD) method to be stacked thereover can be employed. Furthermore, silicon nitride may be stacked thereover.

The insulator 282, the insulator 283, or the insulator 284 preferably functions as a barrier insulating film that inhibits impurities such as water and hydrogen from diffusing into the insulator 280 from above. The insulator 282, the insulator 283, or the insulator 284 preferably functions as a barrier insulating film that inhibits the passage of oxygen. As the insulator 282, the insulator 283, and the insulator 284, for example, an insulator such as aluminum oxide, silicon nitride, or silicon nitride oxide may be used. The insulator 282 may be formed using aluminum oxide, which has high blocking property against oxygen, and the insulator 283 and the insulator 284 may be formed using silicon nitride, which has high blocking property against hydrogen, for example. For the insulator 284, silicon oxide or silicon oxynitride can be used.

For the conductor 240a and the conductor 240b, a conductive material containing tungsten, copper, or aluminum as its main component is preferably used. The conductor 240a and the conductor 240b may each have a stacked-layer structure.

In the case where the conductor 240 has a stacked-layer structure, a conductive material having a function of inhibiting transmission of impurities such as water or hydrogen is preferably used for a conductor in contact with the insulator 284, the insulator 283, the insulator 282, the insulator 280, the insulator 273, and the insulator 272. For example, tantalum, tantalum nitride, titanium, titanium nitride, ruthenium, ruthenium oxide, or the like is preferably used. The conductive material having a function of inhibiting passage of impurities such as water and hydrogen may be used as a single layer or stacked layers. The use of the conductive material can prevent oxygen added to the insulator 280 from being absorbed by the conductor 240a and the conductor 240b. Moreover, impurities such as water and hydrogen contained in a layer above the insulator 284 can be inhibited from entering the oxide 230 through the conductor 240a and the conductor 240b.

For the insulator 241a and the insulator 241b, for example, an insulator such as silicon nitride, aluminum oxide, or silicon nitride oxide may be used. Since the insulator 241a and the insulator 241b are provided in contact with the insulator 273 and the insulator 272, impurities such as water or hydrogen contained in the insulator 280 or the like can be inhibited from entering the oxide 230 through the conductor 240a and the conductor 240b. In particular, silicon nitride is suitable because of having a high blocking property against hydrogen. In contrast, since aluminum oxide has a high blocking property against oxygen, oxygen contained in the insulator 280 can be prevented from being absorbed by the conductor 240a and the conductor 240b. A material used for the insulator 241a and the insulator 241b can be selected as appropriate according to the required performance of the device.

The conductor 246 (the conductor 246a and the conductor 246b) functioning as a wiring may be provided in contact with a top surface of the conductor 240a and a top surface of the conductor 240b. The conductor 246 is preferably formed using a conductive material containing tungsten, copper, or aluminum as its main component. Furthermore, the conductor may have a stacked-layer structure and may be a stack of titanium or titanium nitride and any of the above conductive materials, for example. Note that the conductor may be formed to be embedded in an opening provided in an insulator.

The insulator 286 is provided over the conductor 246 and the insulator 284. Accordingly, the top surface of the conductor 246 and the side surface of the conductor 246 are in contact with the insulator 286 and the bottom surface of the conductor 246 is in contact with the insulator 284. In other words, the conductor 246 can have a structure in which the conductor 246 is surrounded by the insulator 284 and the insulator 286. With such a structure, the passage of oxygen from the outside can be inhibited and the oxidation of the conductor 246 can be prevented. Furthermore, impurities such as water and hydrogen can be prevented from diffusing from the conductor 246 to the outside, which is preferable.

<Constituent Material of Semiconductor Device>

Constituent materials that can be used for the semiconductor device will be described below.

<<Substrate>>

As a substrate where the transistor 200 is formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate using silicon, germanium, or the like as a material and a compound semiconductor substrate including silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

<<Insulator>>

Examples of an insulator include an insulating oxide, an insulating nitride, an insulating oxynitride, an insulating nitride oxide, an insulating metal oxide, an insulating metal oxynitride, and an insulating metal nitride oxide.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low permittivity is used for the insulator functioning as an interlayer film, parasitic capacitance generated between wirings can be reduced. Thus, a material is preferably selected depending on the function of an insulator.

Examples of the insulator with a high relative permittivity include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator with a low relative permittivity include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using a metal oxide is surrounded by an insulator having a function of inhibiting passage of oxygen and impurities such as hydrogen, the electrical characteristics of the transistor can be stable. As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; or a metal nitride such as aluminum nitride, silicon nitride oxide, or silicon nitride can be used.

The insulator functioning as the second gate insulator is preferably an insulator including a region containing oxygen released by heating. For example, when silicon oxide or silicon oxynitride including a region containing oxygen released by heating is used for the insulator, oxygen can be supplied to the oxide 230 through the oxide 271, whereby oxygen vacancies included in the oxide 230 can be compensated.

<<Conductor>>

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. A semiconductor having high electrical conductivity, typified by polycrystalline silicon containing an impurity element such as phosphorus, or silicide such as nickel silicide may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

Note that when an oxide is used for the channel formation region of the transistor, a stacked-layer structure combining a material containing the above metal element and a conductive material containing oxygen is preferably used for the conductor functioning as the gate electrode. In that case, the conductive material containing oxygen is preferably provided on the channel formation region side. When the conductive material containing oxygen is provided on the channel formation region side, oxygen released from the conductive material is easily supplied to the channel formation region.

It is particularly preferable to use, for the conductor functioning as the gate electrode, a conductive material containing oxygen and a metal element contained in a metal oxide where the channel is formed. Alternatively, a conductive material containing the above metal element and nitrogen may be used. For example, a conductive material containing nitrogen, such as titanium nitride or tantalum nitride, may be used. Alternatively, indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Furthermore, indium gallium zinc oxide containing nitrogen may be used. With the use of such a material, hydrogen contained in the metal oxide where the channel is formed can be trapped in some cases. Alternatively, hydrogen entering from an external insulator or the like can be trapped in some cases.

<<Metal Oxide>>

The oxide 230 is preferably formed using a metal oxide functioning as a semiconductor (an oxide semiconductor). A metal oxide that can be used as the oxide 230 of the present invention will be described below. The metal oxide described below can also be used for the oxide 271.

The metal oxide preferably contains at least indium or zinc. In particular, indium and zinc are preferably contained. Furthermore, aluminum, gallium, yttrium, tin, or the like is preferably contained in addition to them. Furthermore, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, the element M, and zinc is considered. Note that the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) are classified into a single crystal oxide semiconductor and a non-single-crystal oxide semiconductor. Oxide semiconductors (metal oxides) can be classified into a single crystal oxide semiconductor and a non-single-crystal oxide semiconductor. Examples of a non-single-crystal oxide semiconductor include a CAAC-OS, a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary is difficult to observe in the CAAC-OS; thus, it can be said that a reduction in electron mobility due to the crystal grain boundary is unlikely to occur. Entry of impurities, formation of defects, or the like might decrease the crystallinity of a metal oxide, which means that the CAAC-OS is a metal oxide having small amounts of impurities and defects (e.g., oxygen vacancies). Thus, a metal oxide including a CAAC-OS is physically stable. Therefore, the metal oxide including a CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

Note that an In—Ga—Zn oxide (hereinafter, IGZO) that is a kind of metal oxide containing indium, gallium, and zinc has a stable structure in some cases by being formed of the above-described nanocrystals. In particular, crystals of IGZO tend not to grow in the air and thus, a stable structure is obtained when IGZO is formed of smaller crystals (e.g., the above-described nanocrystals) rather than larger crystals (here, crystals with a size of several millimeters or several centimeters).

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures that show different properties. Two or more of the amorphous oxide semiconductor, the polycrystalline oxide semiconductor, the a-like OS, the nc-OS, and the CAAC-OS may be included in an oxide semiconductor of one embodiment of the present invention.

As an oxide semiconductor other than the above, a CAC (Cloud-Aligned Composite)-OS may be used.

A CAC-OS has a conducting function in part of the material and has an insulating function in another part of the material; as a whole, the CAC-OS has a function of a semiconductor. Note that in the case where the CAC-OS is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS. In the CAC-OS, separation of the functions can maximize each function.

In addition, the CAC-OS includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS is composed of components having different band gaps. For example, the CAC-OS is composed of a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS is used in a channel formation region of a transistor, the transistor in the on state can achieve high current driving capability, that is, high on-state current and high field-effect mobility.

In other words, the CAC-OS can also be referred to as a matrix composite or a metal matrix composite.

Oxide semiconductors might be classified in a manner different from the above-described one when classified in terms of the crystal structure. The classification of the crystal structures of an oxide semiconductor will be explained with FIG. 3A. FIG. 3A is a diagram showing the classification of crystal structures of an oxide semiconductor, typically IGZO (a metal oxide containing In, Ga, and Zn).

As shown in FIG. 3A, IGZO is roughly classified into Amorphous, Crystalline, and Crystal. Amorphous includes completely amorphous structure. Crystalline includes CAAC, nc, and CAC. Crystal includes single crystal and poly crystal.

Note that the structure shown in the thick frame in FIG. 3A is a structure that belongs to new crystalline phase. This structure is positioned in a boundary region between Amorphous and Crystal. In other words, Amorphous, which is energetically unstable, and Crystalline are completely different structures.

A crystal structure of a film or a substrate can be analyzed with X-ray diffraction (XRD) images. Here, XRD spectra of quartz glass and IGZO, which has a crystal structure classified into Crystalline (also referred to as crystalline IGZO), are shown in FIG. 3B and FIG. 3C. FIG. 3B shows an XRD spectrum of quartz glass and FIG. 3C shows an XRD spectrum of crystalline IGZO. Note that the crystalline IGZO shown in FIG. 3C has a composition In:Ga:Zn=4:2:3 [atomic ratio]. Furthermore, the crystalline IGZO shown in FIG. 3C has a thickness of 500 nm.

As indicated by arrows in FIG. 3B, the XRD spectrum of the quartz glass shows a substantially symmetrical peak. In contrast, as indicated by arrows in FIG. 3C, the XRD spectrum of the crystalline IGZO shows an asymmetrical peak. The asymmetrical peak of the XRD spectrum clearly shows the existence of crystal. In other words, the structure cannot be regarded as Amorphous unless it has a bilaterally symmetrical peak in the XRD spectrum.

[Impurities]

Here, the influence of each impurity in the metal oxide will be described.

Entry of the impurities into the oxide semiconductor forms defect states or oxygen vacancies in some cases. Thus, when impurities enter a channel formation region of the oxide semiconductor, the electrical characteristics of a transistor using the oxide semiconductor are likely to vary and its reliability is degraded in some cases. When the channel formation region includes oxygen vacancies, the transistor tends to have normally-on characteristics (the channel is generated even when no voltage is applied to the gate electrode and current flows through the transistor).

In a transistor using a metal oxide, the electrical characteristics vary due to the impurities and oxygen vacancies in the metal oxide, whereby the transistor tends to have normally-on characteristics. In the case where the transistor is driven in a state where excess oxygen exceeding the proper amount is included in the metal oxide, the valence of the excess oxygen atoms is changed and the electrical characteristics of the transistor vary, so that reliability is decreased in some cases.

Thus, a metal oxide having a low carrier concentration is preferably used for the channel formation region of the transistor. In order to reduce the carrier concentration of the metal oxide, the concentration of impurities in the metal oxide is reduced so that the density of defect states can be reduced. In this specification and the like, a state with a low impurity concentration and a low density of defect states is referred to as a highly purified intrinsic or substantially highly purified intrinsic state. Note that in this specification and the like, the case where the carrier concentration of the metal oxide in the channel formation region is lower than or equal to $1 \times 10^{16}$ cm$^{-3}$ is defined as a substantially highly purified intrinsic state.

The carrier concentration of the metal oxide in the channel formation region is preferably lower than or equal to $1 \times 10^{18}$ cm$^{-3}$, further preferably lower than or equal to $1 \times 10^{17}$ cm$^{-3}$, still further preferably lower than or equal to $1 \times 10^{16}$ cm$^{-3}$, yet further preferably lower than $1 \times 10^{13}$ cm$^{-3}$, and yet still further preferably lower than $1 \times 10^{12}$ cm$^{-3}$. Note that the lower limit of the carrier concentration of the metal oxide in the channel formation region is not particularly limited and can be, for example, $1 \times 10^{-9}$ cm$^{-3}$.

Examples of impurities in a metal oxide include hydrogen, nitrogen, alkali metal, alkaline earth metal, iron, nickel, and silicon. In particular, hydrogen contained in a metal oxide reacts with oxygen bonded to a metal atom to be water, and thus forms oxygen vacancies in the metal oxide in some cases. If the channel formation region in the metal oxide includes oxygen vacancies, the transistor sometimes has normally-on characteristics. Moreover, in the case where hydrogen enters an oxygen vacancy in the metal oxide, the oxygen vacancy and the hydrogen are bonded to each other to form $V_O H$ in some cases. In some cases, a defect in which hydrogen has entered an oxygen vacancy ($V_O H$) functions as a donor and generates an electron serving as a carrier. In other cases, bonding of part of hydrogen to oxygen bonded to a metal atom generates electrons serving as carriers. Thus, a transistor using a metal oxide containing a large amount of hydrogen is likely to have normally-on characteristics. Moreover, hydrogen in a metal oxide easily moves by stress such as heat and an electric field; thus, the reliability of a transistor may be low when the metal oxide contains a plenty of hydrogen.

In one embodiment of the present invention, $V_O H$ in the oxide 230 is preferably reduced as much as possible so that the oxide 230 becomes a highly purified intrinsic or substantially highly purified intrinsic oxide. It is important to remove impurities such as moisture and hydrogen in a metal oxide (sometimes described as dehydration or dehydrogenation treatment) and to compensate for oxygen vacancies by supplying oxygen to the metal oxide (sometimes described as oxygen supplying treatment) to obtain a metal oxide whose $V_OH$ is reduced enough. When a metal oxide in which impurities such as $V_OH$ are sufficiently reduced is used for a channel formation region of a transistor, stable electrical characteristics can be given.

A defect in which hydrogen has entered an oxygen vacancy ($V_OH$) can function as a donor in the metal oxide. However, it is difficult to evaluate the defects quantitatively. Thus, the metal oxide is sometimes evaluated by not its donor concentration but its carrier concentration. Therefore, in this specification and the like, the carrier concentration assuming the state where an electric field is not applied is sometimes used, instead of the donor concentration, as the parameter of the metal oxide. That is, "carrier concentration" in this specification and the like can be replaced with "donor concentration" in some cases. In addition, "carrier concentration" in this specification and the like can be replaced with "carrier density".

Therefore, hydrogen in the metal oxide is preferably reduced as much as possible. Specifically, the hydrogen concentration of the metal oxide, which is measured by secondary ion mass spectrometry (SIMS), is lower than $1 \times 10^{20}$ atoms/cm$^3$, preferably lower than $1 \times 10^{19}$ atoms/cm$^3$, further preferably lower than $5 \times 10^{18}$ atoms/cm$^3$, still further preferably lower than $1 \times 10^{18}$ atoms/cm$^3$. When a metal oxide with a sufficiently low concentration of impurities such as hydrogen is used for a channel formation region of a transistor, the transistor can have stable electrical characteristics.

The above defect states might include a trap state. Electric charge trapped by the trap states in the metal oxide takes a long time to be released and may behave like fixed electric charge. Thus, a transistor whose channel formation region includes a metal oxide having a high density of trap states has unstable electrical characteristics in some cases.

If the impurities exist in the channel formation region of the oxide semiconductor, the crystallinity of the channel formation region might decrease, and the crystallinity of an oxide provided in contact with the channel formation region might decrease. Low crystallinity of the channel formation region tends to result in deterioration in stability or reliability of the transistor. Moreover, if the crystallinity of the oxide provided in contact with the channel formation region is low, an interface state might be formed and the stability or reliability of the transistor might deteriorate.

Therefore, the reduction in concentration of impurities in the channel formation region of the oxide semiconductor and the vicinity thereof is effective in improving the stability or reliability of the transistor. Examples of impurities include hydrogen, nitrogen, an alkali metal, an alkaline earth metal, iron, nickel, and silicon.

Specifically, the concentration of the above impurities obtained by SIMS is lower than or equal to $1 \times 10^{18}$ atoms/cm$^3$, preferably lower than or equal to $2 \times 10^{16}$ atoms/cm$^3$ in the channel formation region of the oxide semiconductor and the vicinity thereof. Alternatively, the concentration of the above impurities obtained by element analysis using EDX is lower than or equal to 1.0 atomic % in and around the channel formation region of the oxide semiconductor. When an oxide containing the element M is used as the oxide semiconductor, the concentration ratio of the above impurities to the element M is lower than 0.10, preferably lower than 0.05 in the channel formation region of the oxide semiconductor and the vicinity thereof. Here, the concentration of the element M used in the calculation of the concentration ratio may be a concentration in a region that is the same as the region whose concentration of the above impurities is calculated or may be a concentration in the oxide semiconductor.

A metal oxide with a low impurity concentration has a low density of defect states and thus has a low density of trap states in some cases.

In a transistor using an oxide semiconductor, when impurities and oxygen vacancies exist in a channel formation region of the oxide semiconductor, the resistance of the oxide semiconductor is reduced in some cases. In addition, the electrical characteristics easily vary, and the reliability is degraded in some cases.

For example, silicon has a bonding energy with oxygen higher than that of indium or zinc. For example, in the case where an In-M-Zn oxide is used as the oxide semiconductor, when silicon is mixed in the oxide semiconductor, oxygen contained in the oxide semiconductor is trapped by silicon, whereby oxygen vacancies are formed in the vicinity of indium or zinc in some cases.

In a transistor using an oxide semiconductor in the channel formation region, when a low-resistance region is formed in the channel formation region, leakage current (parasitic channel) between the source electrode and the drain electrode of the transistor is likely to be generated in the low-resistance region. Defects in transistor characteristics such as, becoming normally on, an increase in the leakage current, and a variation (a shift) in the threshold voltage due to stress application, of the transistor, are likely to occur due to the parasitic channel. When the processing accuracy of the transistor is low, the parasitic channel varies between transistors, whereby variation in transistor characteristics occurs.

Therefore, the impurities and oxygen vacancies are preferably reduced as much as possible in the channel formation region of the oxide semiconductor and in the vicinity thereof.

<<Other Semiconductor Materials>>

Note that a semiconductor material that can be used for the oxide 230 is not limited to the above metal oxides. A semiconductor material which has a band gap (a semiconductor material that is not a zero-gap semiconductor) can be used for the oxide 230. For example, a single element semiconductor such as silicon, a compound semiconductor such as gallium arsenide, or a layered material functioning as a semiconductor (also referred to as an atomic layered material or a two-dimensional material) is preferably used as a semiconductor material. In particular, a layered material functioning as a semiconductor is preferably used as a semiconductor material.

Here, in this specification and the like, the layered material generally refers to a group of materials having a layered crystal structure. In the layered crystal structure, layers formed by covalent bonding or ionic bonding are stacked with bonding such as the Van der Waals force, which is weaker than covalent bonding or ionic bonding. The layered material has high electrical conductivity in a monolayer, that is, high two-dimensional electrical conductivity. When a material that functions as a semiconductor and has high two-dimensional electrical conductivity is used for a channel formation region, the transistor can have a high on-state current.

Examples of the layered material include graphene, silicene, and chalcogenide. Chalcogenide is a compound containing chalcogen. Chalcogen is a general term of elements belonging to Group 16, which includes oxygen, sulfur, selenium, tellurium, polonium, and livermorium. Examples of chalcogenide include transition metal chalcogenide and chalcogenide of Group 13 elements.

For the oxide 230, a transition metal chalcogenide functioning as a semiconductor is preferably used, for example. Specific examples of the transition metal chalcogenide which can be used for the oxide 230 include molybdenum sulfide (typically $MoS_2$), molybdenum selenide (typically $MoSe_2$), molybdenum telluride (typically $MoTe_2$), tungsten sulfide (typically $WS_2$), tungsten selenide (typically $WSe_2$), tungsten telluride (typically $WTe_2$), hafnium sulfide (typically $HfS_2$), hafnium selenide (typically $HfSe_2$), zirconium sulfide (typically $ZrS_2$), zirconium selenide (typically $ZrSe_2$).

<Modification Example of Semiconductor Device>

An example of the semiconductor device of one embodiment of the present invention will be described below with reference to FIG. 4A to FIG. 4D and FIG. 5A to FIG. 5D.

Figure 4A:
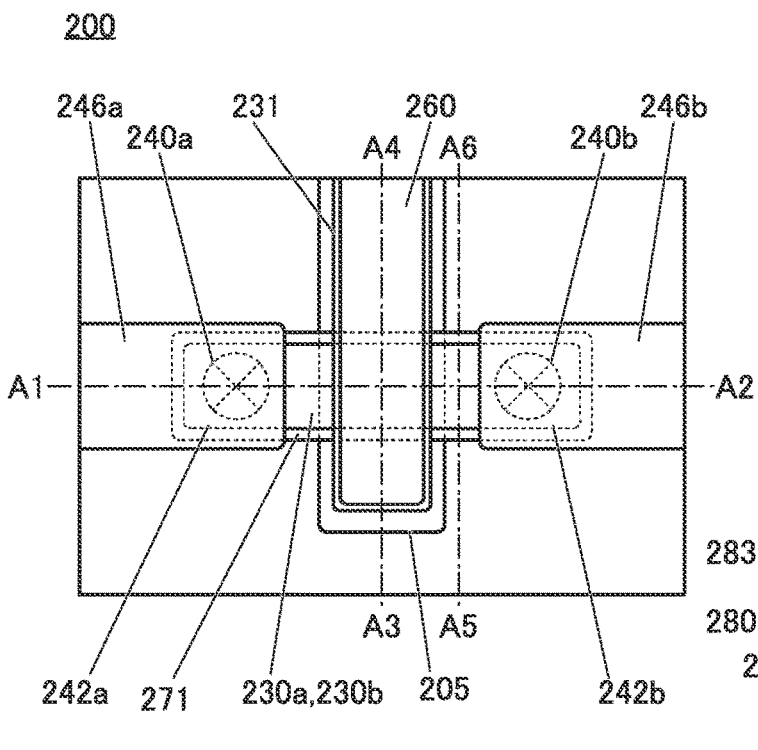
FIG. 4A is a top view of a semiconductor device of one embodiment of the present invention.
Figure 4C:
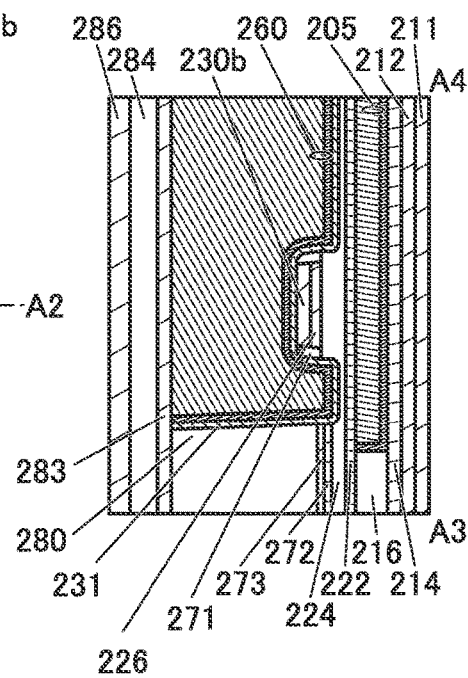
FIG. 4B to FIG. 4D are cross-sectional views of a semiconductor device of one embodiment of the present invention.
Figure 4B:
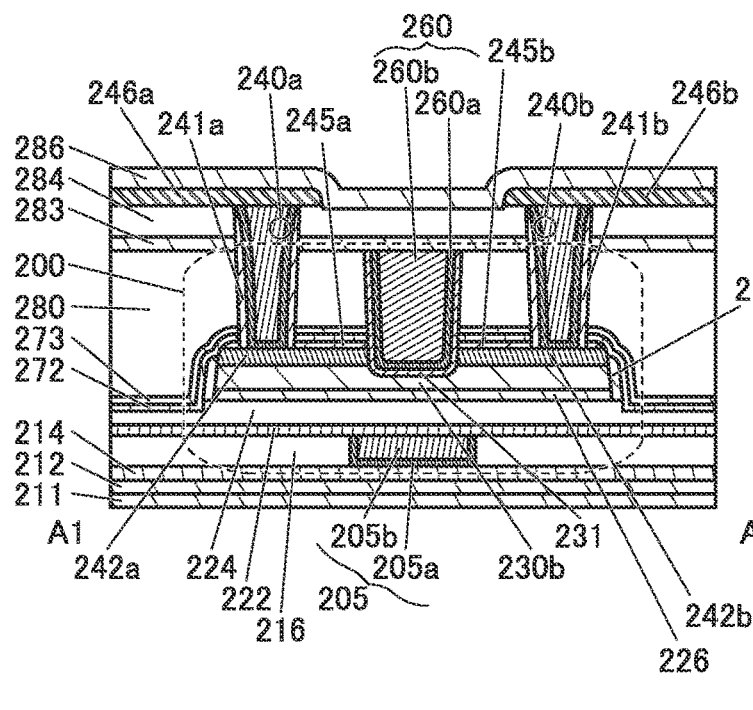
Figure 4D:
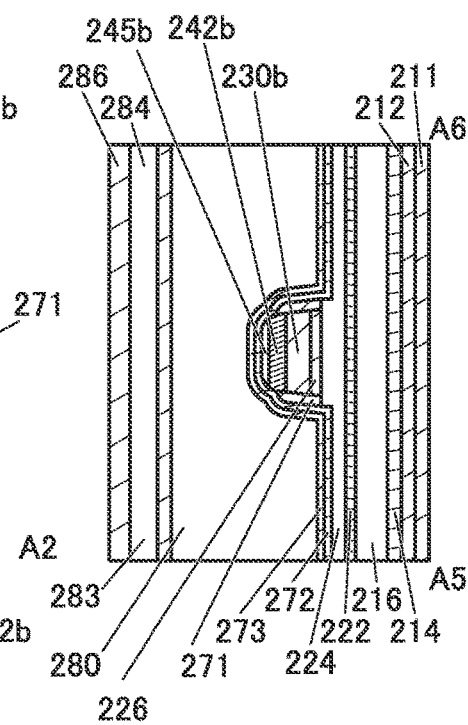
Figure 6A:
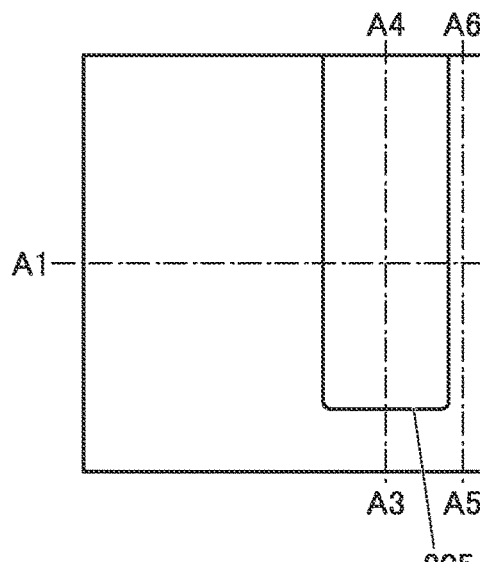
FIG. 6A is a top view illustrating a method for manufacturing a semiconductor device of one embodiment of the present invention.
Figure 6C:
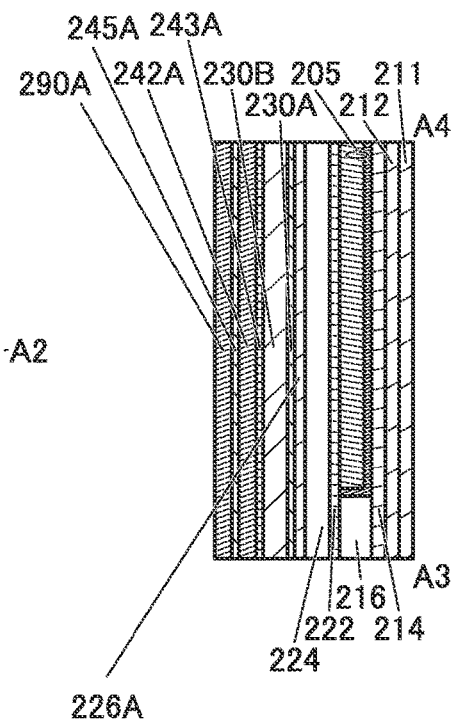
FIG. 6B to FIG. 6D are cross-sectional views illustrating a method for manufacturing a semiconductor device of one embodiment of the present invention.
Figure 6B:
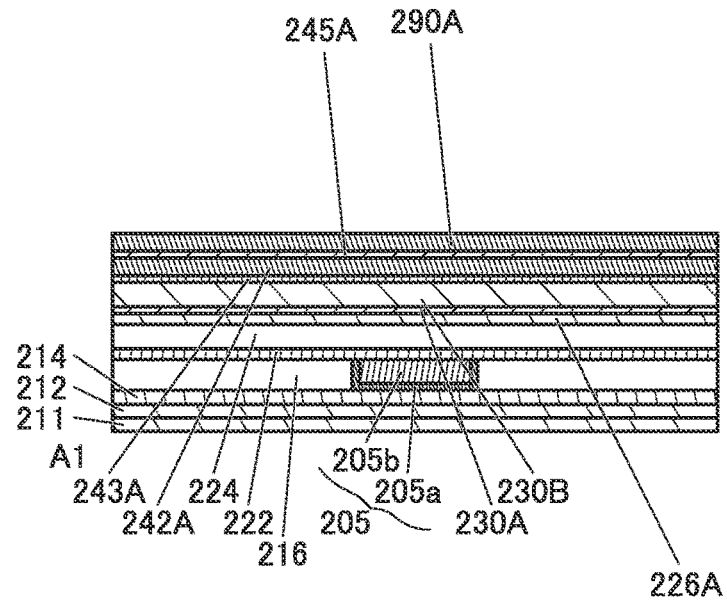
Figure 6D:
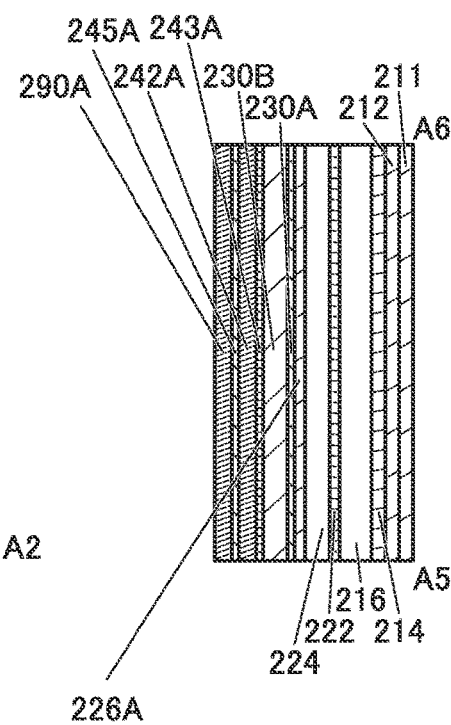
Figure 7A:
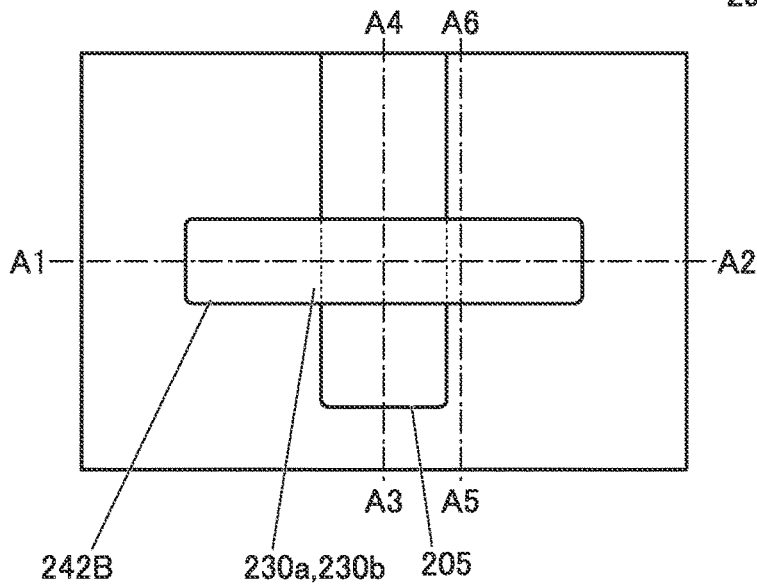
FIG. 7A is a top view illustrating a method for manufacturing a semiconductor device of one embodiment of the present invention.
Figure 7C:
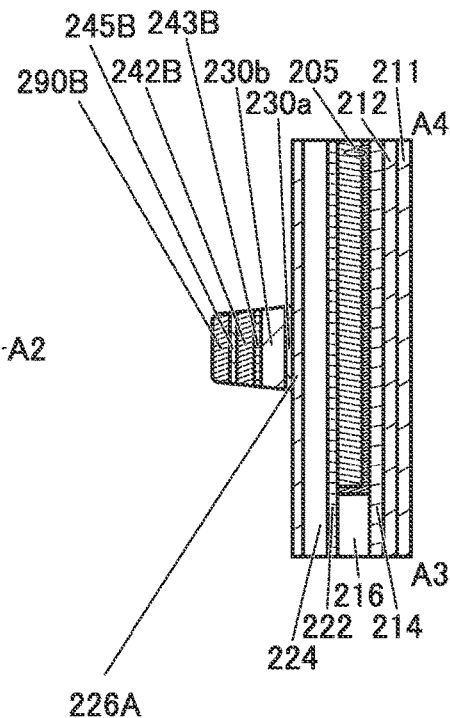
FIG. 7B to FIG. 7D are cross-sectional views illustrating a method for manufacturing a semiconductor device of one embodiment of the present invention.
Figure 7B:
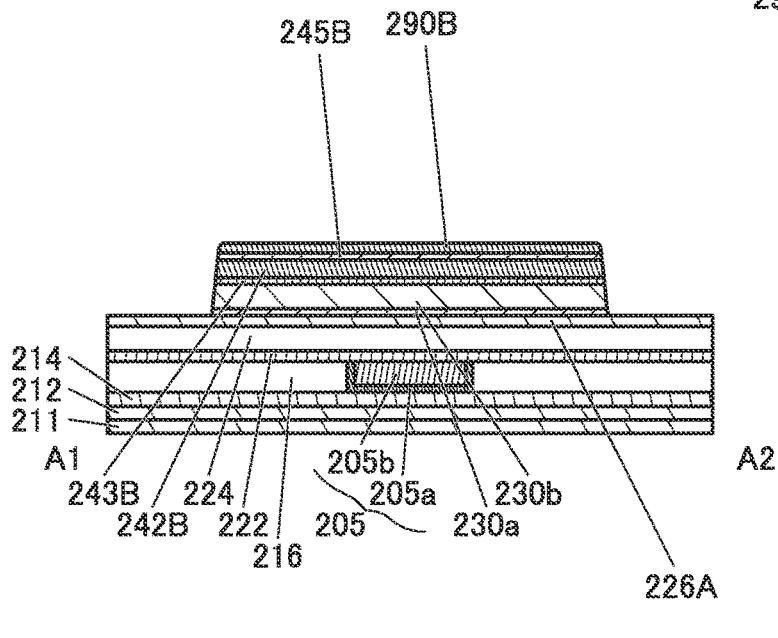
Figure 7D:
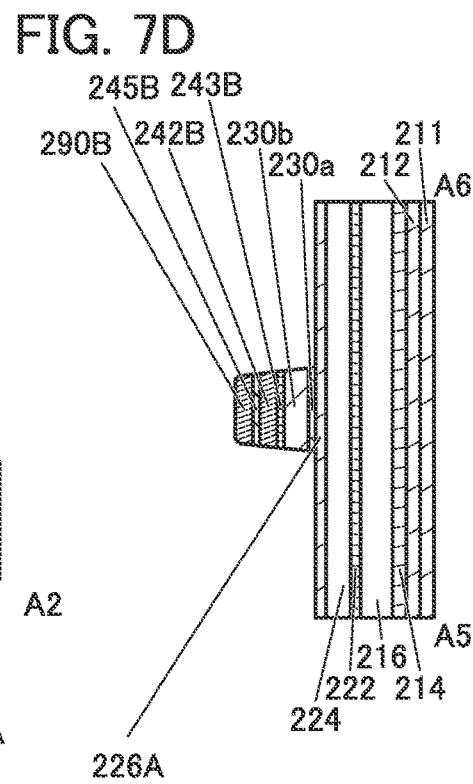

FIG. 4A and FIG. 5A illustrate top views of a semiconductor device. FIG. 4B and FIG. 5B are cross-sectional views of portions indicated by the dashed-dotted line A1-A2 in FIG. 4A and FIG. 5A, respectively. FIG. 4C and FIG. 5C are cross-sectional views of portions indicated by the dashed-dotted line A3-A4 in FIG. 4A and FIG. 5A, respectively. FIG. 4D and FIG. 5D are cross-sectional views of portions indicated by the dashed-dotted line A5-A6 in FIG. 4A and FIG. 5A, respectively. Note that for clarity of the drawing, some components are not illustrated in the top views of FIG. 4A and FIG. 5A.

Note that in the semiconductor devices illustrated in FIG. 4A to FIG. 4D and FIG. 5A to FIG. 5D, components having the same functions as the components included in the semiconductor device described in <Structure example of semiconductor device> are denoted by the same reference numerals. Note that the materials described in detail in <Structure example of semiconductor device> can also be used as constituent materials of the semiconductor devices in this section.

<<Modification Example 1 of Semiconductor Device>>

The semiconductor device illustrated in FIG. 4A to FIG. 4D is a modification example of the semiconductor device illustrated in FIG. 1A to FIG. 1D. The semiconductor device illustrated in FIG. 4A to FIG. 4D is different from the semiconductor device illustrated in FIG. 1A to FIG. 1D in that the oxide 230a, the oxide 243, the insulator 250, and the insulator 282 are not included.

When the semiconductor device does not include the oxide 230a as illustrated in FIG. 4C, the distance between the insulator 224 and the oxide 230b is reduced, and oxygen contained in the insulator 224 can be efficiently supplied to the oxide 230b through the oxide 271.

Oxygen contained in the insulator 224 is supplied to the oxide 230b through the oxide 271, therefore supply of oxygen to the oxide 230b overlapping with the conductor 242 is inhibited. Thus, excessive absorption of oxygen supplied to the oxide 230b by the conductor 242 can be inhibited. Thus, the oxide 243 is not necessarily provided. Accordingly, the number of steps can be reduced without degradation of the electrical characteristics and reliability of the semiconductor device, which is preferable.

When the insulator 231 functions as a first gate insulator, the insulator 250 is not necessarily provided. In that case, the step of forming the insulator 250 can be omitted. Furthermore, downsizing of the semiconductor device can be achieved by thinning the insulator functioning as the first gate insulator, which is preferable.

When any one of the insulator 231, the insulator 272, and the insulator 273 has a function of trapping or fixing hydrogen, the insulator 282 is not necessarily provided. In that case, the step of forming the insulator 282 can be omitted, which is preferable.

The steps of manufacturing the oxide 230a, the oxide 243, the insulator 250, and the insulator 282 are omitted as described above, whereby the number of steps of manufacturing the semiconductor device and downsizing of the semiconductor device can be achieved. Note that the number of steps of all of the oxide 230a, the oxide 243, the insulator 250, and the insulator 282 is not necessarily reduced. The effect of reducing the number of steps for manufacturing the semiconductor device can be obtained by reducing the number of steps for manufacturing at least one of the oxide 230a, the oxide 243, the insulator 250, and the insulator 282.

<<Modification Example 2 of Semiconductor Device>>

The semiconductor device illustrated in FIG. 5A to FIG. 5D is a modification example of the semiconductor device illustrated in FIG. 1A to FIG. 1D. The semiconductor device illustrated in FIG. 5A to FIG. 5D is different from the semiconductor device illustrated in FIG. 1A to FIG. 1D in that the shapes of the insulator 283 and the insulator 284 are different. It is also different in that an insulator 274 and an insulator 287 are included.

In the semiconductor device illustrated in FIG. 5A to FIG. 5D, the insulator 212, the insulator 214, the insulator 216, the insulator 222, the insulator 224, the insulator 272, the insulator 273, the insulator 280, and the insulator 282 are patterned and the insulator 287 is provided in contact with the side surfaces of the insulator 212, the insulator 214, the insulator 216, the insulator 222, the insulator 224, the insulator 272, the insulator 273, the insulator 280, and the insulator 282. The insulator 283 and the insulator 284 cover the insulator 212, the insulator 214, the insulator 216, the insulator 222, the insulator 224, the insulator 272, the insulator 273, the insulator 280, the insulator 282, and the insulator 287. That is, the insulator 283 is in contact with the top surface of the insulator 282, the top surface and a side surface of the insulator 287, and the top surface of the insulator 211, and the insulator 284 is in contact with the top surface and a side surface of the insulator 283. Accordingly, the insulator 214, the insulator 216, the insulator 222, the insulator 224, the insulator 272, the insulator 273, the insulator 280, the insulator 282 and the insulator 287 in addition to the oxide 230 and the like are isolated from the outside by the insulator 283, the insulator 284, and the insulator 211. In other words, the transistor 200 is positioned in a region sealed by the insulator 283, the insulator 284, and the insulator 211.

For example, it is preferable that the insulator 214, the insulator 287, and the insulator 282 be formed using a material having a function of trapping or fixing hydrogen, and the insulator 211, the insulator 212, the insulator 283, and the insulator 284 be formed using a material having a function of inhibiting the diffusion of hydrogen and oxygen. Typically, aluminum oxide can be used for the insulator 214, the insulator 287, and the insulator 282. Typically, silicon nitride can be used for the insulator 211, the insulator 212, the insulator 283, and the insulator 284.

With the above structure, entry of hydrogen contained in a region outside the sealed region into the sealed region can be inhibited. Hydrogen that enters the sealed region can be trapped or fixed by the insulator 214, the insulator 287, and the insulator 282.

Although the transistor 200 having a structure in which the insulator 211, the insulator 283, and the insulator 284 each has a single-layer structure is illustrated in FIG. 5A to FIG. 5D, the present invention is not limited thereto. For example, each of the insulator 211, the insulator 283, and the insulator 284 may have a stacked-layer structure of two or more layers.

The insulator 274 functions as an interlayer film. The permittivity of the insulator 274 is preferably lower than that of the insulator 214. When a material with a low permittivity is used for the interlayer film, the parasitic capacitance generated between wirings can be reduced. The insulator 274 can be provided using a material similar to that for the insulator 280, for example.

<Manufacturing Method of Semiconductor Device>

Next, a manufacturing method of the semiconductor device of one embodiment of the present invention illustrated in FIG. 1A to FIG. 1D is described with reference to FIG. 6A to FIG. 20A, FIG. 6B to FIG. 20B, FIG. 6C to FIG. 20C, and FIG. 6D to FIG. 20D.

FIG. 6A to FIG. 20A illustrate top views. FIG. 6B to FIG. 20B are cross-sectional views corresponding to portions indicated by dashed-dotted line A1-A2 in FIG. 6A to FIG. 20A, and are also cross-sectional views of the transistor 200 in the channel length direction. FIG. 6C to FIG. 20C are cross-sectional views corresponding to portions indicated by dashed-dotted line A3-A4 in FIG. 6A to FIG. 20A, and are also cross-sectional views of the transistor 200 in the channel width direction. FIG. 6D to FIG. 20D are cross-sectional views of portions indicated by dashed-dotted line A5-A6 in FIG. 6A to FIG. 20A. Note that for clarity of the drawings, some components are not illustrated in the top views of FIG. 6A to FIG. 20A.

First, a substrate (not illustrated) is prepared, and the insulator 211 is deposited over the substrate. The insulator 211 can be deposited by a sputtering method, a CVD method, a molecular beam epitaxy (MBE) method, a pulsed laser deposition (PLD) method, an ALD method, or the like.

Note that the CVD method can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. In contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

As the ALD method, a thermal ALD method, in which a precursor and a reactant react with each other only by a thermal energy, a PEALD (Plasma Enhanced ALD) method, in which a reactant excited by plasma is used, and the like can be used.

An ALD method, which enables one atomic layer to be deposited at a time using self-regulating characteristics of atoms, has advantages such as deposition of an extremely thin film, deposition on a component with a high aspect ratio, deposition of a film with a small number of defects such as pinholes, deposition with excellent coverage, and low-temperature deposition. In the PEALD (Plasma Enhanced ALD) method, the use of plasma is sometimes preferable because deposition at lower temperature is possible. Note that a precursor used in the ALD method sometimes contains impurities such as carbon. Thus, in some cases, a film provided by the ALD method contains impurities such as carbon in a larger amount than a film provided by another deposition method. Note that impurities can be quantified by X-ray photoelectron spectroscopy (XPS).

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be deposited depending on the flow rate ratio of the source gases. Moreover, by a CVD method or an ALD method, by changing the flow rate ratio of the source gases during the deposition, a film whose composition is continuously changed can be deposited. In the case where the film is deposited while changing the flow rate ratio of the source gases, as compared to the case where the film is deposited using a plurality of deposition chambers, the time taken for the deposition can be shortened because the time taken for transfer and pressure adjustment is omitted. Thus, the productivity of the semiconductor device can be increased in some cases.

In this embodiment, for the insulator 211, silicon nitride is deposited by a CVD method.

Next, the insulator 212 is deposited over the insulator 211. The insulator 212 can be deposited by a sputtering method, a CVD method, an MBE method, a PLD method, an ALD method, or the like. In this embodiment, for the insulator 212, silicon nitride is deposited by a sputtering method.

When an insulator through which copper is less likely to pass, such as silicon nitride, is used for the insulator 211 and the insulator 212 in such a manner, even in the case where a metal that is likely to diffuse copper or the like is used for a conductor in a layer (not illustrated) below the insulator 211, diffusion of the metal into an upper area through the insulator 211 and the insulator 212 can be inhibited. The use of an insulator through which impurities such as water and hydrogen are less likely to pass, such as silicon nitride, can inhibit diffusion of impurities such as water and hydrogen contained in a layer below the insulator 211.

Next, the insulator 214 is deposited over the insulator 212. The insulator 214 can be deposited by a sputtering method, a CVD method, an MBE method, a PLD method, an ALD method, or the like. In this embodiment, aluminum oxide is used for the insulator 214.

It is preferable that the hydrogen concentration of the insulator 212 be lower than that of the insulator 211, and the hydrogen concentration of the insulator 214 be lower than that of the insulator 212. When silicon nitride is deposited by a sputtering method for the insulator 212, silicon nitride having a hydrogen concentration lower than that of the insulator 211 formed by depositing silicon nitride by a CVD method can be formed. When the insulator 214 is formed using aluminum oxide, the insulator 214 can have lower hydrogen concentration than the insulator 212.

The transistor 200 is formed over the insulator 214 in a later step; it is preferable that a film adjacent to the transistor 200 have a relatively low hydrogen concentration and a film with a relatively high hydrogen concentration be positioned away from the transistor 200.

Next, the insulator 216 is deposited over the insulator 214. The insulator 216 can be deposited by a sputtering method, a CVD method, an MBE method, a PLD method, an ALD method, or the like. In this embodiment, silicon oxide or silicon oxynitride is used for the insulator 216. The insulator 216 is preferably deposited by the deposition method using the gas in which hydrogen atoms are reduced or removed. Thus, the hydrogen concentration of the insulator 216 can be reduced.

Then, an opening reaching the insulator 214 is formed in the insulator 216. A groove and a slit, for example, are included in the category of the opening. A region where an opening is formed is referred to as an opening portion in some cases. Wet etching can be used for the formation of the opening; however, dry etching is preferably used for microfabrication. As the insulator 214, it is preferable to select an insulator that functions as an etching stopper film used in forming the groove by etching the insulator 216. For example, in the case where a silicon oxide film or a silicon oxynitride film is used as the insulator 216 in which the groove is to be formed, silicon nitride, aluminum oxide, or hafnium oxide is preferably used for the insulator 214.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency voltage is applied to one of the parallel plate electrodes. Alternatively, a structure may be employed in which different high-frequency voltages are applied to one of the parallel plate electrodes. Alternatively, a structure may be employed in which high-frequency voltages with the same frequency are applied to the parallel plate electrodes. Alternatively, a structure may be employed in which high-frequency voltages with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

After the formation of the opening, a conductive film to be the conductor 205a is deposited. The conductive film preferably includes a conductor that has a function of inhibiting passage of oxygen. For example, tantalum nitride, tungsten nitride, or titanium nitride can be used. Alternatively, a stacked-layer film of the conductor having a function of inhibiting passage of oxygen and tantalum, tungsten, titanium, molybdenum, aluminum, copper, or a molybdenum-tungsten alloy can be used. The conductive film can be deposited by a sputtering method, a CVD method, an MBE method, a PLD method, an ALD method, or the like.

In this embodiment, the conductive film to be the conductor 205a has a multilayer structure. First, tantalum nitride is deposited by a sputtering method, and titanium nitride is stacked over the tantalum nitride. When such metal nitrides are used for a lower layer of the conductor 205b, even in the case where a metal that is likely to diffuse, such as copper, is used for a conductive film to be a conductor 205b described below, outward diffusion of the metal from the conductor 205a can be inhibited.

Next, a conductive film to be the conductor 205b is deposited. The conductive film can be deposited by a plating method, a sputtering method, a CVD method, an MBE method, a PLD method, an ALD method, or the like. In this embodiment, for the conductive film to be the conductor 205b, a low-resistance conductive material such as copper is deposited.

Next, CMP treatment is performed, thereby removing part of the conductive film to be the conductor 205a and part of the conductive film to be the conductor 205b to expose the insulator 216. As a result, the conductor 205a and the conductor 205b remain only in the opening portion. Thus, the conductor 205 whose top surface is flat can be formed (see FIG. 6A to FIG. 6C). Note that the insulator 216 is partly removed by the CMP treatment in some cases.

Although the conductor 205 is embedded in the opening in the insulator 216 in the above description, this embodiment is not limited to this structure. For example, the surface of the conductor 205 may be exposed in the following manner: the conductor 205 is formed over the insulator 214, the insulator 216 is formed over the conductor 205, and the insulator 216 is subjected to the CMP treatment so that the insulator 216 is partly removed.

Next, the insulator 222 is deposited over the insulator 216 and the conductor 205. An insulator containing an oxide of one or both of aluminum and hafnium is preferably deposited as the insulator 222. Note that as the insulator containing an oxide of one or both of aluminum and hafnium, aluminum oxide, hafnium oxide, an oxide containing aluminum and hafnium (hafnium aluminate), or the like is preferably used. The insulator containing an oxide of one or both of aluminum and hafnium has a barrier property against oxygen, hydrogen, and water. When the insulator 222 has a barrier property against hydrogen and water, hydrogen and water contained in components provided around the transistor 200 are inhibited from diffusing into the transistor 200 through the insulator 222, and generation of oxygen vacancies in the oxide 230 can be inhibited.

The insulator 222 can be deposited by a sputtering method, a CVD method, an MBE method, a PLD method, an ALD method, or the like.

Sequentially, heat treatment is preferably performed. The heat treatment is performed at a temperature higher than or equal to 250° C. and lower than or equal to 650° C., preferably higher than or equal to 300° C. and lower than or equal to 500° C., further preferably higher than or equal to 320° C. and lower than or equal to 450° C. Note that the heat treatment is performed in a nitrogen gas or inert gas atmosphere, or an atmosphere containing an oxidizing gas at 10 ppm or more, 1% or more, or 10% or more. The heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen.

In this embodiment, the heat treatment is performed in such a manner that treatment is performed at 400° C. in a nitrogen atmosphere for one hour after the deposition of the insulator 222, and then another treatment is successively performed at 400° C. in an oxygen atmosphere for one hour. By the heat treatment, impurities such as water and hydrogen contained in the insulator 222 can be removed, for example. The heat treatment can also be performed after the deposition of the insulator 224, for example.

Next, the insulator 224 is deposited over the insulator 222. The insulator 224 can be deposited by a sputtering method, a CVD method, an MBE method, a PLD method, an ALD method, or the like. In this embodiment, for the insulator 224, a silicon oxide film or a silicon oxynitride film is deposited by a CVD method. The insulator 224 is preferably deposited by the deposition method using a gas in which hydrogen atoms are reduced or removed. Thus, the concentration of hydrogen in the insulator 224 can be reduced. It is preferable that the hydrogen concentration of the insulator 224 be reduced in this manner in order to inhibit the diffusion of hydrogen from the insulator 224 to the oxide 230a and the oxide 230b.

Here, plasma treatment containing oxygen may be performed under reduced pressure so that an excess-oxygen region can be formed in the insulator 224. For the plasma treatment containing oxygen, an apparatus including a power source for generating high-density plasma using a microwave is preferably used, for example. Alternatively, a power source for applying an RF (Radio Frequency) to the substrate side may be included. The use of high-density plasma enables high-density oxygen radicals to be generated, and RF application to the substrate side allows the oxygen radicals generated by the high-density plasma to be efficiently introduced into the insulator 224. Alternatively, after plasma treatment containing an inert gas is performed using this apparatus, plasma treatment containing oxygen may be performed to compensate for released oxygen. Note that impurities such as water and hydrogen contained in the insulator 224 can be removed by selecting the conditions for the plasma treatment appropriately. In that case, the heat treatment does not need to be performed.

Here, after aluminum oxide is deposited over the insulator 224 by a sputtering method, for example, the aluminum oxide may be subjected to CMP treatment until the insulator 224 is reached. The CMP treatment can planarize and smooth a surface of the insulator 224. When the CMP treatment is performed on the aluminum oxide positioned over the insulator 224, it is easy to detect the endpoint of the CMP treatment. Although part of the insulator 224 is polished by the CMP treatment and the thickness of the insulator 224 is reduced in some cases, the thickness can be adjusted when the insulator 224 is deposited. Planarizing and smoothing the surface of the insulator 224 can prevent deterioration in the coverage with an oxide deposited later and a decrease in the yield of the semiconductor device in some cases. The deposition of aluminum oxide over the insulator 224 by a sputtering method is preferred because oxygen can be added to the insulator 224.

Next, an insulating film 226A is formed over the insulator 224 (see FIG. 6A to FIG. 6D). The insulating film 226A functions as an oxygen blocking film and inhibits the diffusion of oxygen contained in the insulator 224 into the oxide 230a and the oxide 230b.

The insulating film 226A can be formed by a sputtering method, a CVD method, an MBE method, a PLD method, an ALD method, or the like. For the insulating film 226A, aluminum oxide can be used. In that case, when aluminum oxide is formed by a sputtering method or an ALD method, the insulating film 226A can be formed while oxygen is added to the insulator 224, which is preferable.

Next, an oxide film 230A and an oxide film 230B are deposited in this order over the insulating film 226A (see FIG. 6A to FIG. 6D). Note that it is preferable to deposit the oxide film 230A and the oxide film 230B successively without exposure to the atmospheric environment. By the deposition without exposure to the air, impurities or moisture from the atmospheric environment can be prevented from being attached onto the oxide film 230A and the oxide film 230B, so that the vicinity of an interface between the oxide film 230A and the oxide film 230B can be kept clean.

The oxide film 230A and the oxide film 230B can be deposited by a sputtering method, a CVD method, an MBE method, a PLD method, an ALD method, or the like.

For example, in the case where the oxide film 230A and the oxide film 230B are deposited by a sputtering method, oxygen or a mixed gas of oxygen and a rare gas is used as a sputtering gas. Increasing the proportion of oxygen contained in the sputtering gas can increase the amount of excess oxygen in the deposited oxide films. In the case where the oxide films are deposited by a sputtering method, the above In-M-Zn oxide target or the like can be used.

In particular, when the oxide film 230A is deposited, part of oxygen contained in the sputtering gas is supplied to the insulator 224 in some cases. Thus, the proportion of oxygen contained in the sputtering gas is higher than or equal to 70%, preferably higher than or equal to 80%, further preferably 100%.

In the case where the oxide film 230B is formed by a sputtering method and the proportion of oxygen contained in the sputtering gas for deposition is higher than 30% and lower than or equal to 100%, preferably higher than or equal to 70% and lower than or equal to 100%, an oxygen-excess oxide semiconductor is formed. In a transistor using an oxygen-excess oxide semiconductor for its channel formation region, relatively high reliability can be obtained. Note that one embodiment of the present invention is not limited thereto. In the case where the oxide film 230B is formed by a sputtering method and the proportion of oxygen contained in the sputtering gas for deposition is higher than or equal to 1% and lower than or equal to 30%, preferably higher than or equal to 5% and lower than or equal to 20%, an oxygen-deficient oxide semiconductor is formed. In a transistor using an oxygen-deficient oxide semiconductor for its channel formation region, relatively high field-effect mobility can be obtained. Furthermore, when the deposition is performed while the substrate is heated, the crystallinity of the oxide film can be improved.

In this embodiment, the oxide film 230A is deposited by a sputtering method using an oxide target of In:Ga:Zn=1:3:4 [atomic ratio]. In addition, the oxide film 230B is deposited by a sputtering method using an oxide target with In:Ga:Zn=4:2:4.1 [atomic ratio]. Note that each of the oxide films is preferably formed to have characteristics required for the oxide 230a and the oxide 230b by selecting the deposition conditions and the atomic ratios as appropriate.

Next, an oxide film 243A is deposited over the oxide film 230B (see FIG. 6A to FIG. 6D). The oxide film 243A can be deposited by a sputtering method, a CVD method, an MBE method, a PLD method, an ALD method, or the like. The atomic ratio of Ga to In in the oxide film 243A is preferably greater than the atomic ratio of Ga to In in the oxide film 230B. In this embodiment, the oxide film 243A is deposited by a sputtering method using an oxide target with In:Ga:Zn=1:3:4 [atomic ratio].

Note that the insulator 222, the insulator 224, the oxide film 230A, the oxide film 230B, and the oxide film 243A are preferably deposited without exposure to the air. For example, a multi-chamber deposition apparatus is used.

Next, heat treatment may be performed. For the heat treatment, the above heat treatment conditions can be used.

By the heat treatment, impurities such as water and hydrogen in the oxide film 230A, the oxide film 230B, and the oxide film 243A can be removed, for example. In this embodiment, treatment is performed at 400° C. in a nitrogen atmosphere for one hour, and successively another treatment is performed at 400° C. in an oxygen atmosphere for one hour.

Then, a conductive film 242A is deposited over the oxide film 243A (see FIG. 6A to FIG. 6D). The conductive film 242A can be deposited by a sputtering method, a CVD method, an MBE method, a PLD method, an ALD method, or the like. Note that heat treatment may be performed before the formation of the conductive film 242A. This heat treatment may be performed under reduced pressure, and the conductive film 242A may be successively formed without exposure to the air. The treatment can remove moisture and hydrogen adsorbed onto a surface of the oxide film 243A and the like, and further can reduce the moisture concentration and the hydrogen concentration in the oxide film 230A, the oxide film 230B, and the oxide film 243A. The heat treatment is preferably performed at a temperature higher than or equal to 100° C. and lower than or equal to 400° C. In this embodiment, the heat treatment is performed at 200° C.

Next, an insulating film 245A is deposited over the conductive film 242A (see FIG. 6A to FIG. 6D). The insulating film 245A can be deposited using a sputtering method, a CVD method, an MBE method, a PLD method, an ALD method, or the like. The insulating film 245A preferably has a function of inhibiting oxidation of the conductive film 242A and a function of a hard mask used at the time of processing the oxide film 230A, the oxide film 230B, and the like in a later step. In this embodiment, aluminum oxide is formed using an ALD method as the insulating film 245A.

Next, a conductive film 290A is deposited over the insulating film 245A (see FIG. 6A to FIG. 6D). The conductive film 290A can be deposited using a sputtering method, a CVD method, an MBE method, a PLD method, an ALD method, or the like. The conductive film 290A preferably has a function of a hard mask used when processing the oxide film 230A, the oxide film 230B, and the like in a later step. For the conductive film 290A, the same material as the conductive film 242A is preferably used. In this embodiment, for the conductive film 290A, tantalum nitride is formed using a sputtering method.

Next, the oxide film 230A, the oxide film 230B, the oxide film 243A, the conductive film 242A, the insulating film 245A and the conductive film 290A are processed into island shapes by a lithography method to form the oxide 230a, the oxide 230b, an oxide layer 243B, a conductive layer 242B, an insulating layer 245B, and a conductive layer 290B (see FIG. 7A to FIG. 7D). A dry etching method or a wet etching method can be used for the processing. Processing by a dry etching method is suitable for microfabrication. The oxide film 230A, the oxide film 230B, the oxide film 243A, the conductive film 242A, the insulating film 245A, and the conductive film 290A may be processed under different conditions. Note that in this step, the thickness of a region of the insulating film 226A which does not overlap with the oxide 230a becomes small in some cases.

Note that in the lithography method, first, a resist is exposed to light through a mask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a mask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In this embodiment, a hard mask with a desired shape can be formed by forming an insulating film 245A and a conductive film 290A to be the hard mask material over the conductive film 242A, forming a resist mask thereover, and then etching the hard mask material. The etching of the conductive film 242A may be performed after removing the resist mask or with the resist mask remaining. In the latter case, the resist mask sometimes disappears during the etching. The hard mask may be removed by etching after the etching of the conductive film 242A and the like. Meanwhile, the hard mask is not necessarily removed when the hard mask material does not affect later steps or can be utilized in later steps.

Here, the oxide 230a, the oxide 230b, the oxide layer 243B, and the conductor layer 242B are formed to at least partly overlap with the conductor 205. It is preferable that the side surfaces of the oxide 230a, the oxide 230b, the oxide layer 243B, and the conductor layer 242B be substantially perpendicular to a top surface of the insulator 222. When the side surfaces of the oxide 230a, the oxide 230b, the oxide layer 243B, and the conductor layer 242B are substantially perpendicular to the top surface of the insulator 222, a plurality of transistors 200 can be provided in a smaller area and at a higher density. In addition, the oxide 271 can be formed easily in a later step. An angle formed by the side surfaces of the oxide 230a, the oxide 230b, the oxide layer 243B, and the conductive layer 242B and the top surface of the insulator 222 is greater than or equal to 60° and less than or equal to 100°, preferably greater than or equal to 70° and less than or equal to 90°, more preferably greater than or equal to 80° and less than or equal to 90°.

Figure 8A:
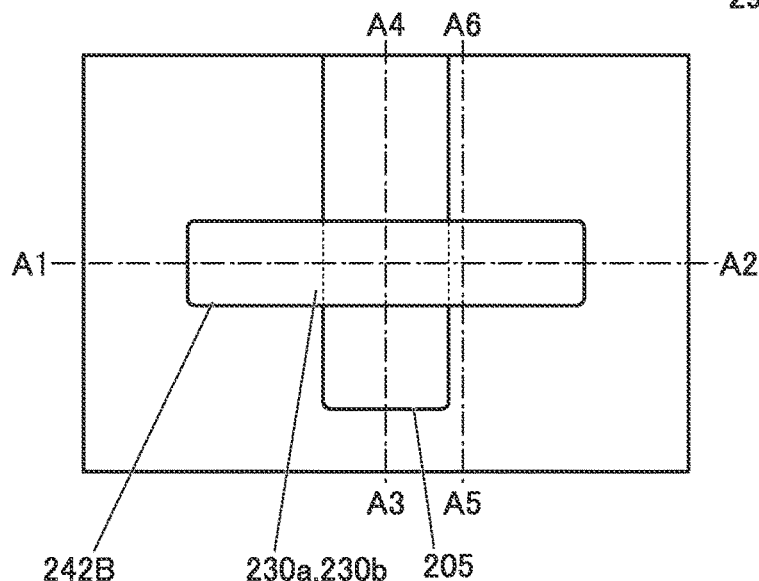
FIG. 8A is a top view illustrating a method for manufacturing a semiconductor device of one embodiment of the present invention.
Figure 8C:
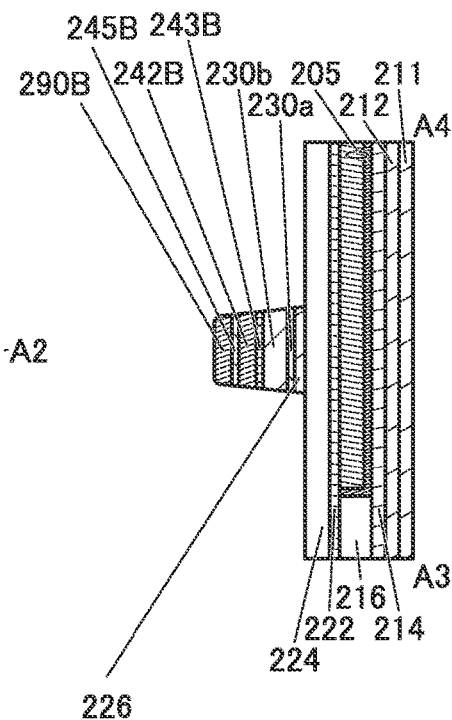
FIG. 8B to FIG. 8D are cross-sectional views illustrating a method for manufacturing a semiconductor device of one embodiment of the present invention.
Figure 8B:
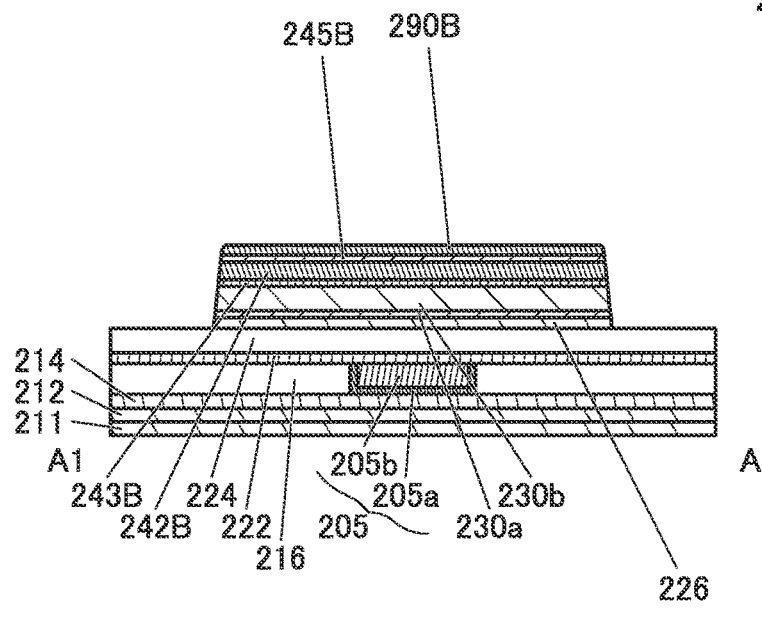
Figure 8D:
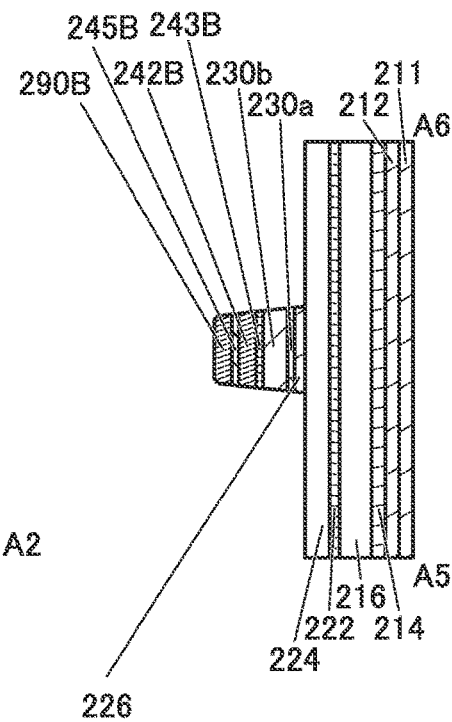

Next, the insulating film 226A is processed to form the insulator 226 (see FIG. 8B to 8D). For the processing, a dry etching method or a wet etching method can be employed. Note that in this step, the thickness of a region of the insulator 224 which does not overlap with the insulator 226 becomes small in some cases.

Figure 9A:
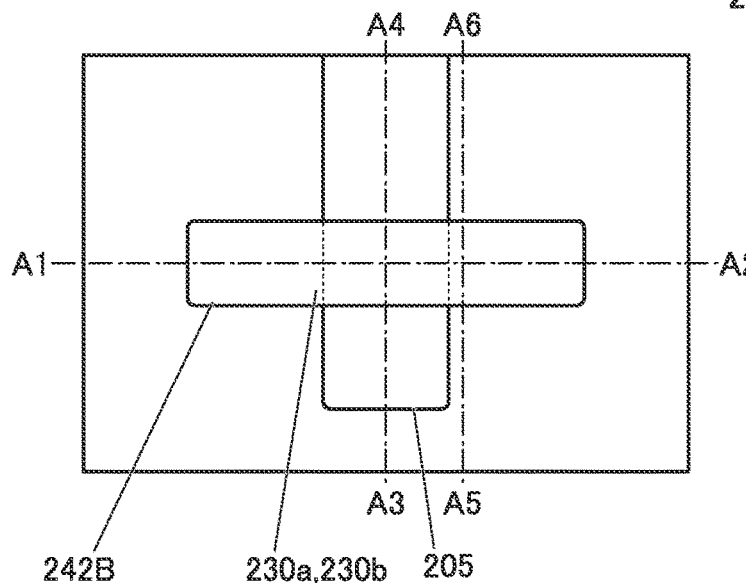
FIG. 9A is a top view illustrating a method for manufacturing a semiconductor device of one embodiment of the present invention.
Figure 9C:
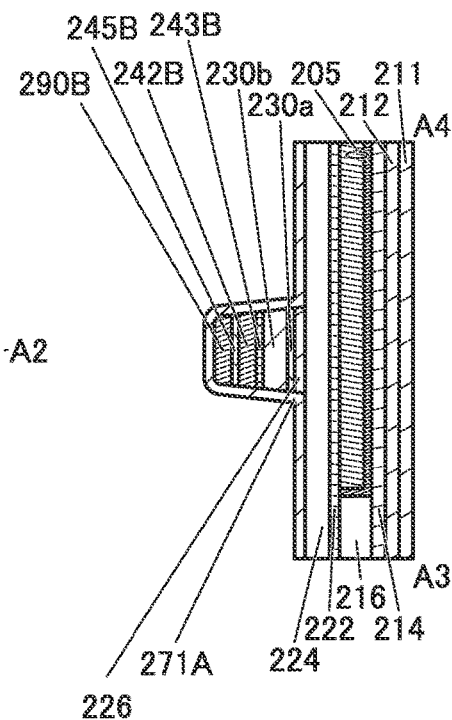
FIG. 9B to FIG. 9D are cross-sectional views illustrating a method for manufacturing a semiconductor device of one embodiment of the present invention.
Figure 9B:
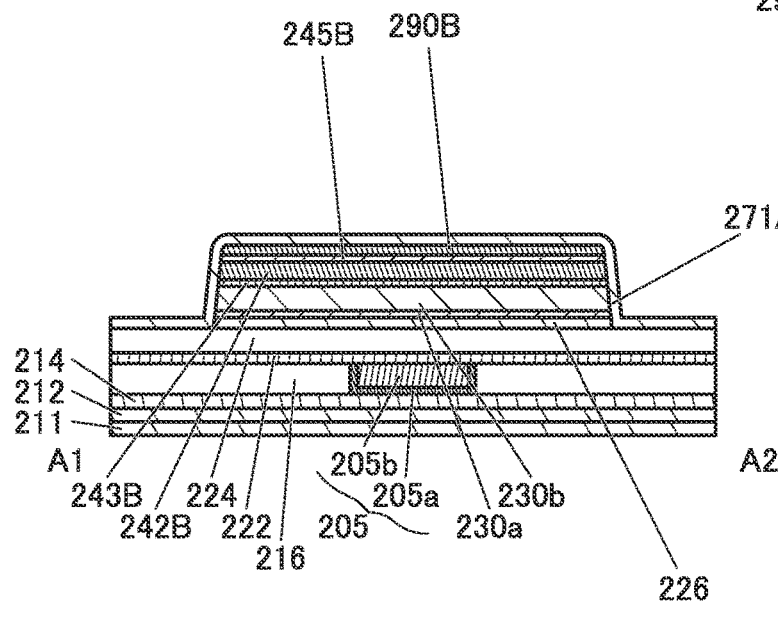
Figure 9D:
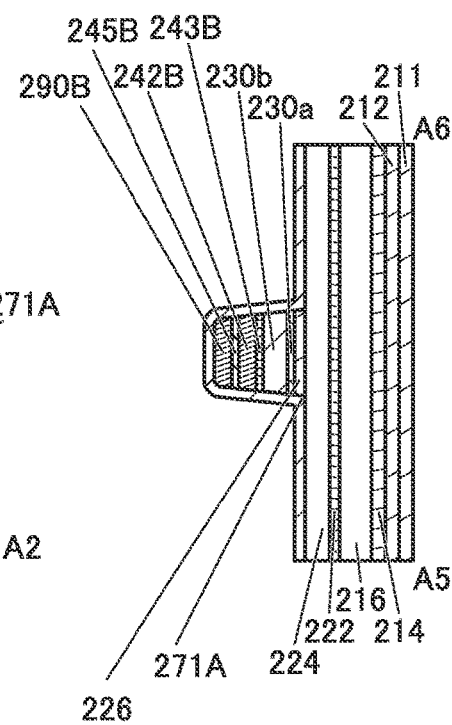
Figure 10A:
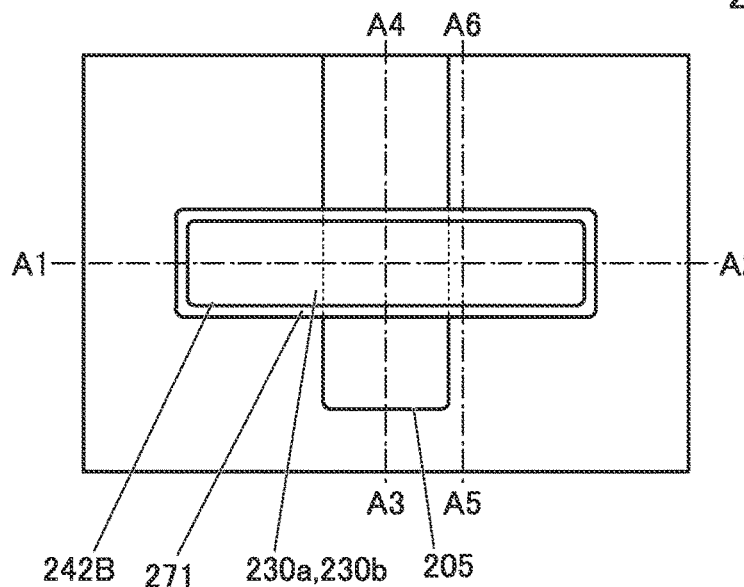
FIG. 10A is a top view illustrating a method for manufacturing a semiconductor device of one embodiment of the present invention.
Figure 10C:
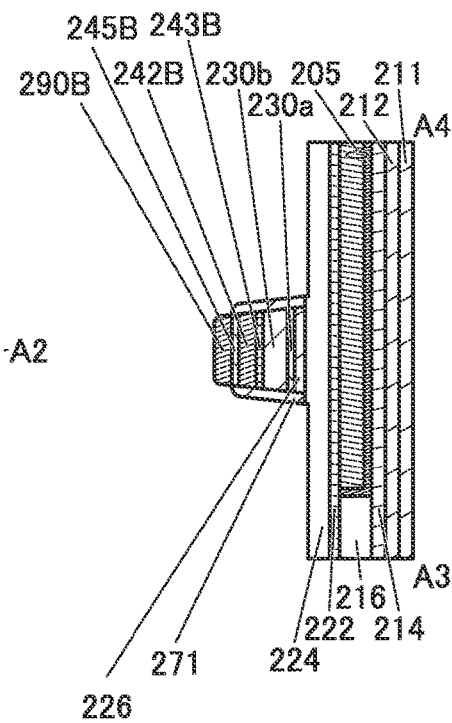
FIG. 10B to FIG. 10D are cross-sectional views illustrating a method for manufacturing a semiconductor device of one embodiment of the present invention.
Figure 10B:
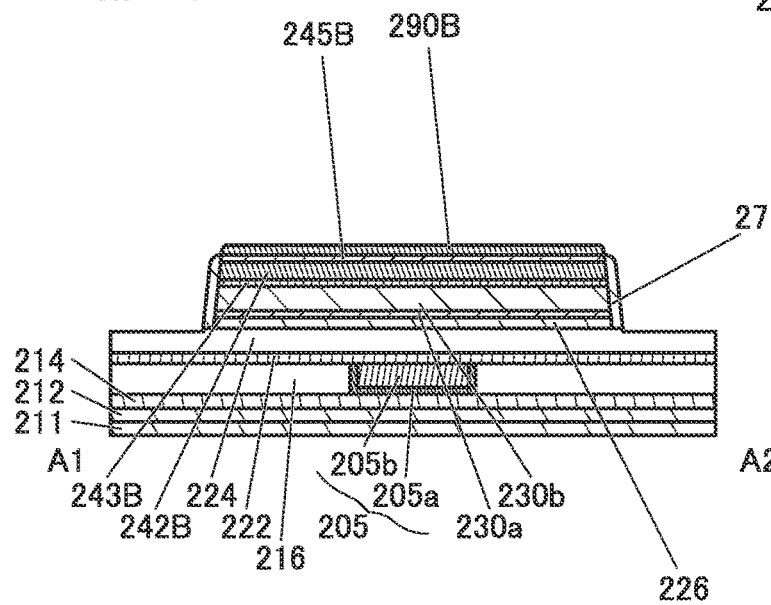
Figure 10D:
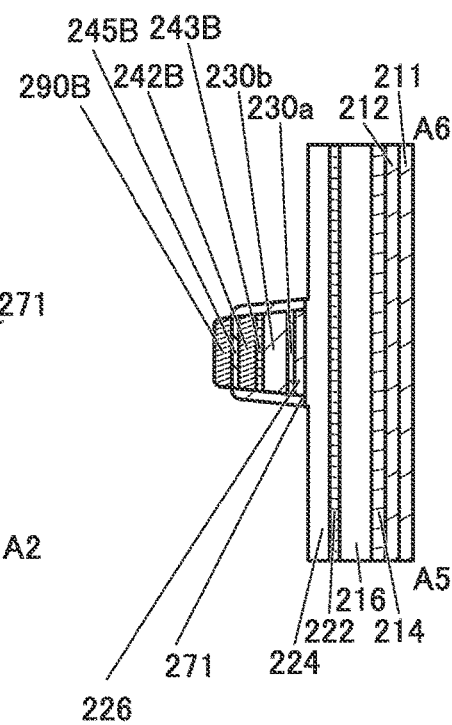
Figure 11A:
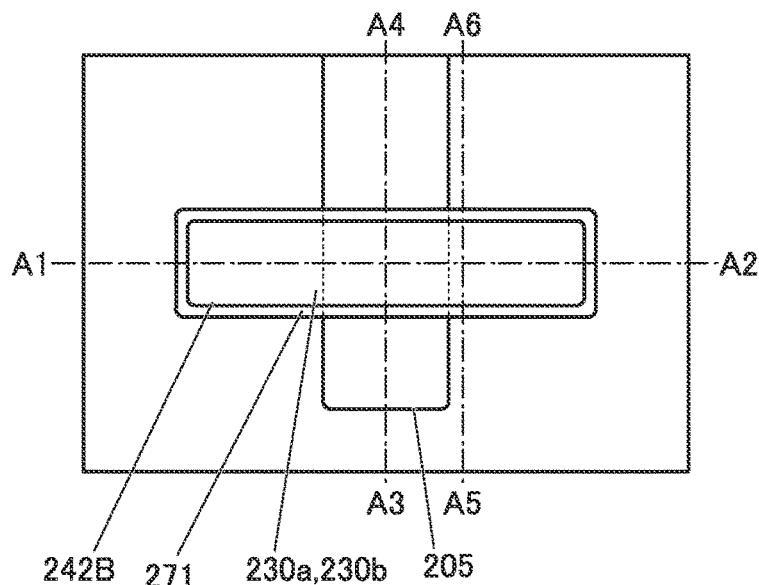
FIG. 11A is a top view illustrating a method for manufacturing a semiconductor device of one embodiment of the present invention.
Figure 11C:
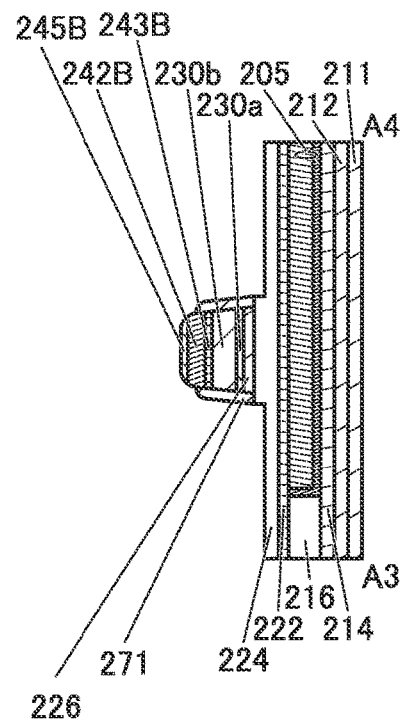
FIG. 11B to FIG. 11D are cross-sectional views illustrating a method for manufacturing a semiconductor device of one embodiment of the present invention.
Figure 11B:
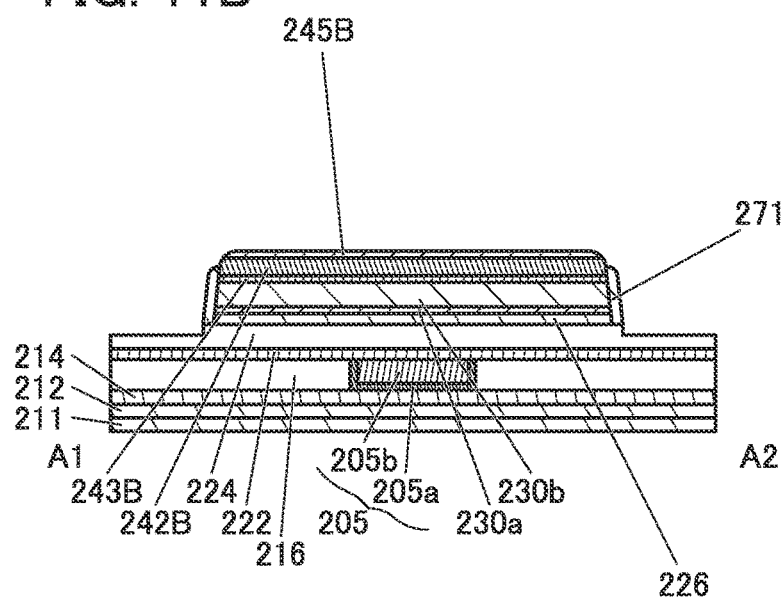
Figure 11D:
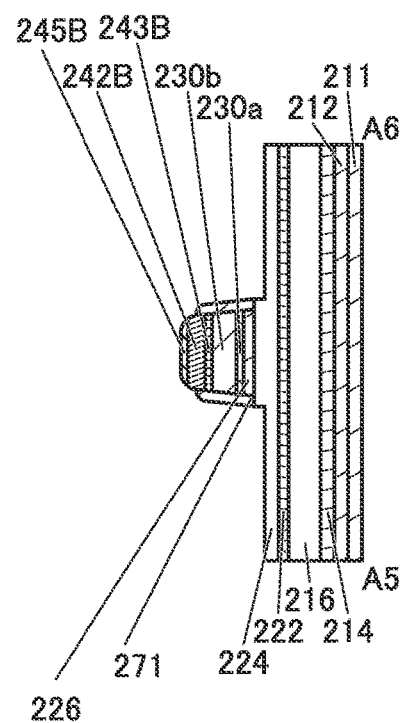

Next, an oxide film 271A is deposited over the insulator 224, the insulator 226, the oxide 230a, the oxide 230b, the oxide layer 243B, the conductive layer 242B, the insulating layer 245B, and the conductive layer 290B (see FIG. 9B to FIG. 9D). A material that can be used for the oxide film 230B is preferably used for the oxide film 271A. As the oxide film 271A, a metal oxide, an indium oxide, or the like with a composition In:M:Zn=4:2:3 [atomic ratio] or a neighborhood thereof, In:M:Zn=5:1:3 [atomic ratio] or a neighborhood thereof, In:M:Zn=10:1:3 [atomic ratio] or a neighborhood thereof, In:Zn=1:1 [atomic ratio] or a neighborhood thereof, or In:Zn=2:1 [atomic ratio] or a neighborhood thereof can be used specifically. The oxide film 271A can be deposited using a sputtering method, a CVD method, an MBE method, a PLD method, an ALD method, or the like. In this embodiment, the oxide film 271A having a composition In:M:Zn=4:2:3 [atomic ratio] or a neighborhood thereof is deposited by a sputtering method using an oxide target of In:Ga:Zn=4:2:4.1 [atomic ratio].

The oxide film 271A preferably includes a CAAC structure, and it is preferable that the c-axis of a crystal included in the oxide film 271A be in a direction substantially perpendicular to the formation surface of the oxide film 271A, i.e., at least the side surface of the insulator 226, the side surface of the oxide 230a, and the side surface of the oxide 230b.

Next, the oxide film 271A is subjected to anisotropic etching, so that the oxide 271 in contact with at least the insulator 224, a side surface of the insulator 226, a side surface of the oxide 230a, and a side surface of the oxide 230b is formed (see FIG. 10A to FIG. 10D). The oxide 271 may be in contact with the side surfaces of the oxide layer 243B, the conductive layer 242B, the insulating layer 245B, and the conductive layer 290B. Note that in this step, the thickness of a region of the insulator 224 which does not overlap with the insulator 226 and the oxide 271 becomes small in some cases.

Next, the conductive layer 290B is removed by etching (see FIG. 11A to 11D). A dry etching method or a wet etching method can be used for the etching. Note that in this step, the insulating layer 245B is exposed. The thickness of a region of the insulator 224 that does not overlap with the insulator 226 or the oxide 271 is reduced in some cases. The upper portion of the oxide 271 is also etched and the level of the top surface thereof becomes lower in some cases.

Figure 12A:
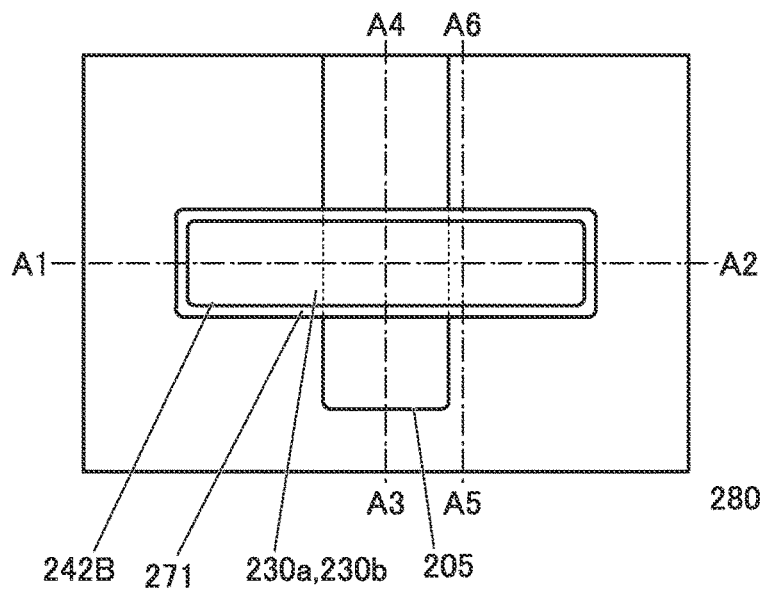
FIG. 12A is a top view illustrating a method for manufacturing a semiconductor device of one embodiment of the present invention.
Figure 12C:
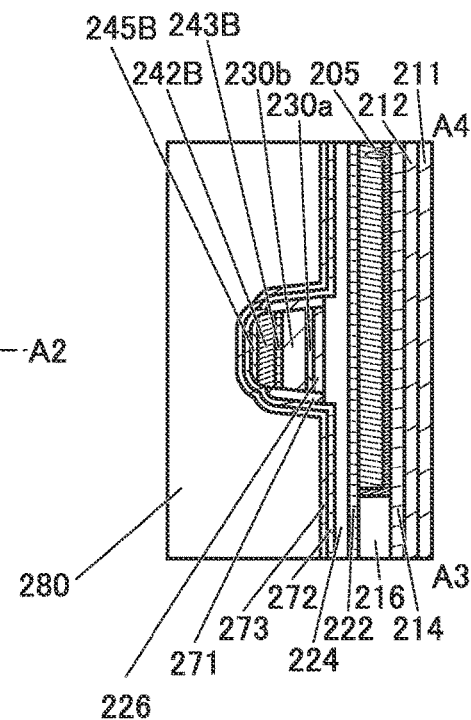
FIG. 12B to FIG. 12D are cross-sectional views illustrating a method for manufacturing a semiconductor device of one embodiment of the present invention.
Figure 12B:
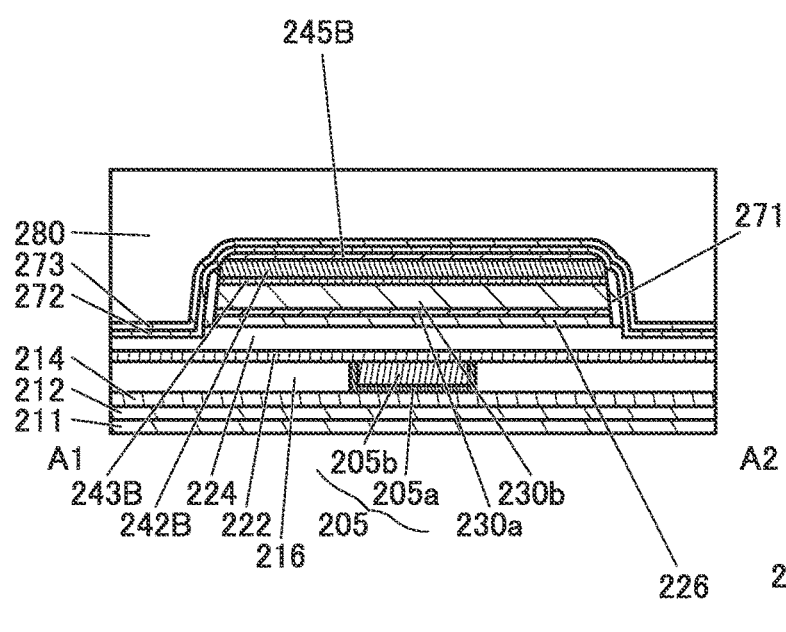
Figure 12D:
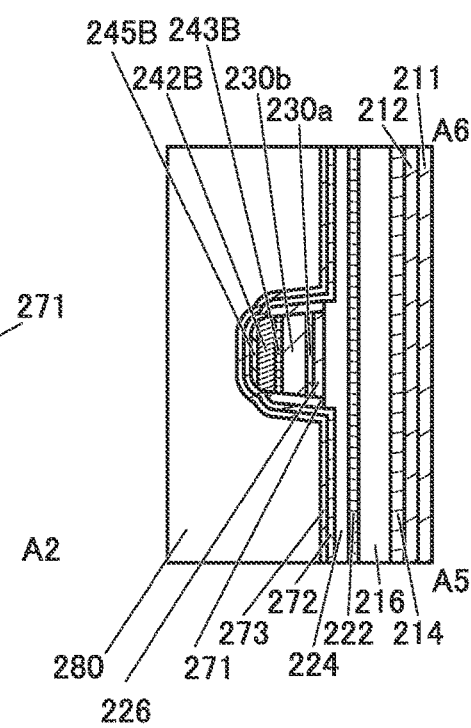
Figure 13A:
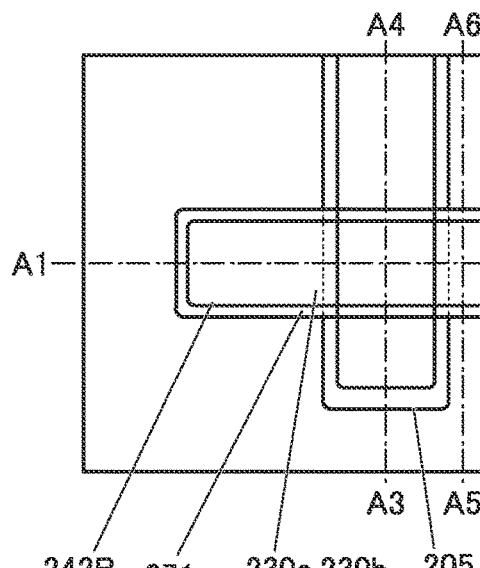
FIG. 13A is a top view illustrating a method for manufacturing a semiconductor device of one embodiment of the present invention.
Figure 13B:
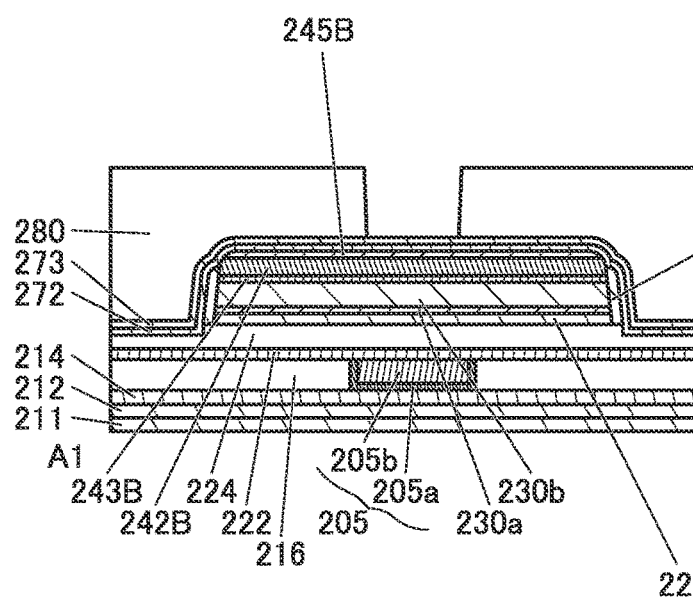
FIG. 13B to FIG. 13D are cross-sectional views illustrating a method for manufacturing a semiconductor device of one embodiment of the present invention.
Figure 13C:
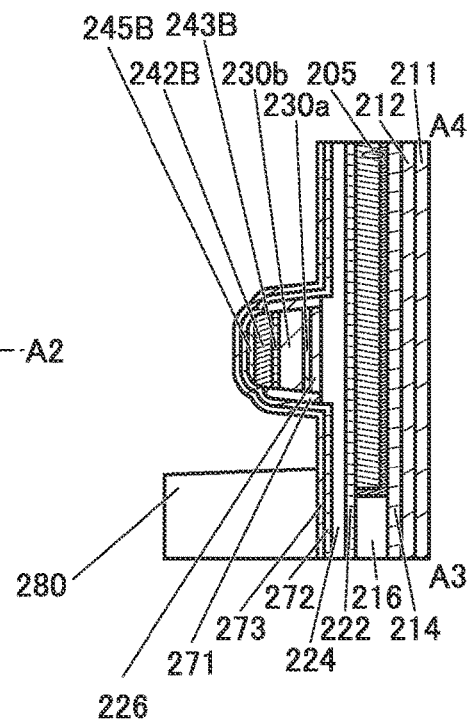
Figure 13D:
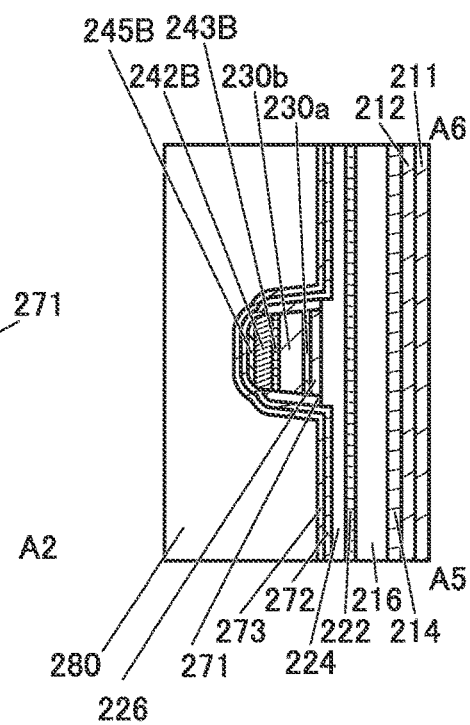
Figure 14A:
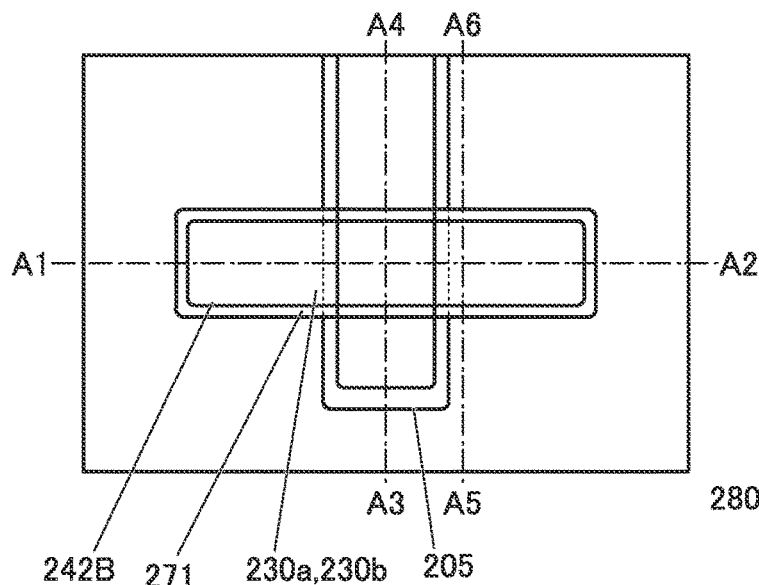
FIG. 14A is a top view illustrating a method for manufacturing a semiconductor device of one embodiment of the present invention.
Figure 14C:
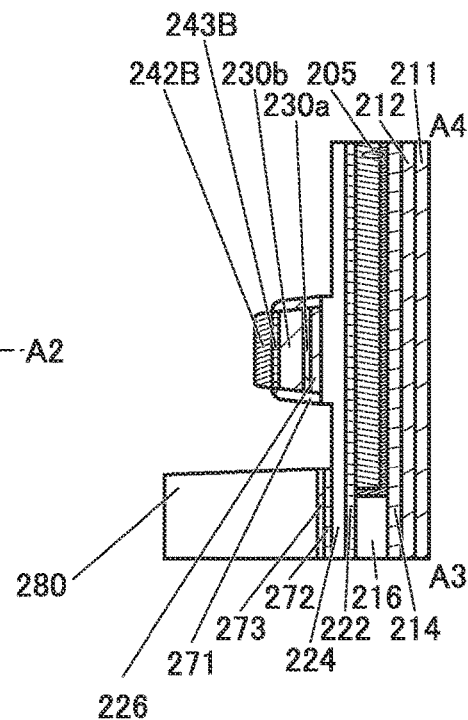
FIG. 14B to FIG. 14D are cross-sectional views illustrating a method for manufacturing a semiconductor device of one embodiment of the present invention.
Figure 14B:
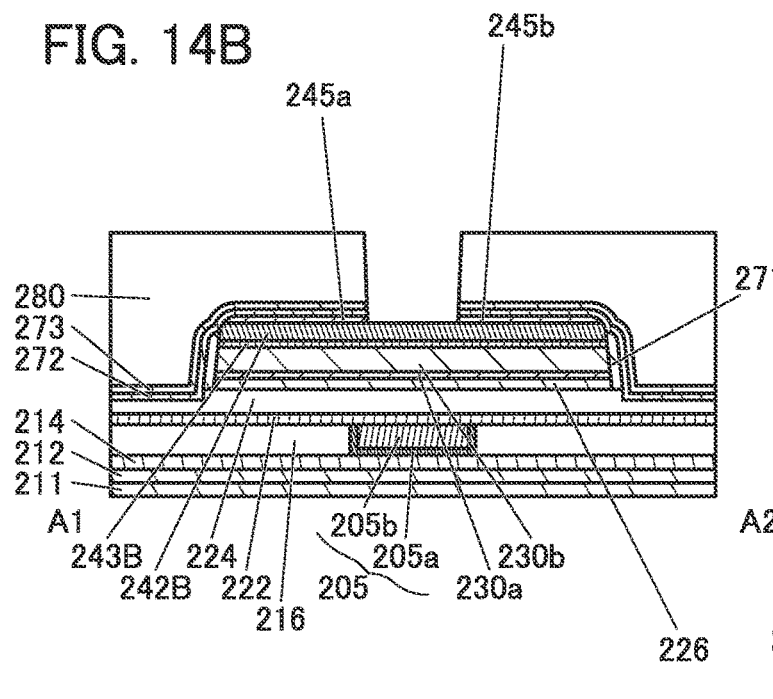
Figure 14D:
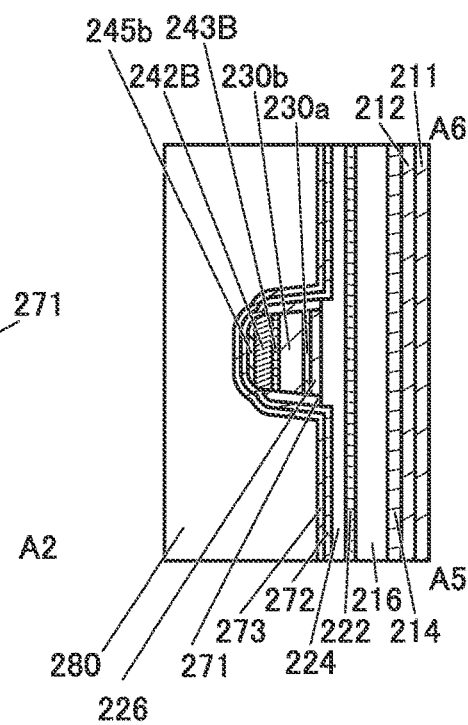

Next, the insulator 272 is deposited over the insulator 224, the oxide 271, the insulator 226, the oxide 230a, the oxide 230b, the oxide layer 243B, the conductive layer 242B, and the insulating layer 245B (see FIG. 12B to FIG. 12D). The insulator 272 can be deposited by a sputtering method, a CVD method, an MBE method, a PLD method, an ALD method, or the like. In this embodiment, for the insulator 272, aluminum oxide is deposited by a sputtering method. When an aluminum oxide film is deposited by a sputtering method, oxygen can be injected into the insulator 224.

Next, the insulator 273 is deposited over the insulator 272. The insulator 273 can be deposited by a sputtering method, a CVD method, an MBE method, a PLD method, an ALD method, or the like. In this embodiment, for the insulator 273, silicon nitride is deposited by a sputtering method (see FIG. 12B to FIG. 12D).

Next, an insulating film to be the insulator 280 is deposited over the insulator 273. The insulating film can be deposited by a sputtering method, a CVD method, an MBE method, a PLD method, an ALD method, or the like. For example, as the insulating film, a silicon oxide film is deposited by a sputtering method, and a silicon oxide film is deposited thereover by a PEALD method or a thermal ALD method. The insulating film is preferably deposited by the deposition method using a gas in which hydrogen atoms are reduced or removed. Thus, the hydrogen concentration of the insulator 280 can be reduced. In that case, as the insulating film, a silicon oxide film or a silicon oxynitride film can be deposited by a CVD method. Alternatively, a silicon oxide film can be deposited by a sputtering method and a silicon oxide film or a silicon oxynitride film can be deposited thereover by a CVD method. Note that heat treatment may be performed before the insulating film is deposited. The heat treatment may be performed under reduced pressure, and the insulating films may be successively formed without exposure to the air. The treatment can remove moisture and hydrogen adsorbed onto a surface of the insulator 273 and the like, and further can reduce the moisture concentration and the hydrogen concentration in the oxide 230a, the oxide 230b, the oxide layer 243B, and the insulator 224. The above heat treatment conditions can be used.

Next, the insulating film is subjected to CMP treatment, so that the insulator 280 having a flat top surface is formed (see FIG. 12B to FIG. 12D). Note that in a manner similar to that of the insulator 224, aluminum oxide may be deposited over the insulator 280 by a sputtering method, for example, and the aluminum oxide may be subjected to CMP treatment until the insulator 280 is reached.

Here, microwave treatment may be performed. The microwave treatment is preferably performed in an atmosphere containing oxygen under reduced pressure. By performing the microwave treatment, an electric field by a microwave can be supplied to the insulator 280, the oxide 230b, the oxide 230a, and the like to divide $V_OH$ in the oxide 230b and the oxide 230a into oxygen vacancy ($V_O$) and hydrogen (H). Part of hydrogen divided at this time is bonded to oxygen contained in the insulator 280 and is removed as water molecules in some cases. Some hydrogen is gettered by the insulator 272, the insulator 273, or the conductor 242 in some cases.

After the microwave treatment, heat treatment may be performed with the reduced pressure being maintained. Such treatment enables hydrogen in the insulator 280, the oxide 230b, and the oxide 230a to be removed efficiently. Note that the temperature of the heat treatment is preferably higher than or equal to 300° C. and lower than or equal to 500° C.

Performing the microwave treatment improves the film quality of the insulator 280, thereby inhibiting diffusion of hydrogen, water, impurities, and the like. Accordingly, hydrogen, water, impurities, and the like can be inhibited from diffusing into the oxide 230 through the insulator 280 in a later step after the formation of the insulator 280, heat treatment, or the like.

Next, part of the insulator 280 is processed to form an opening that exposes part of the insulator 273. The opening is preferably formed to overlap with the conductor 205 (see FIG. 13A to FIG. 13D).

A dry etching method or a wet etching method can be used for the processing of part of the insulator 280. Processing by a dry etching method is suitable for microfabrication. In this embodiment, part of the insulator 280 is processed by a dry etching method.

Next, part of the insulator 273, part of the insulator 272, and part of the insulating layer 245B are processed to form an opening that exposes part of the conductive layer 242B, part of the oxide 271, and part of the insulator 224. The insulator 245a and the insulator 245b are formed by forming the opening (see FIG. 14A to FIG. 14D).

Note that at the time of forming the opening, in the opening, the thickness of a region of the insulator 224 which does not overlap with the insulator 226 and the oxide 271 becomes small in some cases. The upper portion of the oxide 271 is also etched and the level of the top surface thereof is reduced in some cases.

The part of the insulator 273, the part of the insulator 272, and the part of the insulating layer 245B can be processed by a dry etching method or a wet etching method. Processing by a dry etching method is suitable for microfabrication. The processing may be performed under different conditions. For example, part of the insulator 273 and part of the insulator 272 may be processed by a wet etching method and part of the insulating layer 245B may be processed by a dry etching method.

Then, part of the conductive layer 242B, and part of the oxide layer 243B are processed to form the opening reaching the oxide 230b. The conductor 242a, the conductor 242b, the oxide 243a, and the oxide 243b are formed by the formation of the opening (see FIG. 15A to FIG. 15D).

An upper portion of the oxide 230b might be slightly removed when the opening is formed. When part of the oxide 230b is removed, a groove portion is formed in the oxide 230b. The groove portion may be formed in the same step as the formation of the opening or in a step different from the formation of the opening in accordance with the depth of the groove portion. In the opening, the thickness of a region of the insulator 224 which does not overlap with the insulator 226 or the oxide 271 becomes small in some cases. The upper portion of the oxide 271 is also etched and the level of the top surface thereof is reduced in some cases.

The part of the conductive layer 242B, the part of the oxide layer 243B, and the part of the oxide 230b can be processed by a dry etching method or a wet etching method. Processing by a dry etching method is suitable for microfabrication. The processing may be performed under different conditions. In this embodiment, part of the conductive layer 242B, part of the oxide layer 243B, and part of the oxide 230b are processed by a dry etching method. Processing of the part of the conductive layer 242B and the part of the oxide layer 243B and processing of the part of the oxide 230b may be performed under different conditions.

In some cases, the treatment such as the dry etching performed thus far causes impurities due to an etching gas, an etched substance, and the like to be attached to the surfaces of the oxide 230a, the oxide 230b, and the like or diffused to the inside thereof. Examples of the impurities include fluorine, chlorine, aluminum, silicon, an oxide of the above elements, and a nitride of the above elements.

In order to remove the above impurities and the like, cleaning treatment is performed. Examples of the cleaning method include wet cleaning using a cleaning solution, plasma treatment using plasma, and cleaning by heat treatment, and any of these cleanings may be performed in appropriate combination.

As the wet cleaning, cleaning treatment may be performed using an aqueous solution in which ammonia water, oxalic acid, phosphoric acid, hydrofluoric acid, or the like is diluted with carbonated water or pure water; pure water; carbonated water; or the like. Alternatively, ultrasonic cleaning using such an aqueous solution, pure water, or carbonated water may be performed. Alternatively, such cleaning methods may be performed in combination as appropriate.

By the processing such as dry etching in the above steps or the cleaning treatment, the thickness of the insulator 224 in a region that overlaps with the opening and does not overlap with the oxide 230b and the oxide 271 might become smaller than the thickness of the insulator 224 in a region that overlaps with the oxide 230b and the oxide 271.

Next, an insulating film 231A is deposited (see FIG. 16A to FIG. 16D). Heat treatment may be performed before deposition of the insulating film 231A, and it is preferable that the heat treatment be performed under reduced pressure and that the insulating film 231A be successively deposited without exposure to the air. Preferably, the heat treatment is performed in an atmosphere containing oxygen. The treatment can remove moisture and hydrogen adsorbed onto a surface of the oxide 230b and the like, and further can reduce the moisture concentration and the hydrogen concentration in the oxide 230a, the oxide 230b, and the oxide 271. The heat treatment is preferably performed at a temperature higher than or equal to 100° C. and lower than or equal to 400° C. In this embodiment, the heat treatment is performed at 200° C.

It is preferable that the insulating film 231A be provided in contact with at least an inner wall of the groove portion formed in the oxide 230b, part of the side surfaces of the oxide 243, part of the side surfaces of the conductor 242, part of the side surfaces of the insulator 272, part of the side surfaces of the insulator 273, and part of the side surfaces of the insulator 280, as illustrated in FIG. 16B. When the conductor 242 is surrounded by the oxide 243, the insulator 272, the insulator 273, and the insulating film 231A, a decrease in the conductivity of the conductor 242 due to oxidation can be inhibited in subsequent steps. It is preferable that the insulating film 231A be provided in contact with at least part of the insulator 224, part of the oxide 271, and part of the top surface of the oxide 230b as illustrated in FIG. 16C. When the insulator 224 includes a region covered with the insulator 226 and the insulating film 231A, oxygen contained in the insulator 224 can be efficiently supplied to the oxide 230b through the oxide 271.

The insulating film 231A can be deposited by a sputtering method, a CVD method, an MBE method, a PLD method, an ALD method, or the like. As the insulating film 231A, an insulating film functioning as an oxygen blocking film is deposited. In this embodiment, aluminum oxide is deposited. In the case where the insulating film 231A is formed by a sputtering method, oxygen or a gas containing oxygen is preferably used as the deposition gas. In the case where the insulating film 231A is formed by an ALD method, oxygen or a material containing oxygen such as ozone or water is preferably used as an oxidizer. With the use of a material containing oxygen as the deposition gas or the oxidizer, oxygen can be added to the insulator 224 in some cases. Oxygen added to the insulator 224 can be supplied to the oxide 230b through the oxide 271.

Next, an insulating film 250A is deposited (see FIG. 16A to FIG. 16D). Heat treatment may be performed before the deposition of the insulating film 250A, the heat treatment may be performed under reduced pressure, and the insulating film 250A may be successively deposited without exposure to the air. Preferably, the heat treatment is performed in an atmosphere containing oxygen. The treatment can remove moisture and hydrogen adsorbed onto a surface of the insulating film 231A and the like, and further can reduce the moisture concentration and the hydrogen concentration in the oxide 230a, the oxide 230b, the oxide 243, and the oxide 271. The heat treatment is preferably performed at a temperature higher than or equal to 100° C. and lower than or equal to 400° C.

The insulating film 250A can be deposited by a sputtering method, a CVD method, an MBE method, a PLD method, an ALD method, or the like. The insulating film 250A is preferably deposited by the deposition method using the gas in which hydrogen atoms are reduced or removed. This reduces the hydrogen concentration of the insulating film 250A.

Note that in the case where the insulator 250 has a stacked-layer structure of two layers, the insulating film to be the lower layer of the insulator 250 and the insulating film to be the upper layer of the insulator 250 are preferably deposited successively without being exposed to the atmosphere. When deposition without exposure to the atmosphere is performed, attachment of impurities or moisture from the atmosphere to the insulating film to be the lower layer of the insulator 250 and the insulating film to be the upper layer of the insulator 250 can be prevented, whereby the vicinity of the interface between the insulating film to be the lower layer of the insulator 250 and the insulating film to be the upper layer of the insulator 250 can be kept clean.

Here, after the insulating film 250A is deposited, the microwave treatment may be performed in an atmosphere containing oxygen under reduced pressure. By performing the microwave treatment, an electric field by a microwave is supplied to the insulating film 250A, the oxide 243, the oxide 271, the oxide 230b, the oxide 230a, and the like so that $V_OH$ in the oxide 243, the oxide 271, the oxide 230b, and the oxide 230a can be divided into $V_O$ and hydrogen. Part of hydrogen divided at this time is bonded to oxygen and is removed as $H_2O$ from the insulating film 250A, the oxide 243, the oxide 271, the oxide 230b, and the oxide 230a in some cases. Part of hydrogen is gettered by the conductor 242 (the conductor 242a and the conductor 242b) in some cases. Performing the microwave treatment in such a manner can reduce the hydrogen concentration in the insulating film 250A, the oxide 243, the oxide 271, the oxide 230b, and the oxide 230a. Furthermore, oxygen is supplied to $V_O$ that can exist after $V_OH$ in the oxide 230a, the oxide 230b, the oxide 271, and the oxide 243 is divided into $V_O$ and hydrogen, so that $V_O$ can be repaired or filled.

After the microwave treatment, heat treatment may be performed with the reduced pressure being maintained. Such treatment enables hydrogen in the insulating film 250A, the oxide 243, the oxide 271, the oxide 230b, and the oxide 230a to be removed efficiently. Part of hydrogen is gettered by the conductor 242 (the conductor 242a and the conductor 242b) in some cases. Alternatively, it is possible to repeat the step of performing heat treatment with the reduced pressure being maintained after the microwave treatment. The repetition of the heat treatment enables hydrogen in the insulating film 250A, the oxide 243, the oxide 271, the oxide 230b, and the oxide 230a to be removed more efficiently. Note that the temperature of the heat treatment is preferably higher than or equal to 300° C. and lower than or equal to 500° C.

Furthermore, the microwave treatment improves the film quality of the insulating film 250A, thereby inhibiting diffusion of hydrogen, water, impurities, and the like. Accordingly, hydrogen, water, impurities, and the like can be inhibited from being diffused into the oxide 230b, the oxide 230a, and the like through the insulator 250 in a later step such as deposition of a conductive film to be the conductor 260 or a later treatment such as heat treatment.

Next, a conductive film 260A and a conductive film 260B are deposited in this order (see FIG. 16A to FIG. 16D). The conductive film 260A and the conductive film 260B can be deposited by a sputtering method, a CVD method, an MBE method, a PLD method, an ALD method, or the like. In this embodiment, the conductive film 260A is deposited by an ALD method, and the conductive film 260B is deposited by a CVD method.

Then, the insulating film 231A, the insulating film 250A, the conductive film 260A, and the conductive film 260B are polished by CMP treatment until the insulator 280 is exposed, whereby the insulator 231, the insulator 250, and the conductor 260 (the conductor 260a and the conductor 260b) are formed (see FIG. 17A to FIG. 17D). Accordingly, the insulator 231 is positioned to cover the inner wall (the side wall and bottom surface) of the opening reaching the oxide 230b and the groove portion of the oxide 230b. The insulator 250 is positioned to cover the inner wall of the opening and the groove portion with the insulator 231 therebetween. The conductor 260 is positioned to fill the opening and the groove portion with the insulator 231 and the insulator 250 therebetween.

Next, heat treatment may be performed. In this embodiment, treatment is performed at 400° C. in a nitrogen atmosphere for one hour. The heat treatment can reduce the moisture concentration and the hydrogen concentration in the insulator 250 and the insulator 280. After the heat treatment, the insulator 282 may be successively deposited without exposure to the air.

Figure 18A:
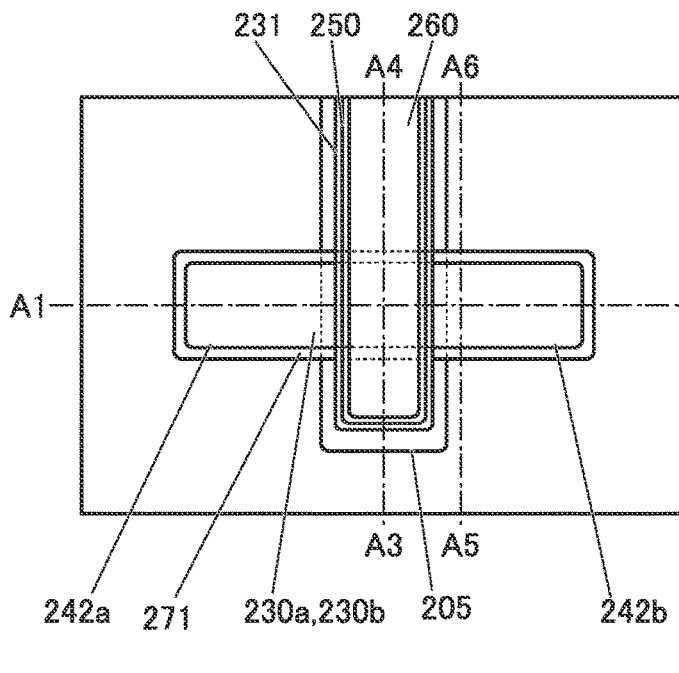
FIG. 18A is a top view illustrating a method for manufacturing a semiconductor device of one embodiment of the present invention.
Figure 18C:
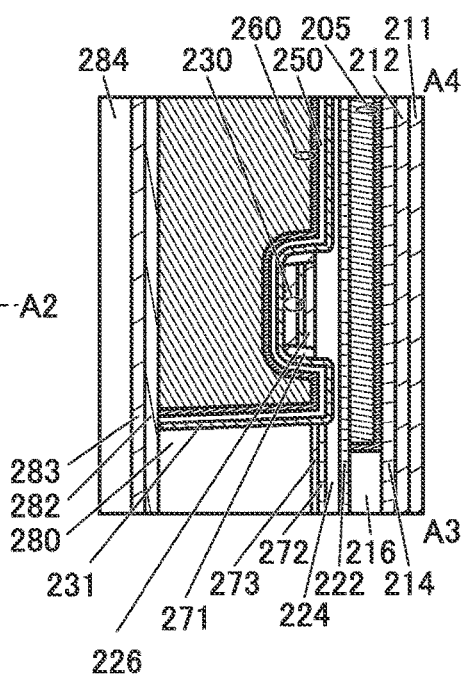
FIG. 18B to FIG. 18D are cross-sectional views illustrating a method for manufacturing a semiconductor device of one embodiment of the present invention.
Figure 18B:
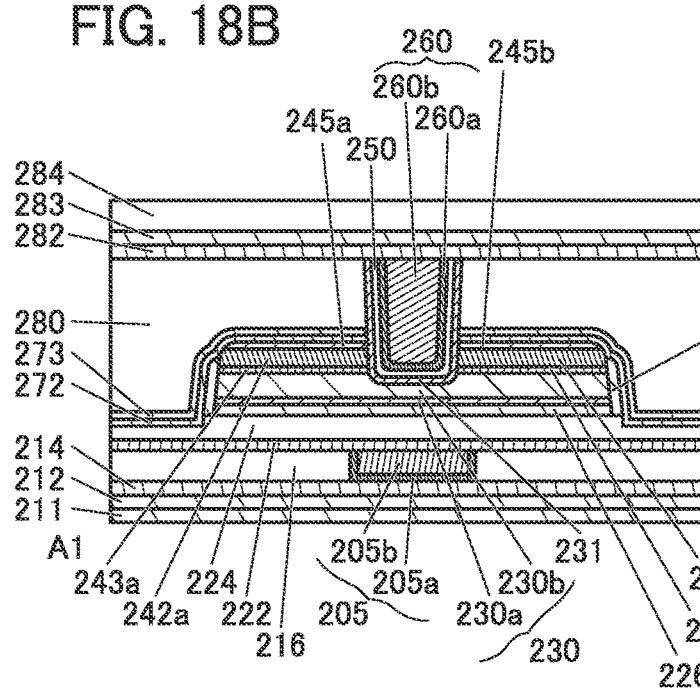
Figure 18D:
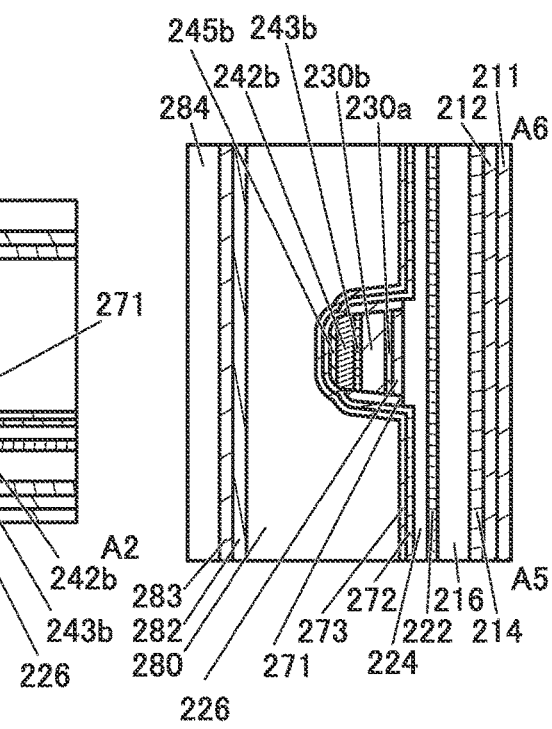
Figure 19A:
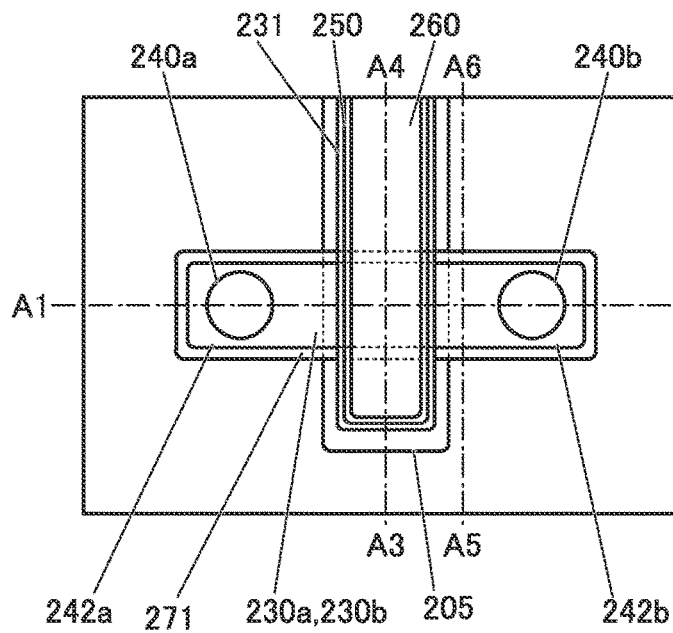
FIG. 19A is a top view illustrating a method for manufacturing a semiconductor device of one embodiment of the present invention.
Figure 19C:
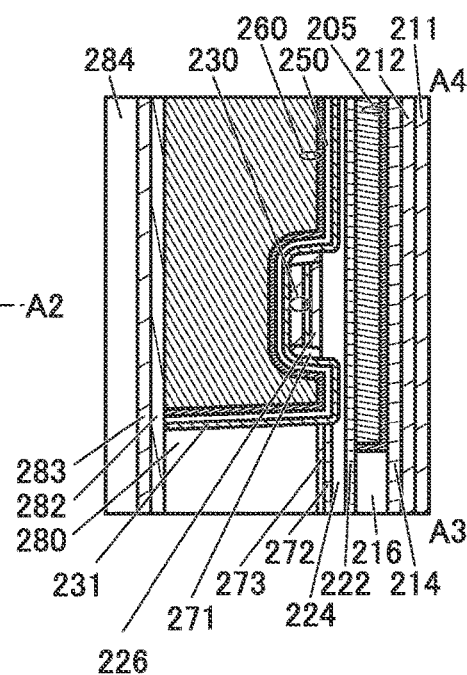
FIG. 19B to FIG. 19D are cross-sectional views illustrating a method for manufacturing a semiconductor device of one embodiment of the present invention.
Figure 19B:
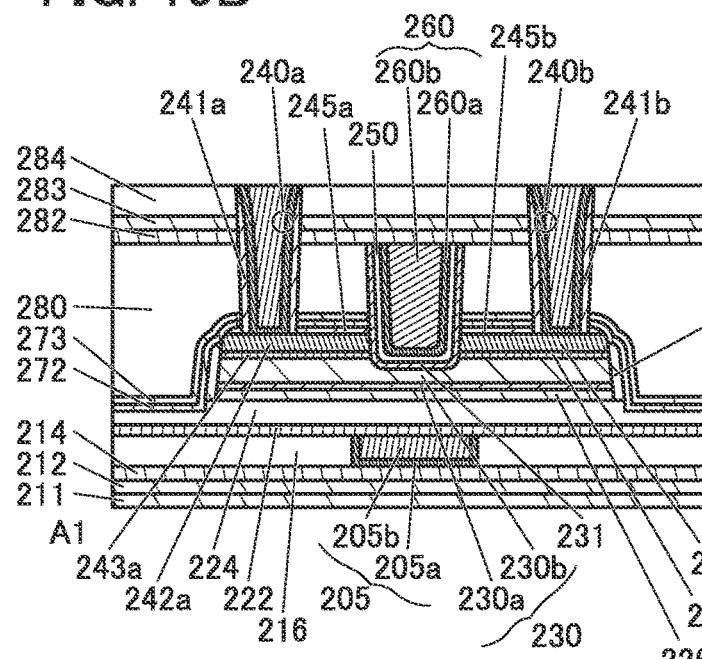
Figure 19D:
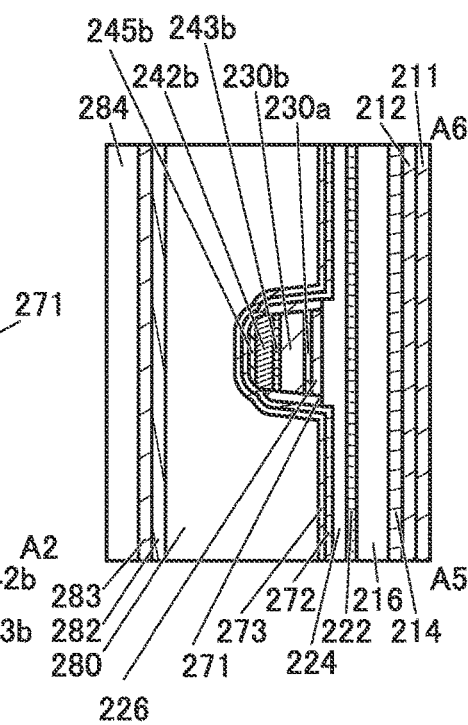

Next, the insulator 282 is formed over the insulator 231, the insulator 250, the conductor 260, and the insulator 280 (see FIG. 18B to FIG. 18D). The insulator 282 can be deposited by a sputtering method, a CVD method, an MBE method, a PLD method, an ALD method, or the like. Aluminum oxide is preferably deposited as the insulator 282 by a sputtering method, for example. When aluminum oxide is used for the insulator 282, part of hydrogen contained in the insulator 280, the insulator 250, the oxide 243, the oxide 271, the oxide 230b, the oxide 230a, and the like is trapped and fixed (also referred to as gettered) in some cases. The insulator 282 is deposited by a sputtering method in an oxygen-containing atmosphere, whereby oxygen can be added to the insulator 280 during the deposition. At this time, the insulator 282 is preferably deposited while the substrate is being heated. It is preferable to form the insulator 282 in contact with the top surface of the conductor 260 because oxygen contained in the insulator 280 can be inhibited from being absorbed by the conductor 260 in a later heat treatment.

Next, the insulator 283 is deposited over the insulator 282 (see FIG. 18B to FIG. 18D). The insulator 283 can be deposited by a sputtering method, a CVD method, an MBE method, a PLD method, an ALD method, or the like. As the insulator 283, silicon nitride or silicon nitride oxide is preferably deposited. In addition, the insulator 283 may have a multilayer structure. For example, silicon nitride may be deposited by a sputtering method and silicon nitride may be formed by a CVD method over the silicon nitride.

Next, heat treatment may be performed. In this embodiment, treatment is performed at 400° C. in a nitrogen atmosphere for one hour. By the heat treatment, oxygen added by the deposition of the insulator 282 is diffused to the insulator 280 and can be supplied to the oxide 230a and the oxide 230b through the insulator 231. Note that the heat treatment is not necessarily performed after the deposition of the insulator 283 and may be performed after the deposition of the insulator 282.

Next, the insulator 284 may be deposited over the insulator 283. The insulator 284 can be deposited by a sputtering method, a CVD method, an MBE method, a PLD method, an ALD method, or the like. Silicon nitride is preferably deposited as the insulator 284 by a sputtering method, for example. As the insulator 284, a silicon oxide film, a silicon oxynitride film, or a silicon nitride oxide film can also be used.

Next, openings reaching the conductor 242a and the conductor 242b are formed in the insulator 245 (the insulator 245a and the insulator 245b), the insulator 272, the insulator 273, the insulator 280, the insulator 282, the insulator 283, and the insulator 284. The openings are formed by a lithography method.

Then, an insulating film to be the insulator 241 (the insulator 241a and the insulator 241b) is deposited and subjected to anisotropic etching, so that the insulator 241 is formed (see FIG. 19A to FIG. 19D). The insulating film can be deposited by a sputtering method, a CVD method, an MBE method, a PLD method, an ALD method, or the like. As the insulating film, an insulating film having a function of inhibiting passage of oxygen is preferably used. For example, silicon nitride or aluminum oxide is preferably deposited using an ALD method (particularly a PEALD method). Silicon nitride is preferable because it has high blocking property against hydrogen. By contrast, aluminum oxide has high blocking properties against oxygen. Therefore, the insulating film can be selected as appropriate according to the required performance of the device.

As an anisotropic etching for the insulating film to be the insulator 241, a dry etching method may be performed, for example. When the insulator 241 is provided on the side wall portions of the openings, passage of oxygen from the outside can be inhibited and oxidation of the conductor 240a and the conductor 240b to be formed next can be prevented. Furthermore, impurities such as water and hydrogen can be prevented from diffusing from the conductor 240a and the conductor 240b to the outside.

Next, a conductive film to be the conductor 240a and the conductor 240b is deposited. The conductive film desirably has a stacked-layer structure that includes a conductor having a function of inhibiting the passage of impurities such as water and hydrogen. For example, a stacked layer of tantalum nitride, titanium nitride, or the like and tungsten, molybdenum, copper, or the like can be employed. The conductive film can be deposited by a sputtering method, a CVD method, an MBE method, a PLD method, an ALD method, or the like.

Then, CMP treatment is performed, thereby removing part of the conductive film to be the conductor 240a and the conductor 240b to expose the insulator 284. As a result, the conductive film remains only in the openings, so that the conductor 240a and the conductor 240b having flat top surfaces can be formed (see FIG. 19A to FIG. 19D). Note that the insulator 284 is partly removed by the CMP treatment in some cases.

Next, a conductive film to be the conductor 246 is deposited. The conductive film can be formed by a sputtering method, a CVD method, an MBE method, a PLD method, an ALD method, or the like.

Then, the conductive film to be the conductor 246 is processed by a lithography method, thereby forming the conductor 246a in contact with the top surface of the conductor 240a and the conductor 246b in contact with the top surface of the conductor 240b (see FIG. 1A to FIG. 1D). At this time, the insulator 284 in a region not overlapping with the conductor 246a and the conductor 246b is sometimes removed.

Next, the insulator 286 is deposited over the conductor 246 and the insulator 284 (see FIG. 1A to FIG. 1D). The insulator 286 can be deposited by a sputtering method, a CVD method, an MBE method, a PLD method, an ALD method, or the like. In addition, the insulator 286 may have a multilayer structure. For example, silicon nitride may be formed by a sputtering method and silicon nitride may be formed by a CVD method over the silicon nitride.

Through the above process, the semiconductor device including the transistor 200 illustrated in FIG. 1A to FIG. 1D can be manufactured. The transistor 200 can be manufactured by using the method for manufacturing the semiconductor device described in this embodiment as illustrated in FIG. 6A to FIG. 19A, FIG. 6B to FIG. 19B, FIG. 6C to FIG. 19C, and FIG. 6D to FIG. 19D.

<Application Examples of Semiconductor Device>

Examples of a semiconductor device including the transistor 200 of one embodiment of the present invention which is different from the semiconductor device described in the above <Structure example of semiconductor device> and the above <Modification example of semiconductor device> will be described below with reference to FIG. 20A and FIG. 20B. Note that in the semiconductor devices illustrated in FIG. 20A and FIG. 20B, structures having the same functions as the structures in the semiconductor device described in <Modification example 2 of semiconductor device> (see FIG. 5A to FIG. 5D) are denoted by the same reference numerals. Note that also in this section, the materials described in detail in <Structure example of semiconductor device> and <Modification example of semiconductor device> can be used as the materials for the transistor 200.

FIG. 20A and FIG. 20B each illustrate a structure in which a plurality of transistors 200_1 to 200_n are sealed with the insulator 283 and the insulator 211. Note that although the transistor 200_1 to the transistor 200_n appear to be arranged in the channel length direction in FIG. 20A and FIG. 20B, the present invention is not limited thereto. The transistor 200_1 to the transistor 200_n may be arranged in the channel width direction or may be arranged in a matrix. Depending on the design, the transistors may be arranged without regularity.

As illustrated in FIG. 20A, a portion where the insulator 283 is in contact with the insulator 211 (hereinafter, sometimes referred to as a sealing portion 265) is formed outside the plurality of transistors 200_1 to 200_n. The sealing portion 265 is formed to surround the plurality of transistors 200_1 to 200_n. Such a structure enables the plurality of transistors 200_1 to 200_n to be surrounded by the insulator 283 and the insulator 211. Thus, a plurality of transistor groups surrounded by the sealing portion 265 are provided over a substrate.

A dicing line (sometimes referred to as a scribe line, a dividing line, or a cutting line) may be provided to overlap with the sealing portion 265. The above substrate is divided at the dicing line, so that the transistor group surrounded by the sealing portion 265 is taken out as one chip.

Although the plurality of transistors 200_1 to 200_n are surrounded by one sealing portion 265 in the example illustrated in FIG. 20A, the present invention is not limited thereto. As illustrated in FIG. 20B, the plurality of transistors 200_1 to 200_n may be surrounded by a plurality of sealing portions. In FIG. 20B, the plurality of transistors 200_1 to 200_n are surrounded by a sealing portion 265a and are further surrounded by an outer sealing portion 265b.

When the plurality of transistors 200_1 to 200_n are surrounded by the plurality of sealing portions in this manner, a portion where the insulator 283 is in contact with the insulator 212 increases, which further can improve adhesion between the insulator 283 and the insulator 212. As a result, the plurality of transistors 200_1 to 200_n can be more reliably sealed.

In that case, a dicing line may be provided to overlap with the sealing portion 265a or the sealing portion 265b, or may be provided between the sealing portion 265a and the sealing portion 265b.

According to one embodiment of the present invention, a semiconductor device with a high on-state current can be provided. Furthermore, with one embodiment of the present invention, a semiconductor device with a small variation in transistor characteristics can be provided. According to another embodiment of the present invention, a semiconductor device with high reliability can be provided. According to another embodiment of the present invention, a semiconductor device with favorable electrical characteristics can be provided. According to another embodiment of the present invention, a semiconductor device that can be miniaturized or highly integrated can be provided. According to another embodiment of the present invention, a semiconductor device with low power consumption can be provided.

The structure, method, and the like described above in this embodiment can be used in an appropriate combination with structures, methods, and the like described in the other embodiments.

Embodiment 2

In this embodiment, one embodiment of a semiconductor device will be described with reference to FIG. 21 to FIG. 26.

[Memory Device 1]

Figure 21:
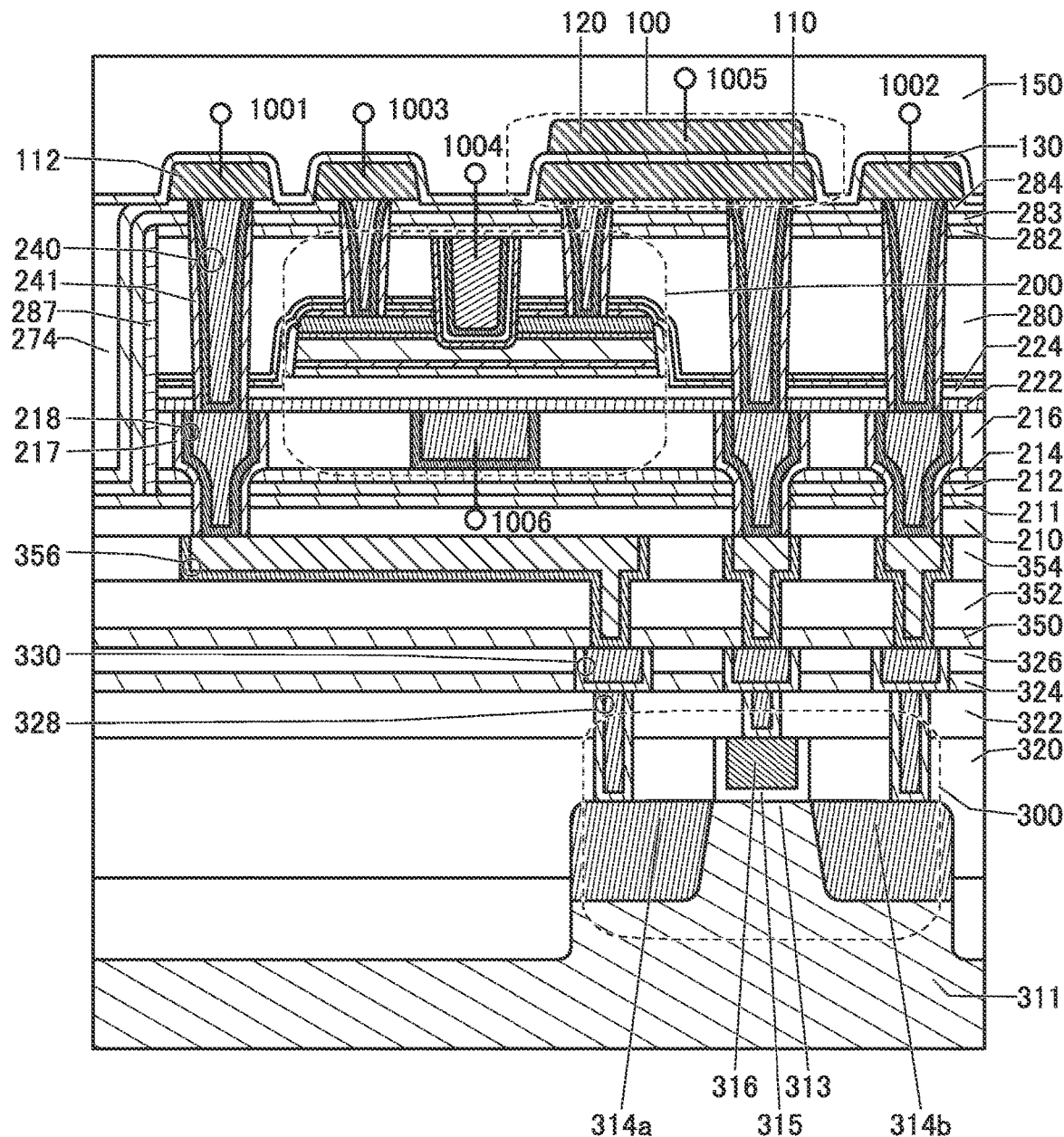
FIG. 21 is a cross-sectional view illustrating a structure of a memory device of one embodiment of the present invention.

An example of a semiconductor device (a memory device) of one embodiment of the present invention is illustrated in FIG. 21. In the semiconductor device of one embodiment of the present invention, the transistor 200 is provided above the transistor 300, and the capacitor 100 is provided above the transistor 300 and the transistor 200. The transistor 200 described in the above embodiment can be used as the transistor 200.

The transistor 200 is a transistor in which a channel is formed in a semiconductor layer including an oxide semiconductor. The off-state current of the transistor 200 is low; thus, by using the transistor 200 in a memory device, stored data can be retained for a long time. In other words, such a memory device does not require refresh operation or has extremely low frequency of the refresh operation, which leads to a sufficient reduction in power consumption of the memory device.

In the semiconductor device illustrated in FIG. 21, a wiring 1001 is electrically connected to a source of the transistor 300, and a wiring 1002 is electrically connected to a drain of the transistor 300. In addition, a wiring 1003 is electrically connected to one of the source and the drain of the transistor 200, a wiring 1004 is electrically connected to the first gate of the transistor 200, and a wiring 1006 is electrically connected to the second gate of the transistor 200. A gate of the transistor 300 and the other of the source and the drain of the transistor 200 are electrically connected to one electrode of the capacitor 100, and a wiring 1005 is electrically connected to the other electrode of the capacitor 100.

By arranging the memory devices illustrated in FIG. 21 in a matrix, a memory cell array can be formed.

<Transistor 300>

The transistor 300 is provided over a substrate 311 and includes a conductor 316 functioning as a gate, an insulator 315 functioning as a gate insulator, a semiconductor region 313 formed of a part of the substrate 311, and a low-resistance region 314*a* and a low-resistance region 314*b* functioning as the source region and the drain region. The transistor 300 may be a p-channel transistor or an n-channel transistor.

In the transistor 300 illustrated in FIG. 21, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting the work function may be used for the conductor 316. Such a transistor 300 is also referred to as a FIN-type transistor because it utilizes a convex portion of a semiconductor substrate. Note that an insulator functioning as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Note that the transistor 300 illustrated in FIG. 21 is an example and the structure is not limited thereto; an appropriate transistor is used in accordance with a circuit structure or a driving method.

<Capacitor 100>

The capacitor 100 is provided above the transistor 200. The capacitor 100 includes a conductor 110 functioning as a first electrode, a conductor 120 functioning as a second electrode, and an insulator 130 functioning as a dielectric. Here, as the insulator 130, the insulator that can be used as the insulator 286 described in the above embodiment is preferably used.

For example, a conductor 112 and the conductor 110 over the conductor 246 can be formed at the same time. Note that the conductor 112 functions as a plug or a wiring that is electrically connected to the capacitor 100, the transistor 200, or the transistor 300.

Although the conductor 112 and the conductor 110 having a single-layer structure are illustrated in FIG. 21, the structure is not limited thereto; a stacked-layer structure of two or more layers may be employed. For example, between a conductor having a barrier property and a conductor having high conductivity, a conductor that is highly adhesive to the conductor having a barrier property and the conductor having high conductivity may be formed.

For the insulator 130, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like is used, and a stacked layer or a single layer can be provided.

For example, for the insulator 130, a stacked-layer structure using a material with high dielectric strength such as silicon oxynitride and a high permittivity (high-k) material is preferably used. In the capacitor 100 having such a structure, a sufficient capacitance can be ensured owing to the high permittivity (high-k) insulator, and the dielectric strength can be increased owing to the insulator with high dielectric strength, so that the electrostatic breakdown of the capacitor 100 can be inhibited.

As the insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like can be given.

As the material having a high dielectric strength (a material having a low relative permittivity), silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like can be given.

<Wiring Layer>

Wiring layers provided with an interlayer film, a wiring, a plug, and the like may be provided between the components. In addition, a plurality of wiring layers can be provided in accordance with design. Here, a plurality of conductors functioning as plugs or wirings are collectively denoted by the same reference numeral in some cases. Furthermore, in this specification and the like, a wiring and a plug electrically connected to the wiring may be a single component. That is, there are cases where part of a conductor functions as a wiring and another part of the conductor functions as a plug.

For example, an insulator 320, an insulator 322, an insulator 324, and the insulator 326 are sequentially stacked over the transistor 300 as interlayer films. A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 function as a plug or a wiring.

The insulators functioning as interlayer films may also function as planarization films that cover uneven shapes therebelow. For example, the top surface of the insulator 322 may be planarized by planarization treatment using a chemical mechanical polishing (CMP) method or the like to improve planarity.

A wiring layer may be provided over the insulator 326 and the conductor 330. For example, in FIG. 21, an insulator 350, an insulator 352, and an insulator 354 are stacked sequentially. Furthermore, a conductor 356 is formed in the insulator 350, the insulator 352, and the insulator 354. The conductor 356 functions as a plug or a wiring.

Similarly, a conductor 218, a conductor (conductor 205) included in the transistor 200, and the like are embedded in an insulator 210, the insulator 211, the insulator 212, the insulator 214, and the insulator 216. Note that the conductor 218 functions as a plug or a wiring that is electrically connected to the capacitor 100 or the transistor 300. In addition, an insulator 150 is provided over the conductor 120 and the insulator 130.

Here, like the insulator 241 described in the above embodiment, an insulator 217 is provided in contact with the side surface of the conductor 218 functioning as a plug. The insulator 217 is provided in contact with the inner wall of the opening formed in the insulator 210, the insulator 211, the insulator 212, the insulator 214, and the insulator 216. That is, the insulator 217 is provided between the conductor 218 and the insulator 210, the insulator 211, the insulator 212, the insulator 214, and the insulator 216. Note that the conductor 205 and the conductor 218 can be formed in parallel; thus, the insulator 217 is sometimes formed in contact with the side surface of the conductor 205.

As the insulator 217, an insulator such as silicon nitride, aluminum oxide, or silicon nitride oxide may be used. Since the insulator 217 is provided in contact with the insulator 211, the insulator 212, the insulator 214, and the insulator 222, the entry of impurities such as water and hydrogen into the oxide 230 through the conductor 218 from the insulator 210, the insulator 216, or the like can be inhibited. In particular, silicon nitride is suitable because of having a high blocking property against hydrogen. Moreover, oxygen contained in the insulator 210 or the insulator 216 can be prevented from being absorbed by the conductor 218.

The insulator 217 can be formed in a manner similar to that of the insulator 241. For example, silicon nitride is deposited by a PEALD method and an opening reaching the conductor 356 is formed by anisotropic etching.

As an insulator that can be used as an interlayer film, an insulating oxide, an insulating nitride, an insulating oxynitride, an insulating nitride oxide, an insulating metal oxide, an insulating metal oxynitride, an insulating metal nitride oxide, or the like is given.

For example, when a material having a low relative permittivity is used for the insulator functioning as an interlayer film, the parasitic capacitance between wirings can be reduced. Thus, a material is preferably selected depending on the function of an insulator.

For example, as the insulator 150, the insulator 210, the insulator 352, the insulator 354, and the like, an insulator having a low relative permittivity is preferably used. For example, the insulator preferably includes silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with a resin, the stacked-layer structure can have thermal stability and a low relative permittivity. Examples of the resin include polyester, polyolefin, polyamide (e.g., nylon and aramid), polyimide, polycarbonate, and acrylic.

When a transistor using an oxide semiconductor is surrounded by an insulator having a function of inhibiting passage of oxygen and impurities such as hydrogen, the electrical characteristics of the transistor can be stable. Thus, the insulator having a function of inhibiting the passage of oxygen and impurities such as hydrogen can be used for the insulator 214, the insulator 211, the insulator 212, the insulator 350, and the like.

As the insulator having a function of inhibiting passage of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum is used. Specifically, as the insulator having a function of inhibiting passage of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; silicon nitride; or the like can be used.

For the conductor that can be used as a wiring or a plug, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. A semiconductor having high electrical conductivity, typified by polycrystalline silicon containing an impurity element such as phosphorus, or silicide such as nickel silicide may be used.

For example, for the conductor 328, the conductor 330, the conductor 356, the conductor 218, the conductor 112, and the like, a single-layer structure or a stacked-layer structure using a conductive material such as a metal material, an alloy material, a metal nitride material, or a metal oxide material that is formed using the above materials can be used. It is preferable to use a high-melting-point material that has both heat resistance and conductivity, such as tungsten or molybdenum, and it is preferable to use tungsten. Alternatively, it is preferable to use a low-resistance conductive material such as aluminum or copper. The use of a low-resistance conductive material can reduce wiring resistance.

<Wiring or Plug in Layer Including Oxide Semiconductor>

In the case where an oxide semiconductor is used in the transistor 200, an insulator including an excess oxygen region is provided in the vicinity of the oxide semiconductor in some cases. In that case, an insulator having a barrier property is preferably provided between the insulator including the excess-oxygen region and a conductor provided in the insulator including the excess-oxygen region.

For example, the insulator 241 is preferably provided between the conductor 240 and the insulator 224 and the insulator 280 that include excess oxygen in FIG. 21. Since the insulator 241 is provided in contact with the insulator 222, the insulator 272, the insulator 273, the insulator 282, the insulator 283, and the insulator 284, the insulator 224 and the transistor 200 can be sealed by the insulators having a barrier property.

That is, the insulator 241 can inhibit excess oxygen contained in the insulator 224 and the insulator 280 from being absorbed by the conductor 240. In addition, diffusion of hydrogen, which is an impurity, into the transistor 200 through the conductor 240 can be inhibited when the insulator 241 is provided.

The insulator 241 is preferably formed using an insulating material having a function of inhibiting diffusion of an impurity such as water or hydrogen and oxygen. For example, silicon nitride, silicon nitride oxide, aluminum oxide, hafnium oxide, or the like is preferably used. In particular, silicon nitride is preferably used because silicon nitride has a high blocking property against hydrogen. Other than that, a metal oxide such as magnesium oxide, gallium oxide, germanium oxide, yttrium oxide, zirconium oxide, lanthanum oxide, neodymium oxide, or tantalum oxide can be used, for example.

As in the above embodiment, the transistor 200 is preferably sealed with the insulator 211, the insulator 212, the insulator 214, the insulator 287, the insulator 282, the insulator 283, and the insulator 284. Such a structure can inhibit entry of hydrogen contained in the insulator 274, the insulator 150, or the like into the insulator 280 or the like.

Here, the conductor 240 penetrates the insulator 284, the insulator 283, and the insulator 282, and the conductor 218 penetrates the insulator 214, the insulator 212, and the insulator 211; however, as described above, the insulator 241 is provided in contact with the conductor 240, and the insulator 217 is provided in contact with the conductor 218. This can reduce the amount of hydrogen entering the inside of the insulator 211, the insulator 212, the insulator 214, the insulator 287, the insulator 282, the insulator 283, and the insulator 284 through the conductor 240 and the conductor 218. In this manner, the transistor 200 is sealed more surely with the insulator 211, the insulator 212, the insulator 214, the insulator 287, the insulator 282, the insulator 283, the insulator 284, the insulator 241, and the insulator 217, so that impurities such as hydrogen contained in the insulator 274 or the like can be inhibited from entering from the outside.

As described in the above embodiment, the insulator 216, the insulator 224, the insulator 280, the insulator 250, and the insulator 274 are preferably formed by the deposition method using the gas in which hydrogen atoms are reduced or removed. Thus, the hydrogen concentrations of the insulator 216, the insulator 224, the insulator 280, the insulator 250, and the insulator 274 can be lowered.

In this manner, the hydrogen concentration of silicon-based insulating films in the vicinity of the transistor 200 can be reduced; thus, the hydrogen concentration of the oxide 230 can be reduced.

<Dicing Line>

A dicing line (referred to as a scribe line, a dividing line, or a cutting line in some cases) which is provided when a large-sized substrate is divided into semiconductor elements so that a plurality of semiconductor devices are each formed in a chip form is described below. Examples of a dividing method include the case where a groove (a dicing line) for dividing the semiconductor elements is formed on the substrate, and then the substrate is cut along the dicing line to divide (split) it into a plurality of semiconductor devices.

Here, for example, as illustrated in FIG. 21, it is preferable that a region in which the insulator 283 and the insulator 211 are in contact with each other overlap with the dicing line. That is, an opening is provided in the insulator 282, the insulator 280, the insulator 273, the insulator 272, the insulator 224, the insulator 222, the insulator 216, the insulator 214, and the insulator 212 in the vicinity of a region to be the dicing line that is provided on an outer edge of the memory cell including the plurality of transistors 200.

That is, in the opening provided in the insulator 282, the insulator 280, the insulator 273, the insulator 272, the insulator 224, the insulator 222, the insulator 216, the insulator 214, and the insulator 212, the insulator 211 is in contact with the insulator 283. Alternatively, a structure in which an opening is provided in the insulator 282, the insulator 280, the insulator 273, the insulator 272, the insulator 224, the insulator 222, the insulator 216, and the insulator 214, and the insulator 212 and the insulator 283 are in contact with each other, may be employed. For example, the insulator 212 and the insulator 283 may be formed using the same material and the same method. When the insulator 212 and the insulator 283 are formed using the same material and the same method, the adhesion therebetween can be increased. For example, silicon nitride is preferably used.

With such a structure, the transistor 200 can be surrounded by the insulator 211, the insulator 212, the insulator 214, the insulator 287, the insulator 282, the insulator 283, and the insulator 284. Since at least one of the insulator 211, the insulator 212, the insulator 214, the insulator 287, the insulator 282, the insulator 283, and the insulator 284 have a function of inhibiting diffusion of oxygen, hydrogen, and water, even when the substrate is divided into circuit regions each of which is provided with the semiconductor elements described in this embodiment to be processed into a plurality of chips, the entry and diffusion of impurities such as hydrogen and water from the direction of a side surface of the divided substrate to the transistor 200 can be inhibited.

With the structure, excess oxygen in the insulator 280 and the insulator 224 can be prevented from diffusing to the outside. Accordingly, excess oxygen in the insulator 280 and the insulator 224 is efficiently supplied to the oxide where the channel is formed in the transistor 200. The oxygen can reduce oxygen vacancies in the oxide where the channel is formed in the transistor 200. Thus, the oxide where the channel is formed in the transistor 200 can be an oxide semiconductor with a low density of defect states and stable characteristics. That is, the transistor 200 can have a small variation in the electrical characteristics and higher reliability.

Figure 22:
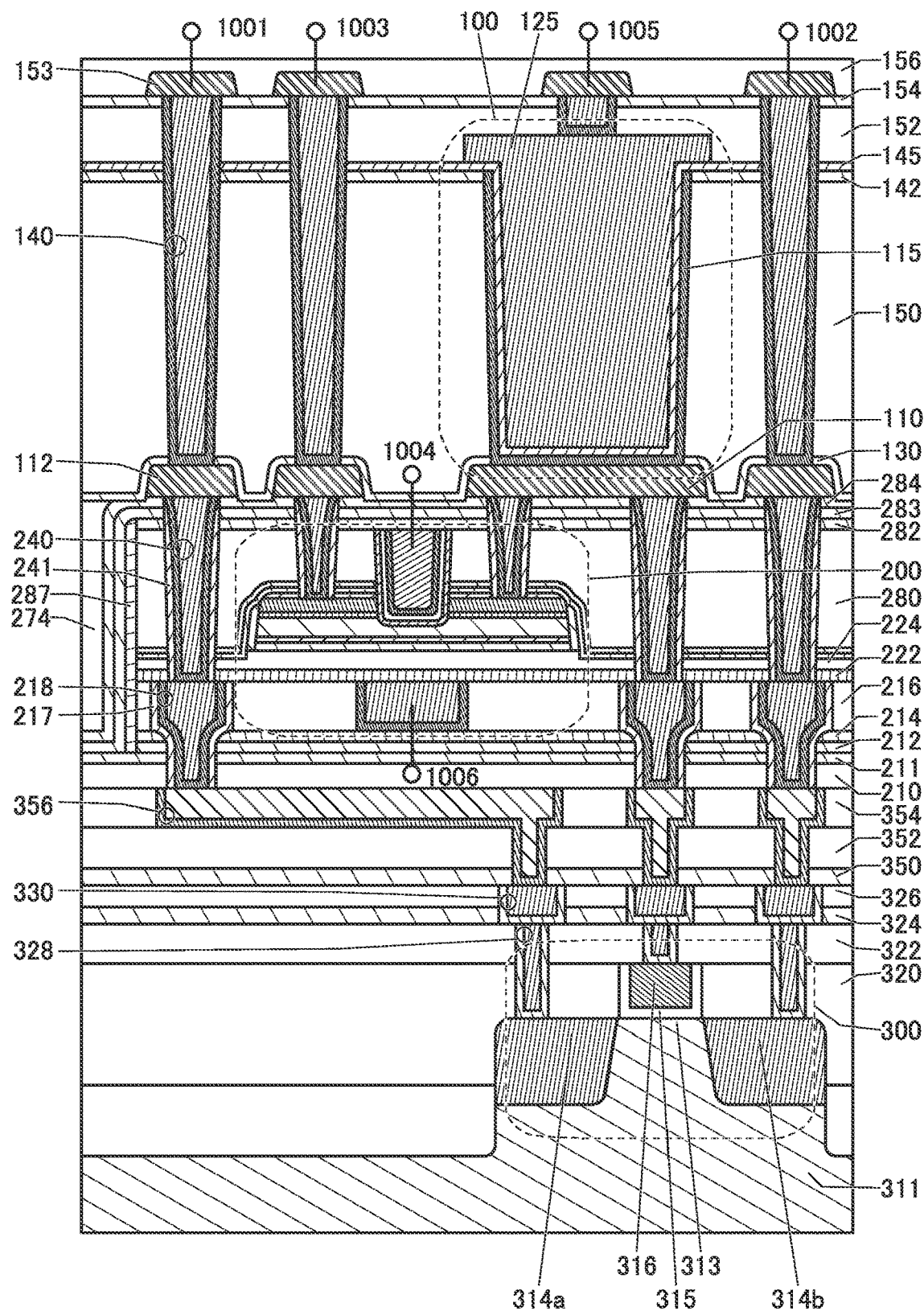
FIG. 22 is a cross-sectional view illustrating a structure of a memory device of one embodiment of the present invention.

Note that although the capacitor 100 of the memory device illustrated in FIG. 21 has a planar shape, the memory device described in this embodiment is not limited thereto. For example, the capacitor 100 may have a cylindrical shape as illustrated in FIG. 22. Note that the structure below and including the insulator 150 of a memory device illustrated in FIG. 22 is similar to that of the semiconductor device illustrated in FIG. 21.

The capacitor 100 illustrated in FIG. 22 includes the insulator 150 over the insulator 130, an insulator 142 over the insulator 150, a conductor 115 positioned in an opening formed in the insulator 150 and the insulator 142, an insulator 145 over the conductor 115 and the insulator 142, a conductor 125 over the insulator 145, and an insulator 152 over the conductor 125 and the insulator 145. Here, at least parts of the conductor 115, the insulator 145, and the conductor 125 are positioned in the opening formed in the insulator 150 and the insulator 142.

The conductor 115 functions as a lower electrode of the capacitor 100, the conductor 125 functions as an upper electrode of the capacitor 100, and the insulator 145 functions as a dielectric of the capacitor 100. The capacitor 100 has a structure in which the upper electrode and the lower electrode face each other with the dielectric positioned therebetween on a side surface as well as a bottom surface of the opening in the insulator 150 and the insulator 142; thus, the capacitance per unit area can be increased. Thus, the deeper the opening is, the larger the capacitance of the capacitor 100 can be. Increasing the capacitance per unit area of the capacitor 100 in this manner can promote miniaturization or higher integration of the semiconductor device.

An insulator that can be used as the insulator 280 can be used as the insulator 152. The insulator 142 preferably functions as an etching stopper at the time of forming the opening in the insulator 150 and is formed using an insulator that can be used as the insulator 214.

The shape of the opening formed in the insulator 150 and the insulator 142 when seen from above may be a quadrangular shape, a polygonal shape other than a quadrangular shape, a polygonal shape with rounded corners, or a circular shape including an elliptical shape. Here, the area where the opening and the transistor 200 overlap with each other is preferably large in the top view. Such a structure can reduce the area occupied by the semiconductor device including the capacitor 100 and the transistor 200.

The conductor 115 is positioned in contact with the opening formed in the insulator 142 and the insulator 150. A top surface of the conductor 115 is preferably substantially level with a top surface of the insulator 142. Furthermore, a bottom surface of the conductor 115 is in contact with the conductor 110 through an opening in the insulator 130. The conductor 115 is preferably deposited by an ALD method, a CVD method, or the like; for example, a conductor that can be used as the conductor 205 is used.

The insulator 145 is positioned to cover the conductor 115 and the insulator 142. The insulator 145 is preferably deposited by an ALD method or a CVD method, for example. The insulator 145 can be provided to have stacked layers or a single layer using, for example, silicon oxide, silicon oxynitride, silicon nitride oxide, silicon nitride, zirconium oxide, aluminum oxide, aluminum oxynitride, aluminum nitride oxide, aluminum nitride, hafnium oxide, hafnium oxynitride, hafnium nitride oxide, or hafnium nitride. As the insulator 145, an insulating film in which zirconium oxide, aluminum oxide, and zirconium oxide are stacked in this order can be used, for example.

For the insulator 145, a material with high dielectric strength, such as silicon oxynitride, or a high permittivity (high-k) material is preferably used. Alternatively, a stacked-layer structure using a material with high dielectric strength and a high permittivity (high-k) material may be employed.

As an insulator of a high permittivity (high-k) material (a material having a high relative permittivity), gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like can be given. The use of such a high-k material can ensure sufficient capacitance of the capacitor 100 even when the insulator 145 has a large thickness. When the insulator 145 has a large thickness, leakage current generated between the conductor 115 and the conductor 125 can be inhibited.

Examples of a material with high dielectric strength include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin. For example, it is possible to use an insulating film in which silicon nitride ($SiN_x$) deposited by an ALD method, silicon oxide ($SiO_x$) deposited by a PEALD method, and silicon nitride ($SiN_x$) deposited by an ALD method are stacked in this order. The use of such an insulator with high dielectric strength can increase the dielectric strength and inhibit electrostatic breakdown of the capacitor 100.

The conductor 125 is positioned to fill the opening formed in the insulator 142 and the insulator 150. The conductor 125 is electrically connected to the wiring 1005 through a conductor 140 and a conductor 153. The conductor 125 is preferably deposited by an ALD method, a CVD method, or the like and is formed using a conductor that can be used as the conductor 205, for example.

The conductor 153 is provided over an insulator 154 and is covered with an insulator 156. The conductor 153 is formed using a conductor that can be used as the conductor 112, and the insulator 156 is formed using an insulator that can be used as the insulator 152. Here, the conductor 153 is in contact with a top surface of the conductor 140 and functions as a terminal of the capacitor 100, the transistor 200, or the transistor 300.

[Memory Device 2]

Figure 23A:
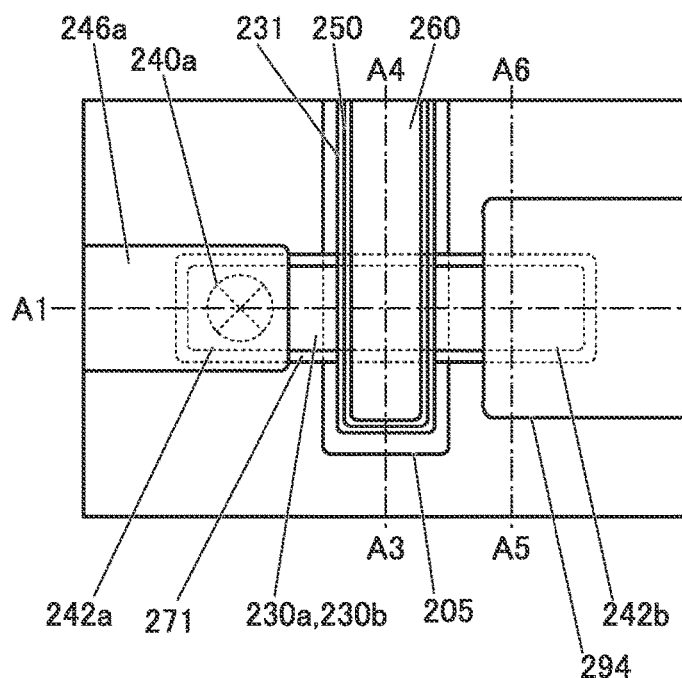
FIG. 23A is a top view of a semiconductor device of one embodiment of the present invention.
Figure 23C:
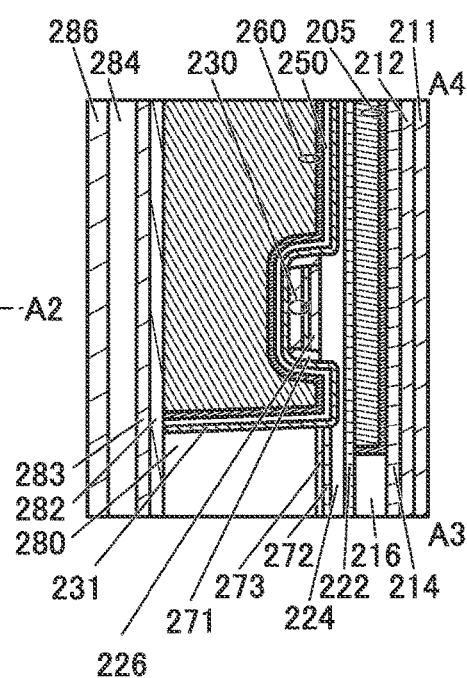
FIG. 23B to FIG. 23D are cross-sectional views of a semiconductor device of one embodiment of the present invention.
Figure 23B:
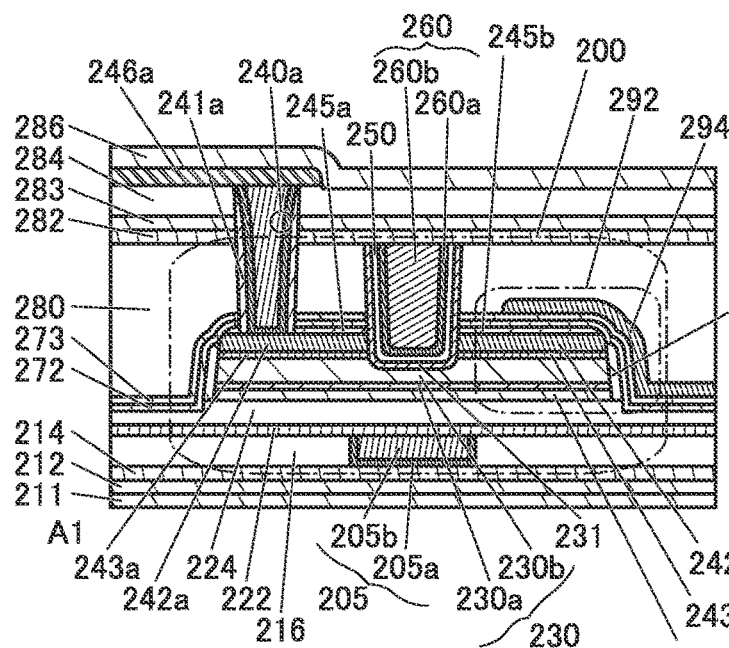
Figure 23D:
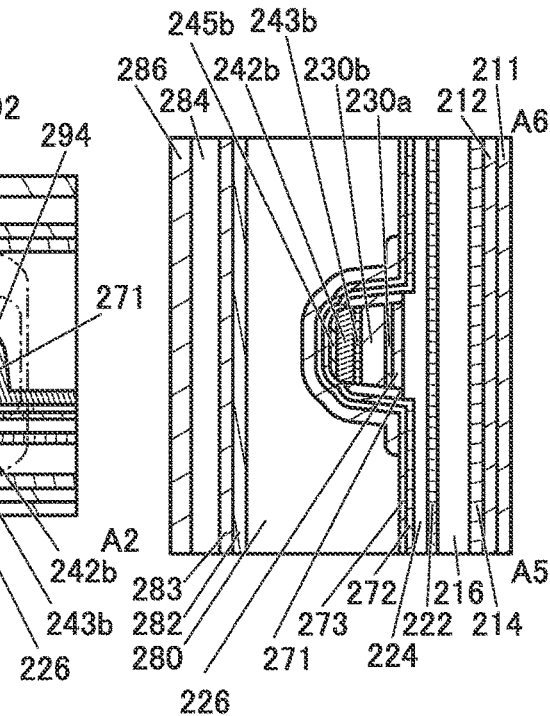

FIG. 23A to FIG. 23D illustrate an example of a semiconductor device (memory device) of one embodiment of the present invention. FIG. 23A is a top view of the semiconductor device. FIG. 23B to FIG. 23D are cross-sectional views of the semiconductor device. Here, FIG. 23B is a cross-sectional view of a portion indicated by a dashed-dotted line A1-A2 in FIG. 23A, and is a cross-sectional view in the channel length direction of the transistor 200. FIG. 23C is a cross-sectional view of a portion indicated by a dashed-dotted line A3-A4 in FIG. 23A, and is a cross-sectional view in the channel width direction of the transistor 200. FIG. 23D is a cross-sectional view of a portion indicated by dashed-dotted line A5-A6 in FIG. 23A. Note that for clarity of the drawing, some components are not illustrated in the top view of FIG. 23A.

<Structure Example of Memory Device>

FIG. 23A to FIG. 23D are a top view and cross-sectional views of a semiconductor device including a memory device 290. The memory device 290 illustrated in FIG. 23A to FIG. 23D includes a capacitor device 292 in addition to the transistor 200 illustrated in FIG. 1A to FIG. 1D.

The capacitor device 292 includes the conductor 242b, the insulator 245b, the insulator 272, and the insulator 273 provided over the conductor 242b, and a conductor 294 provided over the insulator 273. In other words, the capacitor device 292 forms a MIM (Metal-Insulator-Metal) capacitor. Note that one of a pair of electrodes included in the capacitor device 292, i.e., the conductor 242b, can also serve as the source electrode of the transistor. The dielectric layer included in the capacitor device 292 can also serve as a protective layer provided in the transistor, i.e., the insulator 245*b*, the insulator 272, and the insulator 273. Thus, the manufacturing process of the capacitor device 292 can also serve as part of the manufacturing process of the transistor; therefore, the productivity of the semiconductor device can be improved. Furthermore, one of a pair of electrodes included in the capacitor device 292, that is, the conductor 242*b*, also serves as the source electrode of the transistor; therefore, the area in which the transistor and the capacitor device are positioned can be reduced.

Note that the conductor 294 can be formed using, for example, a material that can be used for the conductor 242.

<Modification Example of Memory Device>

Examples of the semiconductor device of one embodiment of the present invention including the transistor 200 (a transistor 200*a* and a transistor 200*b*) and the capacitor device 292 (a capacitor device 292*a* and a capacitor device 292*b*) that are different from that described in <Structure example of memory device> above are described below with reference to FIG. 24A, FIG. 24B, FIG. 25, and FIG. 26. Note that in the semiconductor devices illustrated in FIG. 24A, FIG. 24B, FIG. 25, and FIG. 26, structures having the same function as those included in the semiconductor device described in the above embodiment and <Structure example of memory device> (see FIG. 23A to FIG. 23D) are denoted by the same reference numerals. Note that the materials described in detail in the above embodiment and <Structure example of memory device> can be used as constituent materials of the transistor 200 and the capacitor device 292 in this section.

<<Modification Example 1 of Memory Device>>

An example of a semiconductor device 600 of one embodiment of the present invention including the transistor 200 (the transistor 200*a* and the transistor 200*b*) and the capacitor device 292 (the capacitor device 292*a* and the capacitor device 292*b*) is described below with reference to FIG. 24A.

FIG. 24A is a cross-sectional view of the semiconductor device 600 including the transistor 200*a*, the transistor 200*b*, the capacitor device 292*a*, and the capacitor device 292*b* in the channel length direction. The semiconductor device 600 has a line-symmetric structure with respect to the dashed-dotted line A3-A4 as illustrated in FIG. 24A. A conductor 242*c* also serves as one of a source electrode and a drain electrode of the transistor 200*a* and one of a source electrode and a drain electrode of the transistor 200*b*. The conductor 240 functioning as a plug also makes connection of the conductor 246 functioning as a wiring to the transistor 200*a* and the transistor 200*b*. Accordingly, when the connection of the two transistors, the two capacitor devices, the wiring, and the plug have the above-described structure, a semiconductor device that can be miniaturized or highly integrated can be provided.

For the structures and effects of the transistor 200*a*, the transistor 200*b*, the capacitor device 292*a*, and the capacitor device 292*b*, the structure examples of the semiconductor devices illustrated in FIG. 1A to FIG. 1D and FIG. 23A to FIG. 23D can be referred to.

<<Modification Example 2 of Memory Device>>

In the above description, the semiconductor device including the transistor 200*a*, the transistor 200*b*, the capacitor device 292*a*, and the capacitor device 292*b* is given as a structural example; however, the semiconductor device according to this present embodiment is not limited thereto. For example, as illustrated in FIG. 24B, a structure in which the semiconductor device 600 and a semiconductor device having a structure similar to that of the semiconductor device 600 are connected through a capacitor portion may be employed. Note that in this specification, the semiconductor device including the transistor 200*a*, the transistor 200*b*, the capacitor device 292*a*, and the capacitor device 292*b* is referred to as a cell. For the structures of the transistor 200*a*, the transistor 200*b*, the capacitor device 292*a*, and the capacitor device 292*b*, the description of the transistor 200*a*, the transistor 200*b*, the capacitor device 292*a*, and the capacitor device 292*b* above can be referred to.

FIG. 24B is a cross-sectional view in which the semiconductor device 600 including the transistor 200*a*, the transistor 200*b*, the capacitor device 292*a*, and the capacitor device 292*b*, and a cell having a structure similar to that of the semiconductor device 600 are connected through the capacitor portion.

As illustrated in FIG. 24B, a conductor 294*b* functioning as one electrode of the capacitor device 292*b* included in the semiconductor device 600 also serves as one electrode of a capacitor device included in a semiconductor device 601 having a structure similar to that of the semiconductor device 600. Although not illustrated, a conductor 294*a* functioning as one electrode of the capacitor device 292*a* included in the semiconductor device 600 also serves as one electrode of a capacitor device included in a semiconductor device on the left side of the semiconductor device 600, that is, a semiconductor device adjacent to the semiconductor device 600 in the A1 direction in FIG. 24B. The cell on the right side of the semiconductor device 601, that is, the cell in the A2 direction in FIG. 24B, has a similar structure. That is, a cell array (also referred to as a memory device layer) can be formed. With this structure of the cell array, the space between the adjacent cells can be reduced; thus, the projected area of the cell array can be reduced and high integration can be achieved. When the cells illustrated in FIG. 24B are arranged in a matrix, a matrix-shape cell array can be formed.

When the transistor 200*a*, the transistor 200*b*, the capacitor device 292*a*, and the capacitor device 292*b* are formed to have the structures described in this embodiment as described above, the area of the cell can be reduced and the semiconductor device including a cell array can be miniaturized or highly integrated.

Figure 25:
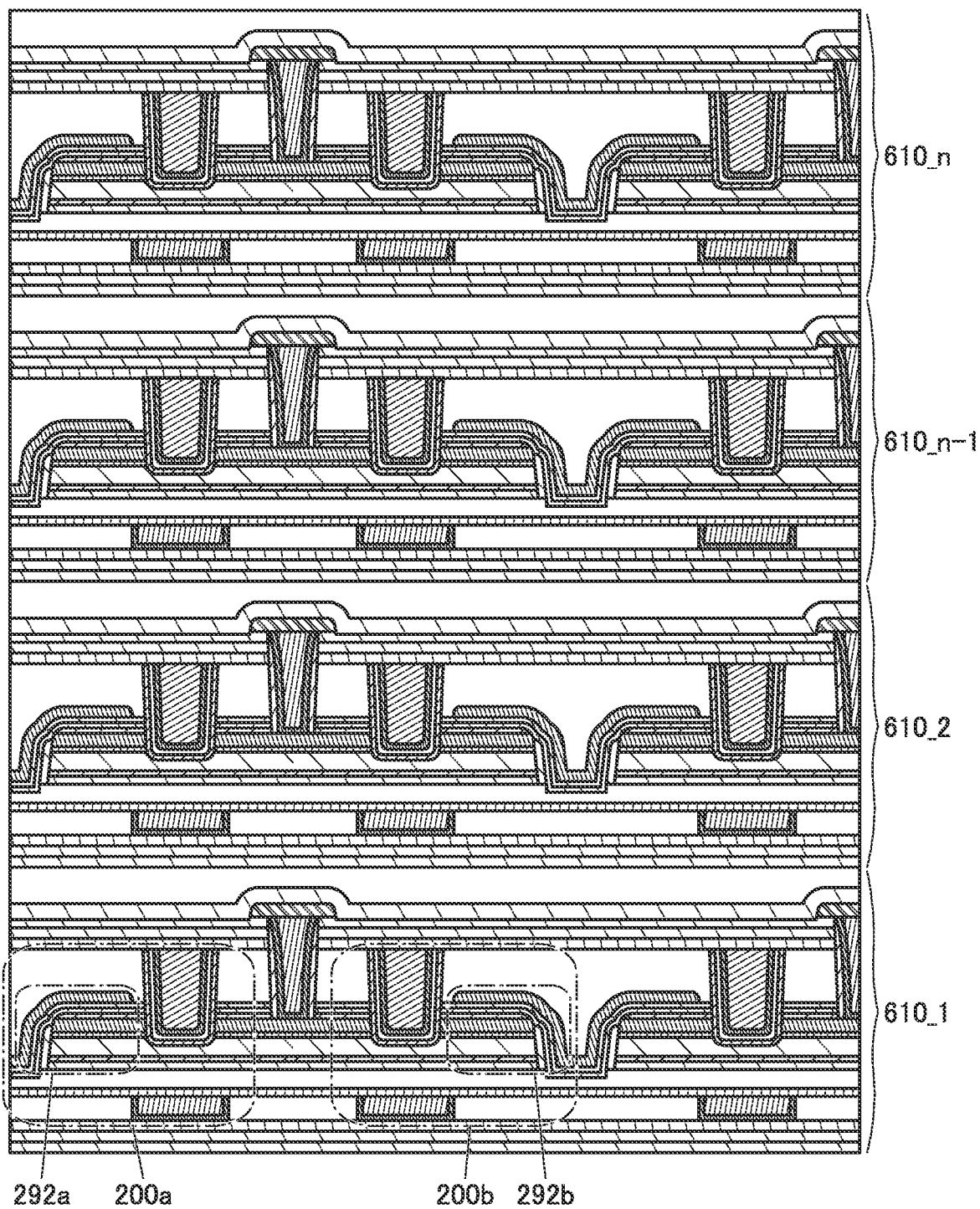
FIG. 25 is a cross-sectional view of a semiconductor device of one embodiment of the present invention.

Furthermore, the cell array may have a stacked-layer structure instead of a single-layer structure. FIG. 25 illustrates a cross-sectional view of n layers of cell arrays 610 that are stacked. When a plurality of cell arrays (a cell array 610_1 to a cell array 610_*n*) are stacked as illustrated in FIG. 25, cells can be integrally positioned without increasing the area occupied by the cell arrays. In other words, a 3D cell array can be formed.

<<Modification Example 3 of Memory Device>>

Figure 26:
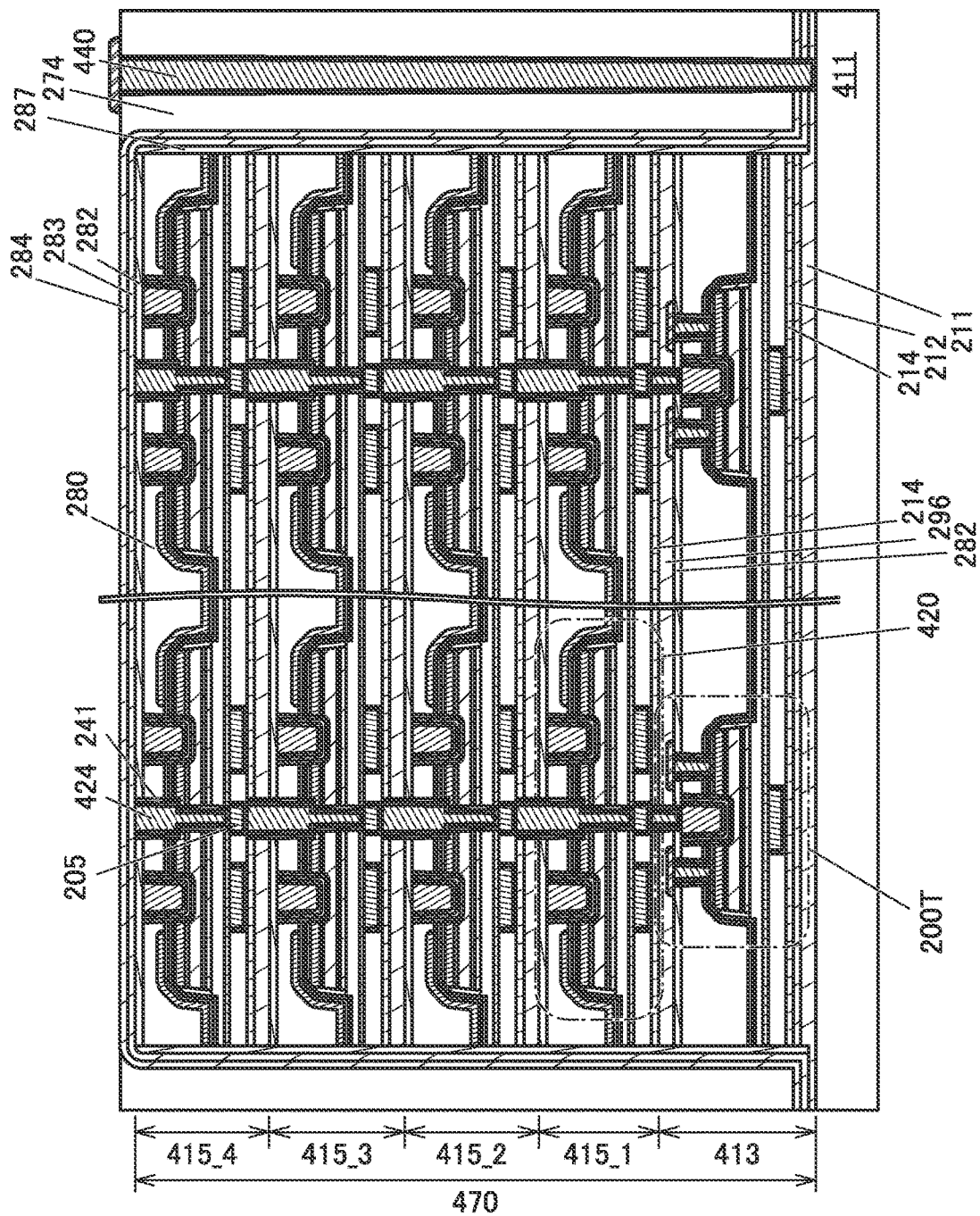
FIG. 26 is a cross-sectional view of a semiconductor device of one embodiment of the present invention.

FIG. 26 illustrates an example in which a memory unit 470 includes a transistor layer 413 including a transistor 200T and a memory device layer 415 of four layers (a memory device layer 415_1 to a memory device layer 415_4).

The memory device layer 415_1 to the memory device layer 415_4 each include a plurality of memory devices 420.

The memory device 420 is electrically connected to the memory device 420 included in a different memory device layer 415 and the transistor 200T included in the transistor layer 413 through a conductor 424 and the conductor 205.

The memory unit 470 is sealed by the insulator 211, the insulator 212, the insulator 214, the insulator 287, the insulator 282, the insulator 283, and the insulator 284 (such a structure is referred to as a sealing structure below for convenience). For the detailed description of the sealing structure, the description of the semiconductor device described in <<Modification example 2 of semiconductor device>> (see FIG. 5A to FIG. 5D) can be referred to. The insulator 274 is provided in the periphery of the insulator 284. A conductor 440 is provided in the insulator 274, the insulator 284, the insulator 283, and the insulator 211, and is electrically connected to an element layer 411.

The insulator 280 is provided in the sealing structure. The insulator 280 has a function of releasing oxygen by heating. Alternatively, the insulator 280 includes an excess oxygen region.

It is preferable that the insulator 211, the insulator 283, and the insulator 284 be formed using a material having a high blocking property against hydrogen. It is preferable that the insulator 214, the insulator 282, and the insulator 287 be formed using a material having a function of trapping or fixing hydrogen.

Examples of the material having a high blocking property against hydrogen include silicon nitride and silicon nitride oxide. Examples of the material having a function of trapping or fixing hydrogen include aluminum oxide, hafnium oxide, and an oxide containing aluminum and hafnium (hafnium aluminate).

A barrier property in this specification means a function of inhibiting diffusion of a targeted substance (also referred to as having lower permeability). Alternatively, a barrier property in this specification means a function of trapping or fixing (also referred to as gettering) a targeted substance.

For the crystal structure of materials used for the insulator 211, the insulator 212, the insulator 214, the insulator 287, the insulator 282, the insulator 283, and the insulator 284, an amorphous or crystal structure may be employed, although the crystal structure is not limited thereto. For example, it is preferable to use an amorphous aluminum oxide film for the material having a function of trapping or fixing hydrogen. Amorphous aluminum oxide may trap or fix hydrogen more than aluminum oxide with high crystallinity.

Here, the following model can be given for the reaction of excess oxygen in the insulator 280 with hydrogen diffused from an oxide semiconductor in contact with the insulator 280.

Hydrogen in the oxide semiconductor diffuses to other structure bodies through the insulator 280 in contact with the oxide semiconductor. When the hydrogen diffuses through the insulator 280, it reacts with excess oxygen in the insulator 280 and an OH bond is generated to diffuse through the insulator 280. The hydrogen atom having the OH bond reacts with the oxygen atom bonded to an atom (such as a metal atom) in the insulator 282 in reaching a material having a function of trapping or fixing hydrogen (typically the insulator 282), and is trapped or fixed in the insulator 282. The oxygen atom which had the OH bond of the excess oxygen may remain as an excess oxygen in the insulator 280. That is, it is highly probable that the excess oxygen in the insulator 280 serves as a bridge in the diffusion of the hydrogen.

A manufacturing process of the semiconductor device is one of important factors for the model.

For example, the insulator 280 containing excess oxygen is formed over the oxide semiconductor, and then the insulator 282 is formed. After that, heat treatment is preferably performed. The heat treatment is performed at 350° C. or higher, preferably 400° C. or higher under an atmosphere containing oxygen, an atmosphere containing nitrogen, or a mixed atmosphere of oxygen and nitrogen. The heat treatment is performed for one hour or more, preferably four hours or more, further preferably eight hours or more.

The heat treatment enables diffusion of hydrogen from the oxide semiconductor to the outside through the insulator 280, the insulator 282, and the insulator 287. That is, the absolute amount of hydrogen in and near the oxide semiconductor can be reduced.

The insulator 283 and the insulator 284 are formed after the heat treatment. The insulator 283 and the insulator 284 are formed using materials having a high blocking property against hydrogen; therefore the insulator 283 and the insulator 284 can inhibit the entry of hydrogen in the outside or hydrogen which has been diffused to the outside into the inside, specifically, the oxide semiconductor or insulator 280 side.

An example where the heat treatment is performed after the insulator 282 is formed is shown; however, one embodiment of the present invention is not limited thereto. For example, the heat treatment may be performed after the formation of the transistor layer 413 or after the formation of each of the memory device layer 415_1 to the memory device layer 415_3. When hydrogen is diffused outward by the heat treatment, hydrogen is diffused into an upper area of the transistor layer 413 or in a lateral direction of the transistor layer 413. Similarly, in the case where heat treatment is performed after the formation of each of the memory device layer 415_1 to the memory device layer 415_3, hydrogen is diffused into an upper area or in a lateral direction.

With the above manufacturing process, the sealing structure mentioned above can be formed by bonding the insulator 211 and the insulator 283.

With the above-described structure and the above-described manufacturing process, a semiconductor device using an oxide semiconductor with reduced hydrogen concentration can be provided. Accordingly, a semiconductor device with high reliability can be provided. According to another embodiment of the present invention, a semiconductor device having favorable electrical characteristics can be provided.

The structures, methods, and the like described in this embodiment can be used in combination as appropriate with the structures, configurations, methods, and the like described in the other embodiments.

Embodiment 3

In this embodiment, a memory device of one embodiment of the present invention including a transistor in which an oxide is used as a semiconductor (hereinafter referred to as an OS transistor in some cases) and a capacitor is used (hereinafter referred to as an OS memory device in some cases), is described with reference to FIG. 27A, FIG. 27B, and FIG. 28A to FIG. 28H. The OS memory device is a memory device including at least a capacitor and the OS transistor that controls the charging and discharging of the capacitor. Since the OS transistor has an extremely low off-state current, the OS memory device has excellent retention characteristics and thus can function as a nonvolatile memory.

<Structure Example of Memory Device>

Figure 27A:
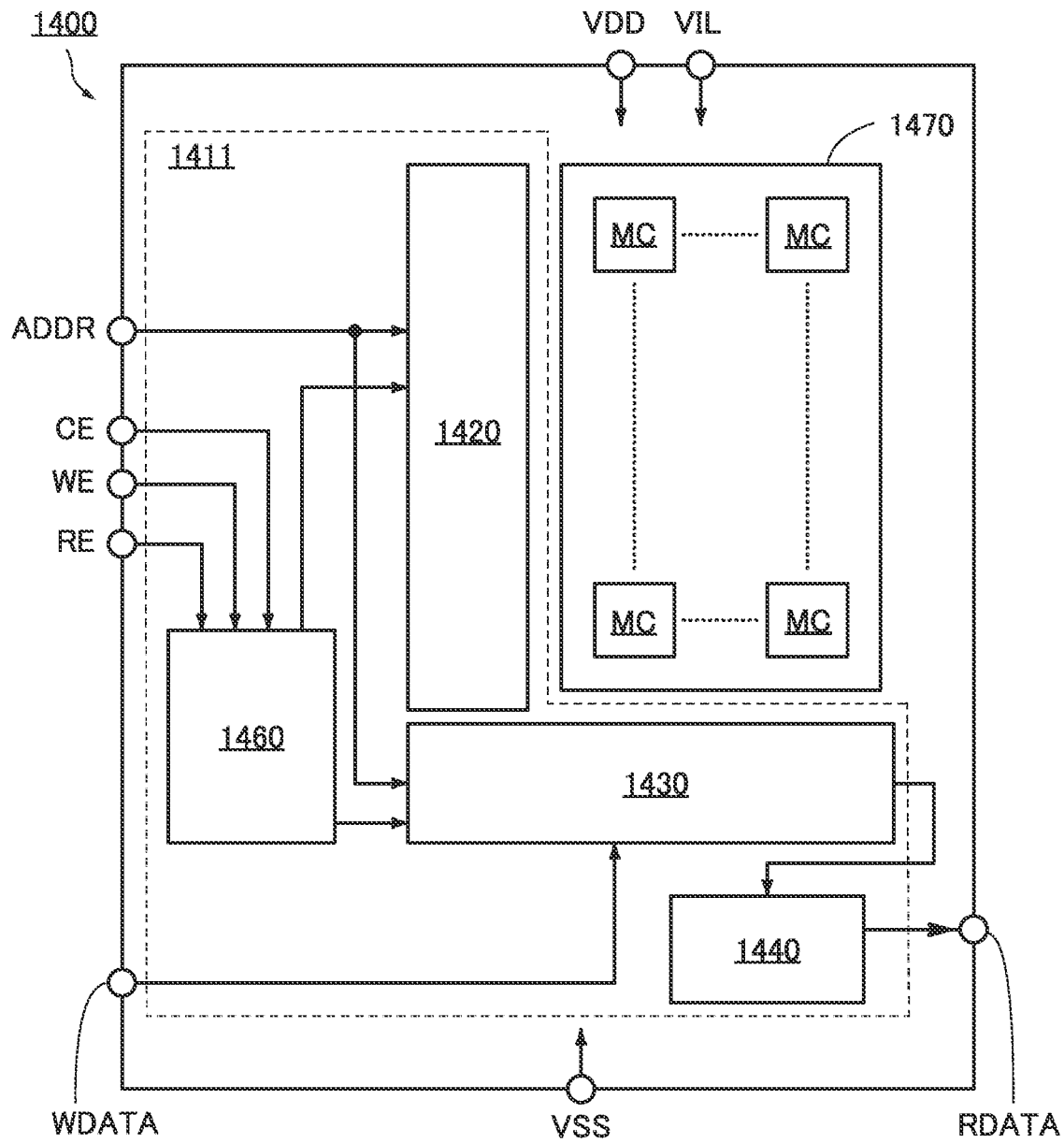
FIG. 27A is a block diagram illustrating a structure example of a memory device of one embodiment of the present invention.

FIG. 27A illustrates a structure example of the OS memory device. A memory device 1400 includes a peripheral circuit 1411 and a memory cell array 1470. The peripheral circuit 1411 includes a row circuit 1420, a column circuit 1430, an output circuit 1440, and a control logic circuit 1460.

The column circuit 1430 includes, for example, a column decoder, a precharge circuit, a sense amplifier, a write circuit, and the like. The precharge circuit has a function of precharging wirings. The sense amplifier has a function of amplifying a data signal read from a memory cell. Note that the wirings are connected to the memory cell included in the memory cell array 1470, and are described later in detail. The amplified data signal is output as a data signal RDATA to the outside of the memory device 1400 through the output circuit 1440. The row circuit 1420 includes, for example, a row decoder and a word line driver circuit, and can select a row to be accessed.

As power supply voltages from the outside, a low power supply voltage (VSS), a high power supply voltage (VDD) for the peripheral circuit 1411, and a high power supply voltage (VIL) for the memory cell array 1470 are supplied to the memory device 1400. Control signals (CE, WE, and RE), an address signal ADDR, and a data signal WDATA are also input to the memory device 1400 from the outside. The address signal ADDR is input to the row decoder and the column decoder, and the data signal WDATA is input to the write circuit.

The control logic circuit 1460 processes the control signals (CE, WE, and RE) input from the outside, and generates control signals for the row decoder and the column decoder. The control signal CE is a chip enable signal, the control signal WE is a write enable signal, and the control signal RE is a read enable signal. Signals processed by the control logic circuit 1460 are not limited thereto, and other control signals are input as necessary.

The memory cell array 1470 includes a plurality of memory cells MC arranged in a matrix and a plurality of wirings. Note that the number of the wirings that connect the memory cell array 1470 to the row circuit 1420 depends on the structure of the memory cell MC, the number of the memory cells MC in a column, and the like. The number of the wirings that connect the memory cell array 1470 to the column circuit 1430 depends on the structure of the memory cell MC, the number of the memory cells MC in a row, and the like.

Figure 27B:
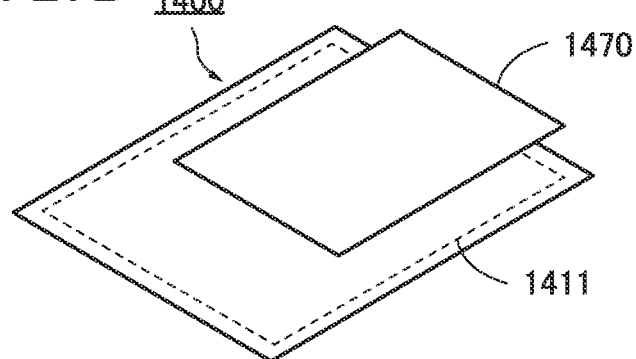
FIG. 27B is a schematic diagram illustrating a structure example of a memory device of one embodiment of the present invention.

Note that FIG. 27A illustrates an example in which the peripheral circuit 1411 and the memory cell array 1470 are formed on the same plane; however, this embodiment is not limited thereto. For example, as illustrated in FIG. 27B, the memory cell array 1470 may be provided to overlap part of the peripheral circuit 1411. For example, the sense amplifier may be provided below the memory cell array 1470 so that they overlap with each other.

FIG. 28A to FIG. 28H illustrate structure examples of a memory cell applicable to the memory cell MC.

[DOSRAM]

Figure 28A:
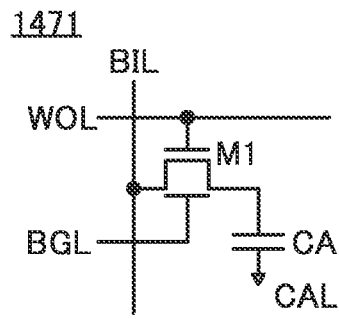
FIG. 28A to FIG. 28H are circuit diagrams illustrating structure examples of a memory device of one embodiment of the present invention.
Figure 28B:
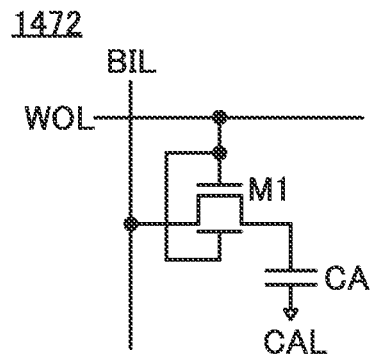
Figure 28C:
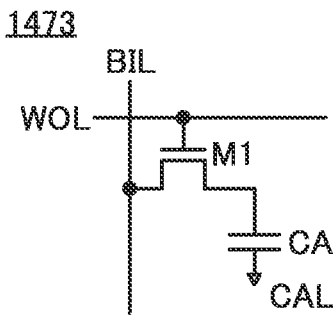

FIG. 28A to FIG. 28C illustrate circuit structure examples of a memory cell of a DRAM. In this specification and the like, a DRAM using a memory cell including one OS transistor and one capacitor is referred to as a DOSRAM (Dynamic Oxide Semiconductor Random Access Memory) in some cases. A memory cell 1471 illustrated in FIG. 28A includes a transistor M1 and a capacitor CA. Note that the transistor M1 includes a gate (also referred to as a top gate in some cases) and a back gate.

A first terminal of the transistor M1 is connected to a first terminal of the capacitor CA, a second terminal of the transistor M1 is connected to a wiring BIL, the gate of the transistor M1 is connected to a wiring WOL, and the back gate of the transistor M1 is connected to a wiring BGL. A second terminal of the capacitor CA is connected to a wiring CAL.

The wiring BIL functions as a bit line, and the wiring WOL functions as a word line. The wiring CAL functions as a wiring for applying a predetermined potential to the second terminal of the capacitor CA. In the time of data writing and data reading, a low-level potential is preferably applied to the wiring CAL. The wiring BGL functions as a wiring for applying a potential to the back gate of the transistor M1. By applying a given potential to the wiring BGL, the threshold voltage of the transistor M1 can be increased or decreased.

Here, the memory cell 1471 illustrated in FIG. 28A corresponds to the memory device illustrated in FIG. 23. That is, the transistor M1 and the capacitor CA correspond to the transistor 200 and the capacitor device 292, respectively.

The memory cell MC is not limited to the memory cell 1471, and the circuit structure can be changed. For example, as in a memory cell 1472 illustrated in FIG. 28B, the back gate of the transistor M1 may be connected not to the wiring BGL but to the wiring WOL in the memory cell MC. Alternatively, for example, the memory cell MC may be a memory cell including a single-gate transistor, that is, the transistor M1 not including a back gate, as in a memory cell 1473 illustrated in FIG. 28C.

In the case where the semiconductor device described in the above embodiment is used in the memory cell 1471 or the like, the transistor 200 can be used as the transistor M1, and the capacitor 100 can be used as the capacitor CA. When an OS transistor is used as the transistor M1, the leakage current of the transistor M1 can be extremely low. That is, with the use of the transistor M1, written data can be retained for a long period of time, and thus the frequency of the refresh operation for the memory cell can be decreased. In addition, refresh operation for the memory cell can be omitted. In addition, since the transistor M1 has an extremely low leakage current, multi-level data or analog data can be retained in the memory cell 1471, the memory cell 1472, and the memory cell 1473.

In addition, in the DOSRAM, when the sense amplifier is provided below the memory cell array 1470 to overlap with the memory cell array 1470 as described above, the bit line can be shortened. This reduces bit line capacity, which reduces the storage capacity of the memory cell.

[NOSRAM]

FIG. 28D to FIG. 28G illustrate circuit structure examples of a gain-cell memory cell including two transistors and one capacitor. A memory cell 1474 illustrated in FIG. 28D includes a transistor M2, a transistor M3, and a capacitor CB. Note that the transistor M2 includes a top gate (simply referred to as a gate in some cases) and a back gate. In this specification and the like, a memory device including a gain-cell memory cell using an OS transistor as the transistor M2 is referred to as a NOSRAM (Nonvolatile Oxide Semiconductor RAM) in some cases.

A first terminal of the transistor M2 is connected to a first terminal of the capacitor CB, a second terminal of the transistor M2 is connected to a wiring WBL, the gate of the transistor M2 is connected to the wiring WOL, and the back gate of the transistor M2 is connected to the wiring BGL. A second terminal of the capacitor CB is connected to the wiring CAL. A first terminal of the transistor M3 is connected to a wiring RBL, a second terminal of the transistor M3 is connected to a wiring SL, and a gate of the transistor M3 is connected to the first terminal of the capacitor CB.

The wiring WBL functions as a write bit line, the wiring RBL functions as a read bit line, and the wiring WOL functions as a word line. The wiring CAL functions as a wiring for applying a predetermined potential to the second terminal of the capacitor CB. During data writing, data retention, and data reading, a low-level potential is preferably applied to the wiring CAL. The wiring BGL functions as a wiring for applying a potential to the back gate of the transistor M2. By applying a given potential to the wiring BGL, the threshold voltage of the transistor M2 can be increased or decreased.

Figure 28D:
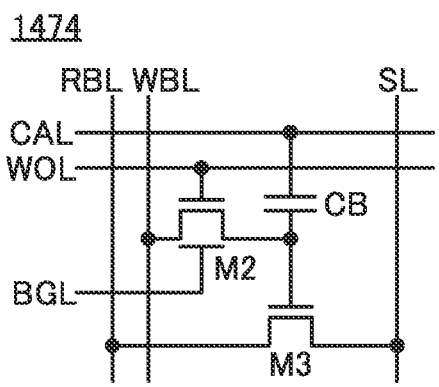
Figure 28E:
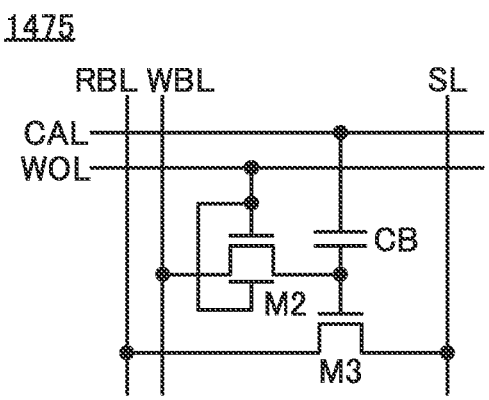
Figure 28F:
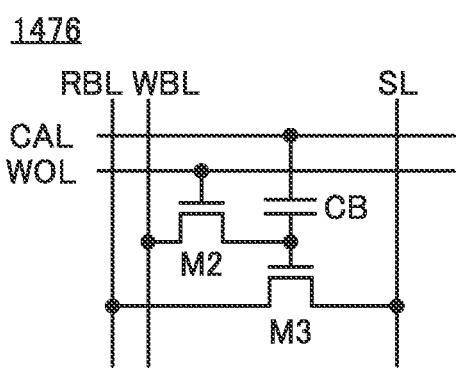
Figure 28G:
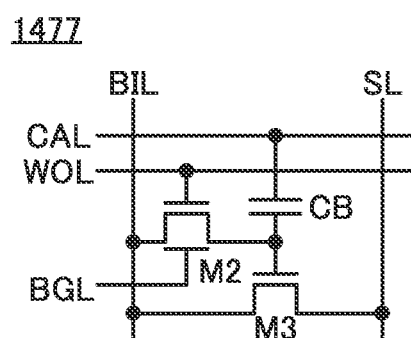

Here, the memory cell 1474 illustrated in FIG. 28D corresponds to the memory device illustrated in FIG. 21. That is, the transistor M2, the capacitor CB, the transistor M3, the wiring WBL, the wiring WOL, the wiring BGL, the wiring CAL, the wiring RBL, and the wiring SL correspond to the transistor 200, the capacitor 100, the transistor 300, the wiring 1003, the wiring 1004, the wiring 1006, the wiring 1005, the wiring 1002, and the wiring 1001, respectively.

In addition, the memory cell MC is not limited to the memory cell 1474, and the circuit structure can be changed as appropriate. For example, as in a memory cell 1475 illustrated in FIG. 28E, the back gate of the transistor M2 may be connected not to the wiring BGL but to the wiring WOL in the memory cell MC. Alternatively, for example, the memory cell MC may be a memory cell including a single-gate transistor, that is, the transistor M2 not including a back gate, as in a memory cell 1476 illustrated in FIG. 28F. Alternatively, for example, as in a memory cell 1477 illustrated in FIG. 28G, the wiring WBL and the wiring RBL may be combined into one wiring BIL in the memory cell MC.

In the case where the semiconductor device described in the above embodiment is used in the memory cell 1474 or the like, the transistor 200 can be used as the transistor M2, the transistor 300 can be used as the transistor M3, and the capacitor 100 can be used as the capacitor CB. When an OS transistor is used as the transistor M2, the leakage current of the transistor M2 can be extremely low. Consequently, written data can be retained for a long time with the transistor M2; thus, the frequency of refresh of the memory cell can be reduced. In addition, refresh operation for the memory cell can be omitted. In addition, since the transistor M2 has an extremely low leakage current, multi-level data or analog data can be retained in the memory cell 1474. The same applies to the memory cell 1475 to the memory cell 1477.

Note that the transistor M3 may be a transistor containing silicon in a channel formation region (hereinafter referred to as a Si transistor in some cases). The conductivity type of the Si transistor may be either an n-channel type or a p-channel type. A Si transistor has higher field-effect mobility than an OS transistor in some cases. Therefore, a Si transistor may be used as the transistor M3 functioning as a read transistor. Furthermore, the use of a Si transistor as the transistor M3 enables the transistor M2 to be stacked over the transistor M3, in which case the area occupied by the memory cell can be reduced and high integration of the memory device can be achieved.

Alternatively, the transistor M3 may be an OS transistor. When OS transistors are used as the transistor M2 and the transistor M3, the circuit of the memory cell array 1470 can be formed using only n-channel transistors.

Figure 28H:
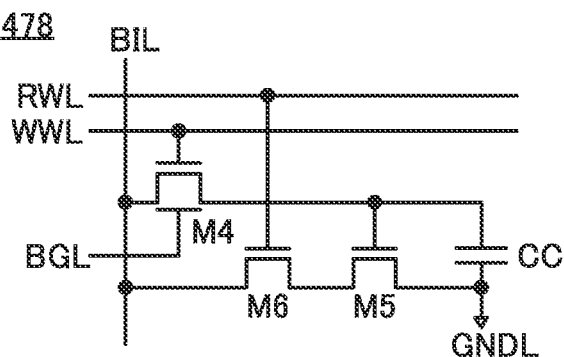

FIG. 28H illustrates an example of a gain-cell memory cell including three transistors and one capacitor. A memory cell 1478 illustrated in FIG. 28H includes a transistor M4 to a transistor M6 and a capacitor CC. The capacitor CC is provided as appropriate. The memory cell 1478 is electrically connected to the wiring BIL, a wiring RWL, a wiring WWL, the wiring BGL, and a wiring GNDL. The wiring GNDL is a wiring for supplying a low-level potential. Note that the memory cell 1478 may be electrically connected to the wiring RBL and the wiring WBL instead of the wiring BIL.

The transistor M4 is an OS transistor including a back gate, and the back gate is electrically connected to the wiring BGL. Note that the back gate and a gate of the transistor M4 may be electrically connected to each other. Alternatively, the transistor M4 does not necessarily include the back gate.

Note that each of the transistor M5 and the transistor M6 may be an n-channel Si transistor or a p-channel Si transistor. Alternatively, the transistor M4 to the transistor M6 may be OS transistors, in which case the circuit of the memory cell array 1470 can be formed using only n-channel transistors.

In the case where the semiconductor device described in the above embodiments is used in the memory cell 1478, the transistor 200 can be used as the transistor M4, the transistor 300 can be used as the transistor M5 and the transistor M6, and the capacitor 100 can be used as the capacitor CC. When an OS transistor is used as the transistor M4, the leakage current of the transistor M4 can be extremely low.

Note that the structures of the peripheral circuit 1411, the memory cell array 1470, and the like described in this embodiment are not limited to the above. The arrangement and functions of these circuits and the wirings, circuit components, and the like connected to the circuits can be changed, removed, or added as needed.

Figure 29:
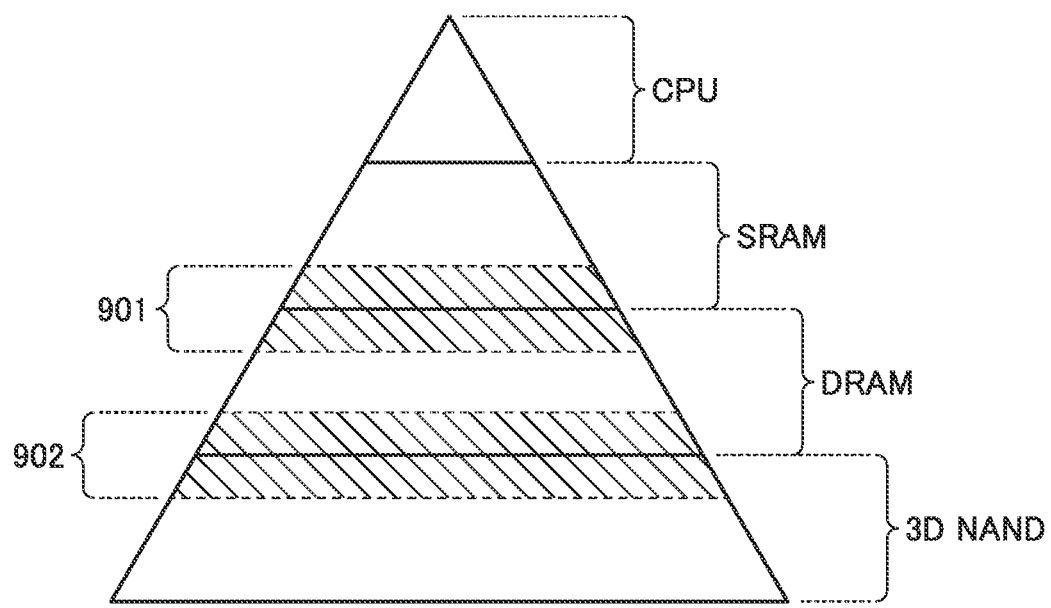
FIG. 29 is a diagram illustrating a hierarchy of various kinds of memory devices.

In general, a variety of memory devices (memory) are used in semiconductor devices such as a computer in accordance with the intended use. FIG. 29 is a diagram illustrating a hierarchy of a variety of memory devices. The memory devices at the upper levels of the diagram require high access speeds, and the memory devices at the lower levels require large memory capacity and high record density. In FIG. 29, sequentially from the top level, a memory combined as a register in an arithmetic processing device such as a CPU, an SRAM (Static Random Access Memory), a DRAM (Dynamic Random Access Memory), and a 3D NAND memory are shown.

A memory combined as a register in an arithmetic processing device such as a CPU is used for temporary storage of arithmetic operation results, for example, and thus is very frequently accessed by the arithmetic processing device. Accordingly, rapid operation is more important than the memory capacity of the memory. The register also has a function of retaining setting information of the arithmetic processing device, for example.

An SRAM is used for a cache, for example. The cache has a function of retaining a copy of part of data retained in a main memory. By copying data which is frequently used and holding the copy of the data in the cache, the access speed to the data can be increased.

A DRAM is used for the main memory, for example. The main memory has a function of retaining a program or data which are read from a storage. The record density of a DRAM is approximately 0.1 to 0.3 Gbit/mm$^2$.

A 3D NAND memory is used for a storage, for example. The storage has a function of retaining data that needs to be retained for a long time and programs used in an arithmetic processing device, for example. Therefore, the storage needs to have a high memory capacity and a high record density rather than operating speed. The record density of a memory device used for a storage is approximately 0.6 to 6.0 Gbit/mm$^2$.

The memory device of one embodiment of the present invention operates fast and can retain data for a long time.

The memory device of one embodiment of the present invention can be favorably used as a memory device in a boundary region 901 including both the level in which cache is placed and the level in which main memory is placed. Alternatively, the memory device of one embodiment of the present invention can be favorably used as a memory device in a boundary region 902 including both the level in which main memory is placed and the level in which storage is placed.

The structure described in this embodiment can be used in an appropriate combination with the structures described in the other embodiments and other examples.

Embodiment 4

In this embodiment, an example of a chip 1200 on which the semiconductor device of the present invention is mounted is described with reference to FIG. 30A and FIG. 30B. A plurality of circuits (systems) are mounted on the chip 1200. A technique for integrating a plurality of circuits (systems) into one chip is referred to as system on chip (SoC) in some cases.

Figure 30A:
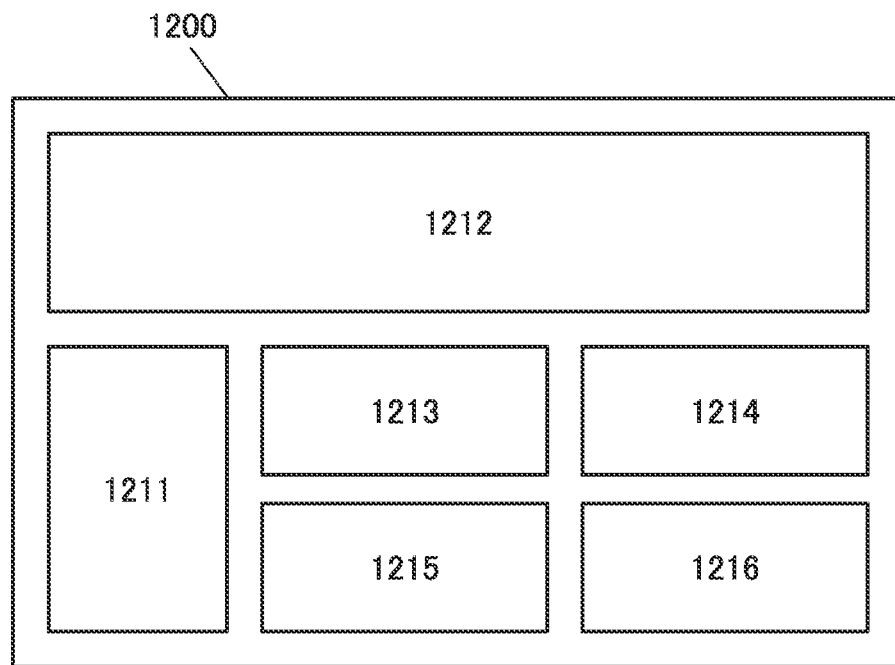
FIG. 30A is a block diagram of a semiconductor device of one embodiment of the present invention.

As shown in FIG. 30A, the chip 1200 includes a CPU 1211, a GPU 1212, one or a plurality of analog arithmetic units 1213, one or a plurality of memory controllers 1214, one or a plurality of interfaces 1215, one or a plurality of network circuits 1216, and the like.

Figure 30B:
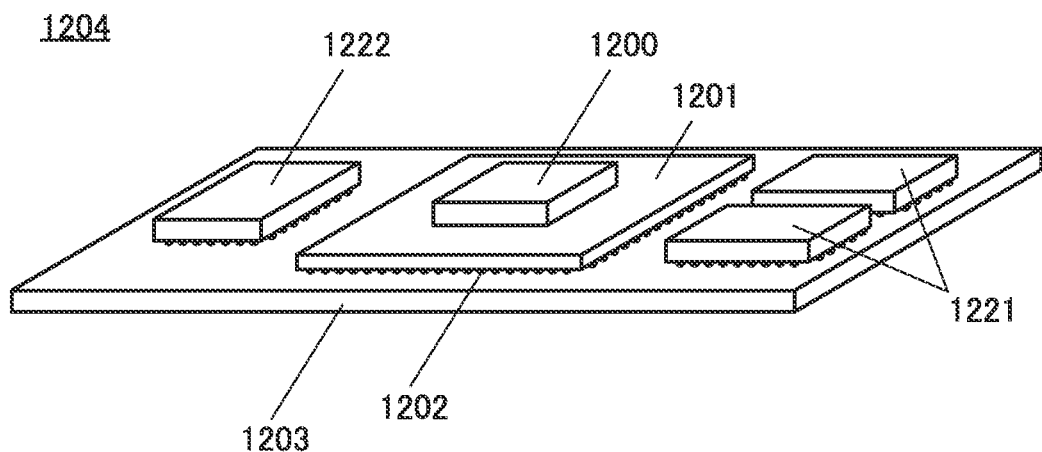
FIG. 30B is a schematic diagrams of a semiconductor device of one embodiment of the present invention.

A bump (not shown) is provided on the chip 1200, and as shown in FIG. 30B, the chip 1200 is connected to a first surface of a printed circuit board (PCB) 1201. In addition, a plurality of bumps 1202 are provided on a rear side of the first surface of the PCB 1201, and the PCB 1201 is connected to a motherboard 1203.

Memory devices such as DRAMs 1221 and a flash memory 1222 may be provided over the motherboard 1203. For example, the DOSRAM described in the above embodiment can be used as the DRAM 1221. In addition, for example, the NOSRAM described in the above embodiment can be used as the flash memory 1222.

The CPU 1211 preferably includes a plurality of CPU cores. In addition, the GPU 1212 preferably includes a plurality of GPU cores. Furthermore, the CPU 1211 and the GPU 1212 may each include a memory for temporarily storing data. Alternatively, a common memory for the CPU 1211 and the GPU 1212 may be provided in the chip 1200. The NOSRAM or the DOSRAM described above can be used as the memory. Moreover, the GPU 1212 is suitable for parallel computation of a number of data and thus can be used for image processing or product-sum operation. When an image processing circuit or a product-sum operation circuit using an oxide semiconductor of the present invention is provided in the GPU 1212, image processing and product-sum operation can be performed with low power consumption.

In addition, since the CPU 1211 and the GPU 1212 are provided on the same chip, a wiring between the CPU 1211 and the GPU 1212 can be shortened, and the data transfer from the CPU 1211 to the GPU 1212, the data transfer between the memories included in the CPU 1211 and the GPU 1212, and the transfer of arithmetic operation results from the GPU 1212 to the CPU 1211 after the arithmetic operation in the GPU 1212 can be performed at high speed.

The analog arithmetic unit 1213 includes one or both of an A/D (analog/digital) converter circuit and a D/A (digital/analog) converter circuit. Furthermore, the product-sum operation circuit may be provided in the analog arithmetic unit 1213.

The memory controller 1214 includes a circuit functioning as a controller of the DRAM 1221 and a circuit functioning as an interface of the flash memory 1222.

The interface 1215 includes an interface circuit for an external connection device such as a display device, a speaker, a microphone, a camera, or a controller. Examples of the controller include a mouse, a keyboard, and a game controller. As such an interface, a USB (Universal Serial Bus), an HDMI (registered trademark) (High-Definition Multimedia Interface), or the like can be used.

The network circuit 1216 includes a network circuit such as a LAN (Local Area Network). The network circuit 1216 may further include a circuit for network security.

The circuits (systems) can be formed in the chip 1200 through the same manufacturing process. Therefore, even when the number of circuits needed for the chip 1200 increases, there is no need to increase the number of manufacturing processes; thus, the chip 1200 can be fabricated at low cost.

The motherboard 1203 provided with the PCB 1201 on which the chip 1200 including the GPU 1212 is mounted, the DRAMs 1221, and the flash memory 1222 can be referred to as a GPU module 1204.

The GPU module 1204 includes the chip 1200 using SoC technology, and thus can have a small size. In addition, the GPU module 1204 is excellent in image processing, and thus is suitably used in a portable electronic device such as a smartphone, a tablet terminal, a laptop PC, or a portable (mobile) game machine. Furthermore, the product-sum operation circuit using the GPU 1212 can perform a method such as a deep neural network (DNN), a convolutional neural network (CNN), a recurrent neural network (RNN), an autoencoder, a deep Boltzmann machine (DBM), or a deep belief network (DBN); hence, the chip 1200 can be used as an AI chip or the GPU module 1204 can be used as an AI system module.

The structure described in this embodiment can be used in an appropriate combination with the structures described in the other embodiments.

Embodiment 5

This embodiment shows examples of an electronic component and an electronic device that include the memory device of the above embodiments and the like.

<Electronic Component>

Figure 31A:
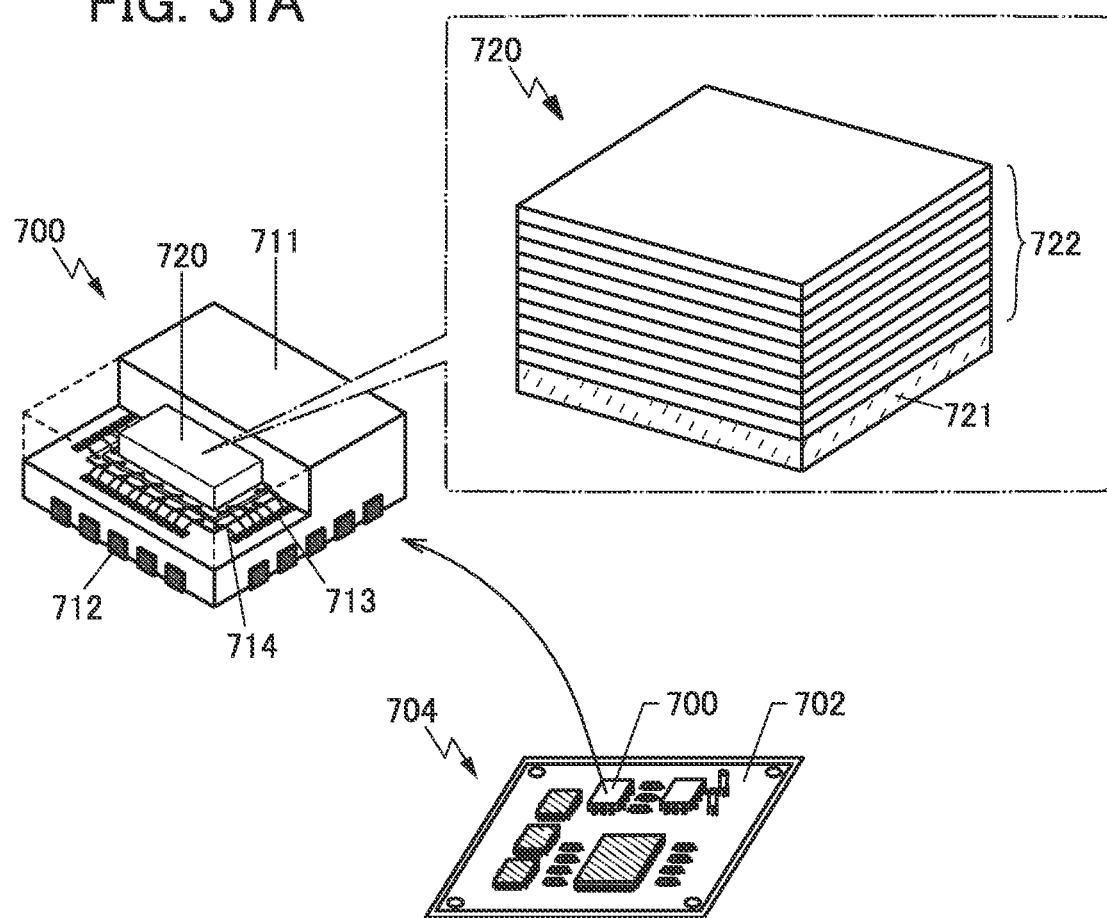
FIG. 31A and FIG. 31B are diagrams illustrating examples of electronic components.
Figure 31B:
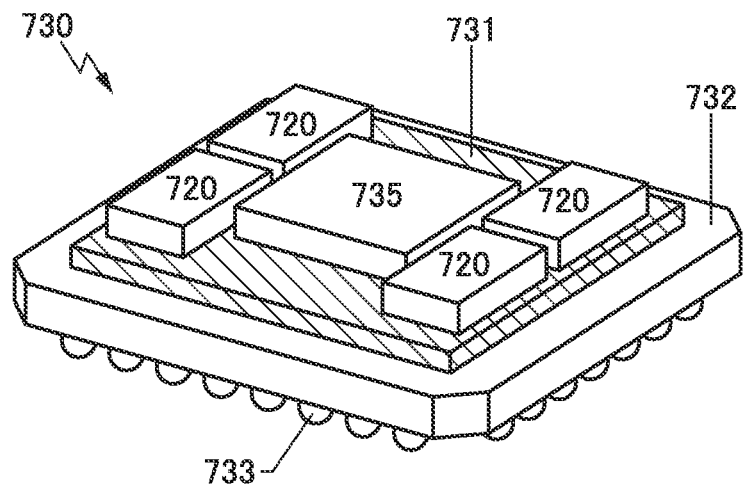

First, FIG. 31A and FIG. 31B show examples of an electronic component including a memory device 720.

FIG. 31A is a perspective view of an electronic component 700 and a substrate (circuit board 704) on which the electronic component 700 is mounted. The electronic component 700 in FIG. 31A includes a memory device 720 in a mold 711. FIG. 31A omits part of the electronic component to show the inside of the electronic component 700. The electronic component 700 includes a land 712 outside the mold 711. The land 712 is electrically connected to an electrode pad 713, and the electrode pad 713 is electrically connected to the memory device 720 via a wire 714. The electronic component 700 is mounted on a printed circuit board 702, for example. A plurality of such electronic components are combined and electrically connected to each other on the printed circuit board 702, which forms the circuit substrate 704.

The memory device 720 includes a driver circuit layer 721 and a memory circuit layer 722.

FIG. 31B is a perspective view of an electronic component 730. The electronic component 730 is an example of a system in package (SiP) or a multi-chip module (MCM). In the electronic component 730, an interposer 731 is provided over a package substrate 732 (printed circuit board) and a semiconductor device 735 and a plurality of memory devices 720 are provided over the interposer 731.

The electronic component 730 using the memory device 720 as a high bandwidth memory (HBM) is illustrated as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings have a single-layer structure or a layered structure. The interposer 731 has a function of electrically connecting an integrated circuit provided on the interposer 731 to an electrode provided on the package substrate 732. Accordingly, the interposer is sometimes referred to as a redistribution substrate or an intermediate substrate. A through electrode may be provided in the interposer 731 to be used for electrically connecting the integrated circuit and the package substrate 732. In the case of using a silicon interposer, a through-silicon via (TSV) can also be used as the through electrode.

A silicon interposer is preferably used as the interposer 731. The silicon interposer can be manufactured at lower cost than an integrated circuit because the silicon interposer is not necessarily provided with an active element. Moreover, since wirings of the silicon interposer can be formed through a semiconductor process, the formation of minute wirings, which is difficult for a resin interposer, is easily achieved.

An HBM needs to be connected to many wirings to achieve a wide memory bandwidth. Therefore, an interposer on which an HBM is mounted requires minute and densely formed wirings. For this reason, a silicon interposer is preferably used as the interposer on which an HBM is mounted.

In an SiP, an MCM, or the like using a silicon interposer, a decrease in reliability due to a difference in expansion coefficient between an integrated circuit and the interposer is less likely to occur. Furthermore, a surface of a silicon interposer has high planarity, and a poor connection between the silicon interposer and an integrated circuit provided thereon less likely occurs. It is particularly preferable to use a silicon interposer for a 2.5D package (2.5D mounting) in which a plurality of integrated circuits are arranged side by side on the interposer.

A heat sink (radiator plate) may be provided to overlap with the electronic component 730. In this case, the heights of integrated circuits provided on the interposer 731 are preferably equal to each other. In the electronic component 730 of this embodiment, the heights of the memory device 720 and the semiconductor device 735 are preferably equal to each other, for example.

An electrode 733 may be provided on the bottom portion of the package substrate 732 to mount the electronic component 730 on another substrate. FIG. 31B shows an example in which the electrode 733 is formed of a solder ball. Solder balls are provided in a matrix on the bottom portion of the package substrate 732, whereby a ball grid array (BGA) can be achieved. Alternatively, the electrode 733 may be formed of a conductive pin. When conductive pins are provided in a matrix on the bottom portion of the package substrate 732, a pin grid array (PGA) can be achieved.

The electronic component 730 can be mounted on another substrate in various manners, not limited to the BGA and the PGA. For example, a staggered pin grid array (SPGA), a land grid array (LGA), a quad flat package (QFP), a quad flat J-leaded package (QFJ), or a quad flat non-leaded package (QFN) can be employed.

This embodiment can be implemented in combination with any of the structures described in the other embodiments and the like, as appropriate.

Embodiment 6

In this embodiment, application examples of the memory device using the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 32A to FIG. 32E schematically show some structure examples of removable memory devices. The semiconductor device described in the above embodiment is processed into a packaged memory chip and used in a variety of storage devices and removable memories, for example.

Figure 32A:
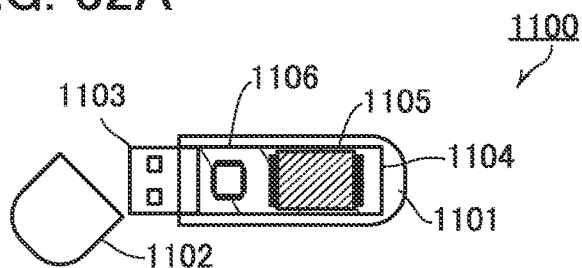
FIG. 32A to FIG. 32E are schematic views of memory devices of one embodiment of the present invention.

FIG. 32A is a schematic view of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like.

Figure 32B:
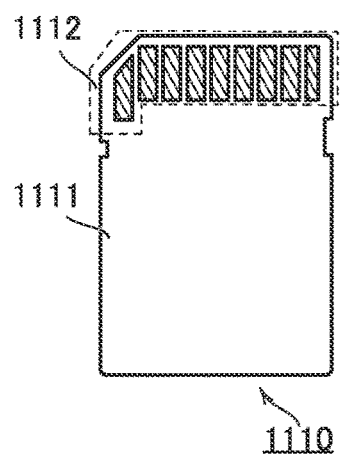
Figure 32C:
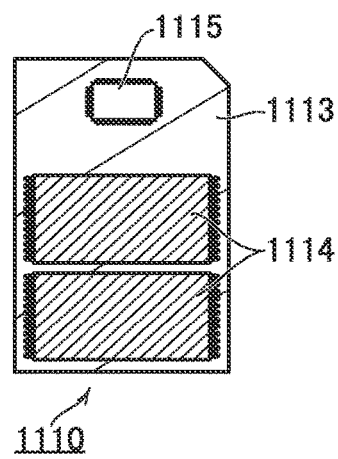

FIG. 32B is a schematic external view of an SD card, and FIG. 32C is a schematic view of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like.

Figures 32D, 32E:
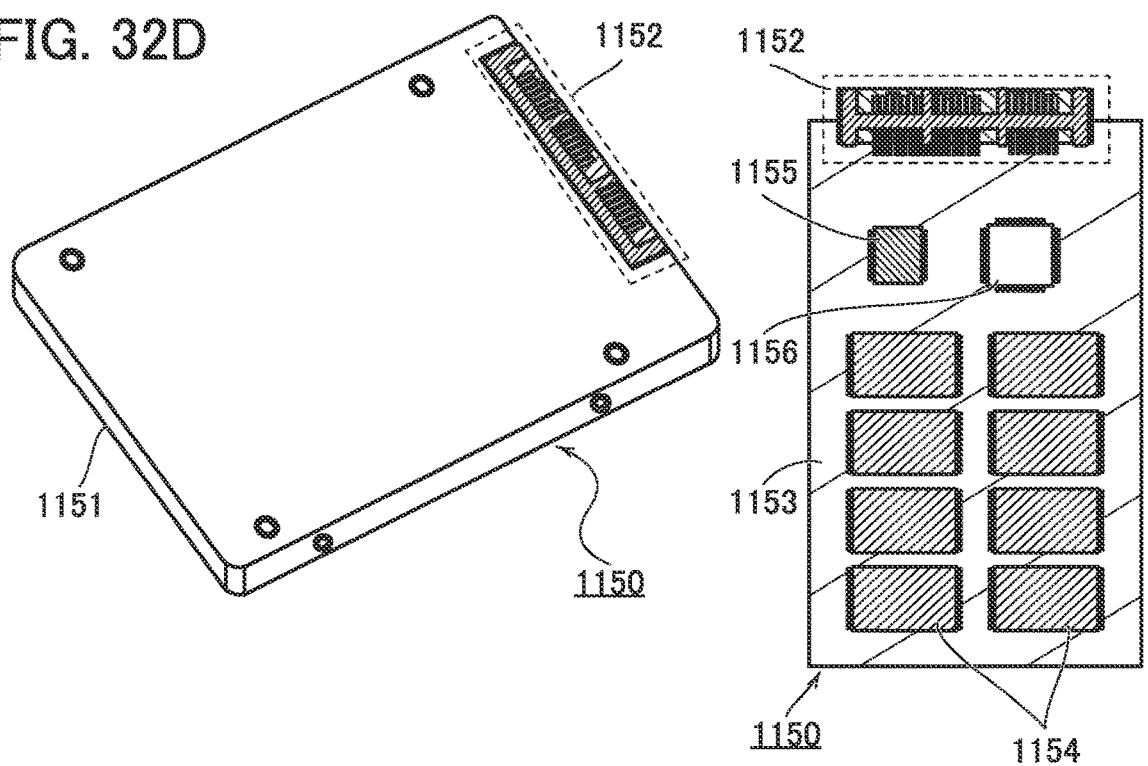

FIG. 32D is a schematic external view of an SSD, and FIG. 32E is a schematic view of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like.

This embodiment can be implemented in an appropriate combination with the structures described in the other embodiments.

Embodiment 7

The semiconductor device of one embodiment of the present invention can be used as a processor such as a CPU and a GPU or a chip. FIG. 33A to FIG. 33H show specific examples of electronic devices including a chip or a processor such as a CPU or a GPU of one embodiment of the present invention.

<Electronic Device and System>

The GPU or the chip of one embodiment of the present invention can be mounted on a variety of electronic devices. Examples of electronic devices include a digital camera, a digital video camera, a digital photo frame, an e-book reader, a mobile phone, a portable game machine, a portable information terminal, and an audio reproducing device in addition to electronic devices provided with a relatively large screen, such as a television device, a monitor for a desktop or notebook information terminal or the like, digital signage, and a large game machine like a pachinko machine. In addition, when the GPU or the chip of one embodiment of the present invention is provided in the electronic device, the electronic device can include artificial intelligence.

The electronic device of one embodiment of the present invention may include an antenna. When a signal is received by the antenna, the electronic device can display a video, data, or the like on the display portion. When the electronic device includes the antenna and a secondary battery, the antenna may be used for contactless power transmission.

The electronic device of one embodiment of the present invention may include a sensor (a sensor having a function of measuring force, displacement, position, speed, acceleration, angular velocity, rotational frequency, distance, light, liquid, magnetism, temperature, a chemical substance, sound, time, hardness, an electric field, current, voltage, power, radioactive rays, flow rate, humidity, a gradient, oscillation, odor, or infrared rays).

The electronic device of one embodiment of the present invention can have a variety of functions. For example, the electronic device in this embodiment can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium. FIG. 33A to FIG. 33H show examples of electronic devices.

[Information Terminal]

Figure 33A:
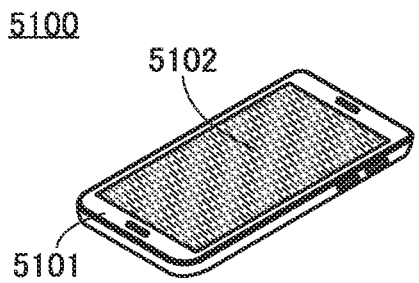
FIG. 33A to FIG. 33H are diagrams illustrating electronic devices of one embodiment of the present invention.

FIG. 33A shows a mobile phone (smartphone), which is a type of information terminal. An information terminal 5100 includes a housing 5101 and a display portion 5102. As input interfaces, a touch panel is provided in the display portion 5102 and a button is provided in the housing 5101.

When the chip of one embodiment of the present invention is applied to the information terminal 5100, the information terminal 5100 can execute an application utilizing artificial intelligence. Examples of the application utilizing artificial intelligence include an application for recognizing a conversation and displaying the content of the conversation on the display portion 5102; an application for recognizing letters, figures, and the like input to the touch panel of the display portion 5102 by a user and displaying them on the display portion 5102; and an application for performing biometric authentication using fingerprints, voice prints, or the like.

Figure 33B:
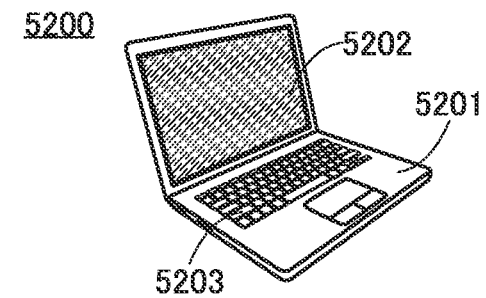

FIG. 33B shows a notebook information terminal 5200. The notebook information terminal 5200 includes a main body 5201 of the information terminal, a display portion 5202, and a keyboard 5203.

Like the information terminal 5100 described above, when the chip of one embodiment of the present invention is applied to the notebook information terminal 5200, the notebook information terminal 5200 can execute an application utilizing artificial intelligence. Examples of the application utilizing artificial intelligence include design-support software, text correction software, and software for automatic menu generation. Furthermore, with use of the notebook information terminal 5200, novel artificial intelligence can be developed.

Note that although FIG. 33A and FIG. 33B show a smartphone and a notebook information terminal, respectively, as examples of the electronic device in the above description, an information terminal other than a smartphone and a notebook information terminal can be used. Examples of information terminals other than a smartphone and a notebook information terminal include a PDA (Personal Digital Assistant), a desktop information terminal, and a workstation.

[Game Machines]

Figure 33C:
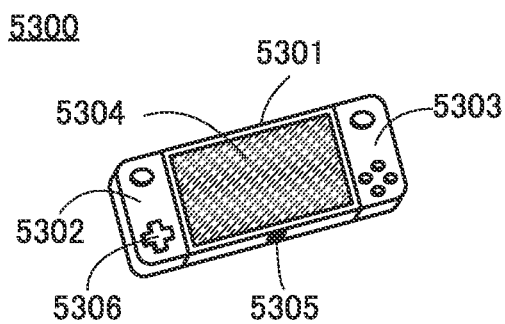

FIG. 33C shows a portable game machine 5300 as an example of a game machine. The portable game machine 5300 includes a housing 5301, a housing 5302, a housing 5303, a display portion 5304, a connection portion 5305, an operation key 5306, and the like. The housing 5302 and the housing 5303 can be detached from the housing 5301. When the connection portion 5305 provided in the housing 5301 is attached to another housing (not shown), an image to be output to the display portion 5304 can be output to another video device (not shown). In that case, the housing 5302 and the housing 5303 can each function as an operating unit. Thus, a plurality of players can perform a game at the same time. The chip described in the above embodiment can be incorporated into the chip provided on a substrate in the housing 5301, the housing 5302 and the housing 5303.

Figure 33D:
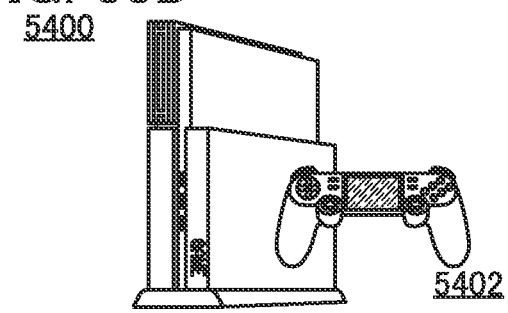

FIG. 33D shows a stationary game machine 5400 as an example of a game machine. A controller 5402 is wired or connected wirelessly to the stationary game machine 5400.

Using the GPU or the chip of one embodiment of the present invention in a game machine such as the portable game machine 5300 and the stationary game machine 5400 achieves a low-power-consumption game machine. Moreover, heat generation from a circuit can be reduced owing to low power consumption; thus, the influence of heat generation on the circuit, a peripheral circuit, and a module can be reduced.

Furthermore, when the GPU or the chip of one embodiment of the present invention is applied to the portable game machine 5300, the portable game machine 5300 including artificial intelligence can be achieved.

In general, the progress of a game, the actions and words of game characters, and expressions of an event and the like occurring in the game are determined by the program in the game; however, the use of artificial intelligence in the portable game machine 5300 enables expressions not limited by the game program. For example, it becomes possible to change expressions such as questions posed by the player, the progress of the game, time, and actions and words of game characters.

In addition, when a game requiring a plurality of players is played on the portable game machine 5300, the artificial intelligence can create a virtual game player; thus, the game can be played alone with the game player created by the artificial intelligence as an opponent.

Although the portable game machine and the stationary game machine are shown as examples of game machines in FIG. 33C and FIG. 33D, the game machine using the GPU or the chip of one embodiment of the present invention is not limited thereto. Examples of the game machine to which the GPU or the chip of one embodiment of the present invention is applied include an arcade game machine installed in entertainment facilities (a game center, an amusement park, and the like), and a throwing machine for batting practice installed in sports facilities.

[Large Computer]

The GPU or the chip of one embodiment of the present invention can be used in a large computer.

Figure 33E:
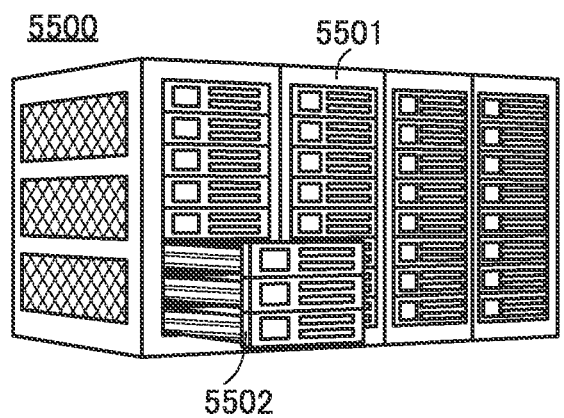
Figure 33F:
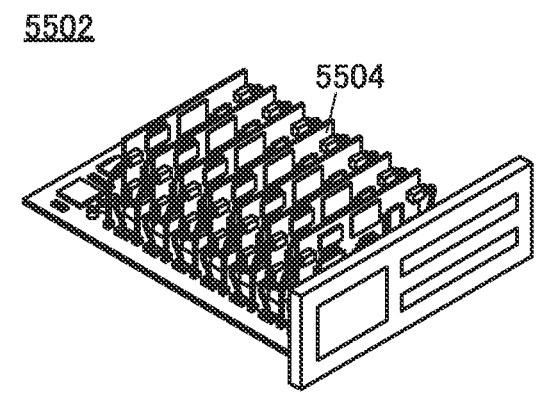

FIG. 33E shows a supercomputer 5500 as an example of a large computer. FIG. 33F shows a rack-mount computer 5502 included in the supercomputer 5500.

The supercomputer 5500 includes a rack 5501 and a plurality of rack-mount computers 5502. The plurality of computers 5502 are stored in the rack 5501. The computer 5502 includes a plurality of substrates 5504 on which the GPU or the chip shown in the above embodiment can be mounted.

The supercomputer 5500 is a large computer mainly used for scientific computation. In scientific computation, an enormous amount of arithmetic operation needs to be processed at a high speed; hence, power consumption is large and chips generate a large amount of heat. Using the GPU or the chip of one embodiment of the present invention in the supercomputer 5500 achieves a low-power-consumption supercomputer. Moreover, heat generation from a circuit can be reduced owing to low power consumption; thus, the influence of heat generation on the circuit, a peripheral circuit, and a module can be reduced.

Although a supercomputer is shown as an example of a large computer in FIG. 33E and FIG. 33F, a large computer using the GPU or the chip of one embodiment of the present invention is not limited thereto. Other examples of large computers in which the GPU or the chip of one embodiment of the present invention is usable include a computer that provides service (a server) and a large general-purpose computer (a mainframe).

[Moving Vehicle]

The GPU or the chip of one embodiment of the present invention can be applied to an automobile, which is a moving vehicle, and the periphery of a driver's seat in the automobile.

Figure 33G:
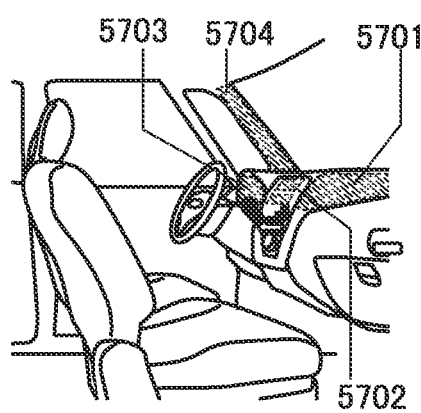

FIG. 33G shows an area around a windshield inside an automobile, which is an example of a moving vehicle. FIG. 33G shows a display panel 5701, a display panel 5702, and a display panel 5703 that are attached to a dashboard and a display panel 5704 that is attached to a pillar.

The display panel 5701 to the display panel 5703 can provide a variety of kinds of information by displaying a speedometer, a tachometer, mileage, a fuel gauge, a gear state, air-condition setting, and the like. In addition, the content, layout, or the like of the display on the display panels can be changed as appropriate to suit the user's preference, so that the design quality can be increased. The display panel 5701 to the display panel 5703 can also be used as lighting devices.

The display panel 5704 can compensate for view obstructed by the pillar (a blind spot) by showing an image taken by an imaging device (not shown) provided for the automobile. That is, displaying an image taken by the imaging device provided outside the automobile leads to compensation for the blind spot and an increase in safety. In addition, displaying an image to compensate for a portion that cannot be seen makes it possible for the driver to confirm the safety more naturally and comfortably. The display panel 5704 can also be used as a lighting device.

Since the GPU or the chip of one embodiment of the present invention can be applied to a component of artificial intelligence, the chip can be used for an automatic driving system of the automobile, for example. The chip can also be used for a navigation system, risk prediction, or the like. A structure may be employed in which the display panel 5701 to the display panel 5704 display navigation information, risk prediction information, or the like.

Note that although an automobile is described above as an example of a moving vehicle, the moving vehicle is not limited to an automobile. Examples of the moving vehicle include a train, a monorail train, a ship, and a flying vehicle (a helicopter, an unmanned aircraft (a drone), an airplane, and a rocket), and these moving vehicles can each include a system utilizing artificial intelligence when the chip of one embodiment of the present invention is applied to each of these moving vehicles.

[Household Appliance]

Figure 33H:
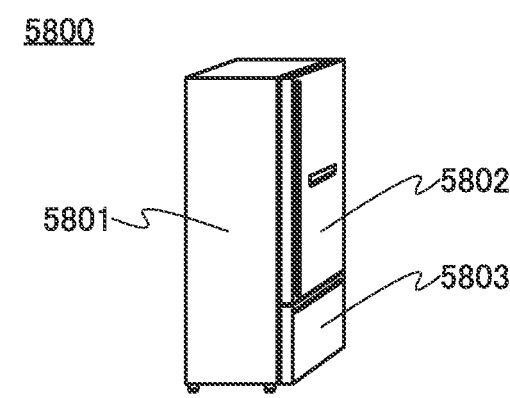

FIG. 33H shows an electric refrigerator-freezer 5800 as an example of a household appliance. The electric refrigerator-freezer 5800 includes a housing 5801, a refrigerator door 5802, a freezer door 5803, and the like.

When the chip of one embodiment of the present invention is applied to the electric refrigerator-freezer 5800, the electric refrigerator-freezer 5800 including artificial intelligence can be achieved. Utilizing the artificial intelligence enables the electric refrigerator-freezer 5800 to have a function of automatically making a menu based on foods stored in the electric refrigerator-freezer 5800, expiration dates of the foods, or the like, a function of automatically adjusting temperature to be appropriate for the foods stored in the electric refrigerator-freezer 5800, and the like.

Although the electric refrigerator-freezer is described in this example as a household appliance, examples of other household appliances include a vacuum cleaner, a microwave oven, an electric oven, a rice cooker, a water heater, an IH cooker, a water server, a heating-cooling combination appliance such as an air conditioner, a washing machine, a drying machine, and an audio visual appliance.

The electronic devices, the functions of the electronic devices, the application examples of artificial intelligence, their effects, and the like described in this embodiment can be combined as appropriate with the description of another electronic device.

This embodiment can be implemented in an appropriate combination with the structures described in the other embodiments.

REFERENCE NUMERALS

200: transistor, 205: conductor, 210: insulator, 211: insulator, 212: insulator, 214: insulator, 216: insulator, 217: insulator, 218: conductor, 222: insulator, 224: insulator, 226: insulator, 226A: insulating film, 230: oxide, 230A:

oxide film, 230B: oxide film, 231: insulator, 231A: insulating film, 240: conductor, 241: insulator, 242: conductor, 242A: conductive film, 242B: conductive layer, 243: oxide, 243A: oxide film, 243B: oxide layer, 245: insulator, 245A: insulating film, 245B: insulating layer, 246: conductor, 250: insulator, 250A: insulating film, 260: conductor, 260A: conductive film, 260B: conductive film, 265: sealing portion, 271: oxide, 271A: oxide film, 272: insulator, 273: insulator, 274: insulator, 276: region, 277: region, 280: insulator, 282: insulator, 283: insulator, 284: insulator, 286: insulator, 287: insulator, 290: memory device, 290A: conductive film, 290B: conductive layer, 292: capacitor device, 294: conductor

The invention claimed is:

1. A semiconductor device comprising:
a first insulator;
a first oxide over the first insulator;
a first oxygen blocking film provided between the first insulator and the first oxide;
a second oxide in contact with the first insulator and in contact with a side surface of the first oxide; and
a second oxygen blocking film over the first insulator, the second oxide, and the first oxide,
wherein the second oxygen blocking film comprises a region in contact with a top surface of the first oxide, and
wherein the first oxygen blocking film and the second oxygen blocking film comprise a material which is less likely to pass oxygen than the second oxide.

2. The semiconductor device according to claim 1,
wherein the first oxide comprises indium, an element M, and zinc, and
wherein M is aluminum, gallium, yttrium, or tin.

3. The semiconductor device according to claim 1, wherein the first oxide comprises a region functioning as a channel formation region.

4. The semiconductor device according to claim 1, wherein the first oxide and the second oxide comprise the same material.

5. The semiconductor device according to claim 1, wherein the second oxide has crystallinity and a c-axis of a crystal of the second oxide is in a direction substantially perpendicular to the side surface of the first oxide.

6. The semiconductor device according to claim 1, wherein the second oxide is in contact with a side surface of the first oxygen blocking film and the second oxygen blocking film.

7. The semiconductor device according to claim 1, wherein at least one of the first oxygen blocking film and the second oxygen blocking film comprises aluminum oxide.

8. A semiconductor device comprising:
a first insulator;
a first oxide over the first insulator;
a first oxygen blocking film provided between the first insulator and the first oxide;
a second oxide in contact with the first insulator and in contact with a side surface of the first oxide;
a first conductor and a second conductor provided over the first oxide and apart from each other;
a second oxygen blocking film over the first insulator, the second oxide, and the first oxide; and
a gate electrode over the second oxygen blocking film,
wherein the gate electrode comprises a region overlapping with the first oxide,
wherein the second oxygen blocking film comprises a region in contact with a top surface of the first oxide, a side surface of the first conductor, and a side surface of the second conductor, and
wherein the first oxygen blocking film and the second oxygen blocking film comprise a material which is less likely to pass oxygen than the second oxide.

9. The semiconductor device according to claim 8, further comprising a second insulator,
wherein the second insulator is provided between the second oxygen blocking film and the gate electrode.

10. The semiconductor device according to claim 8,
wherein the first oxide comprises indium, an element M, and zinc, and
wherein M is aluminum, gallium, yttrium, or tin.

11. The semiconductor device according to claim 8, wherein the first oxide comprises a region functioning as a channel formation region.

12. The semiconductor device according to claim 8, wherein the first oxide and the second oxide comprise the same material.

13. The semiconductor device according to claim 8, wherein the second oxide has crystallinity and a c-axis of a crystal of the second oxide is in a direction substantially perpendicular to the side surface of the first oxide.

14. The semiconductor device according to claim 8, wherein the second oxide is in contact with a side surface of the first oxygen blocking film and the second oxygen blocking film.

15. The semiconductor device according to claim 8, wherein at least one of the first oxygen blocking film and the second oxygen blocking film comprises aluminum oxide.

16. The semiconductor device according to claim 8, wherein a top surface of the second oxygen blocking film and a top surface of the gate electrode are aligned with each other.

* * * * *